United States Patent
Ye et al.

(10) Patent No.: US 11,038,540 B2
(45) Date of Patent: Jun. 15, 2021

(54) METHOD AND APPARATUS FOR LOW-DENSITY PARITY-CHECK (LDPC) CODING

(71) Applicant: IDAC HOLDINGS, INC., Wilmington, DE (US)

(72) Inventors: Chunxuan Ye, San Diego, CA (US); Hanqing Lou, Syosset, NY (US); Fengjun Xi, San Diego, CA (US); Kyle Jung-Lin Pan, Saint James, NY (US)

(73) Assignee: IDAC HOLDINGS, INC., Wilmington, DE (US)

( * ) Notice: Subject to any disclaimer, the term of this patent is extended or adjusted under 35 U.S.C. 154(b) by 0 days.

(21) Appl. No.: 16/482,880

(22) PCT Filed: Jan. 31, 2018

(86) PCT No.: PCT/US2018/016170
§ 371 (c)(1),
(2) Date: Aug. 1, 2019

(87) PCT Pub. No.: WO2018/144560
PCT Pub. Date: Aug. 9, 2018

(65) Prior Publication Data
US 2020/0235759 A1 Jul. 23, 2020

Related U.S. Application Data

(60) Provisional application No. 62/454,623, filed on Feb. 3, 2017, provisional application No. 62/475,126, filed
(Continued)

(51) Int. Cl.
*H03M 13/09* (2006.01)
*H03M 13/00* (2006.01)
*H03M 13/11* (2006.01)

(52) U.S. Cl.
CPC ....... *H03M 13/6393* (2013.01); *H03M 13/09* (2013.01); *H03M 13/1105* (2013.01); *H03M 13/6516* (2013.01); *H03M 13/6522* (2013.01)

(58) Field of Classification Search
CPC .................................................. H03M 13/6393
(Continued)

(56) References Cited

U.S. PATENT DOCUMENTS 8,225,168 B2 7/2012 Yu et al.
8,848,763 B2 9/2014 Han et al.
(Continued)

FOREIGN PATENT DOCUMENTS

KR 20140123397 A 10/2014

OTHER PUBLICATIONS

Huawei et al., "Observations on LDPC decoders," 3GPP TSG RAN QG1 Meeting #87, R1-1611260, Reno, USA (Nov. 14-18, 2016).
(Continued)

*Primary Examiner* — Fritz Alphonse
(74) *Attorney, Agent, or Firm* — Volpe Koenig

(57) ABSTRACT

A method includes receiving a time domain resource allocation (TDRA) list configuration including entries, each including a resource allocation that includes a slot offset value. L1 signaling is received indicating a minimum slot offset value. Downlink control information (DCI) is decoded on a physical downlink control channel in a slot. An index is obtained from the decoded DCI, identifying an entry in the TDRA list. A particular slot offset value identified by the index is retrieved from the TDRA list and compared with the minimum slot offset value. If the particular slot offset value is less than the minimum slot offset value, the entry is invalid. If the particular slot offset value is greater than or equal to the minimum slot offset value, a physical downlink shared channel is received.

18 Claims, 30 Drawing Sheets

Related U.S. Application Data on Mar. 22, 2017, provisional application No. 62/500,897, filed on May 3, 2017, provisional application No. 62/519,671, filed on Jun. 14, 2017, provisional application No. 62/543,033, filed on Aug. 9, 2017, provisional application No. 62/556,079, filed on Sep. 8, 2017, provisional application No. 62/565,716, filed on Sep. 29, 2017.

(58) Field of Classification Search
USPC .......................................................... 714/758
See application file for complete search history.

(56) References Cited

U.S. PATENT DOCUMENTS

| | | | | |
|---|---|---|---|---|
| 9,379,739 | B2* | 6/2016 | Chen ..................... | H03M 13/17 |
| 9,496,986 | B2 | 11/2016 | Roh et al. | |
| 2008/0226074 | A1* | 9/2008 | Sammour ......... | H04W 12/0013 |
| | | | | 380/270 |
| 2008/0288850 | A1 | 11/2008 | Rhee et al. | |
| 2012/0224523 | A1 | 9/2012 | Reznik et al. | |
| 2017/0149528 | A1 | 5/2017 | Kim et al. | |
| 2019/0150176 | A1* | 5/2019 | Pelletier ................ | H04L 1/1812 |
| | | | | 370/329 |
| 2019/0207710 | A1 | 7/2019 | Ye et al. | |

OTHER PUBLICATIONS

IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 4: Enhancements for Very High Throughput for Operation in Bands below 6GHz, IEEE Std 802.11ac-2013 (Dec. 11, 2013).

IEEE Standard for Information Technology—Telecommunications and information exchange between systems—Local and metropolitan area networks—Specific requirements; Part 11: Wireless LAN Medium Access Control (MAC) and Physical Layer (PHY) specifications; Amendment 5: Television White Spaces (TVWS) Operation, IEEE 802.11af-2013 (Dec. 11, 2013).

IEEE Standard for Information technology—Telecommunications and information exchange between systems Local and metropolitan area networks—Specific requirements; Part 11: Wireless LAN Medium Access Control (MAC) and Physical Layer (PHY) Specifications; Amendment 2: Sub 1 GHz License Exempt Operation, IEEE P802.11ah-2016 (Dec. 7, 2016).

IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 5: Enhancements for Higher Throughput, IEEE Std 802.11n-2009 (Sep. 2009).

Interdigital Communications, "Design considerations on channel coding with very large blocklength," 3GPP TSG RAN WG1 Meeting #84bis, R1-162927, Busan, Korea (Apr. 11-15, 2016).

Interdigital Communications, "On LDPC Code Design," 3GPP TSG RAN WG1 Meeting #88, R1-1702353, Athens, Greece (Feb. 13-17, 2017).

Interdigital Communications, "On LDPC Coding Chain Design," 3GPP TSG RAN WG1 Meeting #88bis, R1-1705526, Spokane, USA (Apr. 3-7, 2017).

Interdigital Inc., "Code Block Segmentation for Data Channel," 3GPP TSG RAN WG1 Meeting #89, R1-1708357, Hangzhou, P.R. China (May 15-19, 2017).

Interdigital Inc., "Code Block Segmentation for Data Channel," 3GPP TSG RAN WG1 NR Ad-Hoc #2, R1-1710958, Qingdao, P.R. China (Jun. 27-30, 2017).

Interdigital Inc., "Code Block Segmentation for Data Channel," 3GPP TSG RAN WG1 Meeting #90, R1-1714167, Prague, Czech Republic (Aug. 21-25, 2017).

Interdigital Inc., "Data Channel Processing and CRC Attachment," 3GPP TSG RAN WG1 Meeting #89, R1-1708356, Hangzhou, P.R. China (May 15-19, 2017).

Interdigital Inc., "Data Channel Processing and CRC Attachment," 3GPP TSG RAN WG1 NR Ad-Hoc #2, R1-1710957, Qingdao, P.R. China (Jun. 27-30, 2017).

Interdigital Inc., "LDPC Rate Matching Design," 3GPP TSG RAN WG1 Meeting #90, R1-1714168, Prague, Czech Republic (Aug. 21-25, 2017).

Interdigital Inc., "On LDPC Base Graph Selection," 3GPP TSG RAN WG1 Meeting #90, R1-1714169, Prague, Czech Republic (Aug. 21-25, 2017).

Mediatek Inc., "TB size determination and channel coding considerations," 3GPP TSG RAN WG1 #90bis, R1-1718353, Prague, Czechia (Oct. 9-13, 2017).

Mediatek, "Discussion on the bit-reordering of an LDPC code block," 3GPP TSG-RAN WG1 #87, R1-1612133, Reno, USA (Nov. 14-18, 2016).

Nokia et al., "Code segmentation for eMBB data," 3GPP TSG-RAN WG1 NR Ad-Hoc Meeting, R1-1701029, Spokane, USA (Jan. 16-20, 2017).

Nokia et al., "Considerations for CRC attachment," 3GPP TSG RAN WG1 #88bis Meeting, R1-1705855, Spokane, WA, U.S.A. (Apr. 3-7, 2017).

Nokia et al., "Padding for LDPC codes," 3GPP TSG-RAN WG1#NR Ad-Hoc meeting, R1-1701031, Spokane, USA (Jan. 16-20, 2017).

Qualcomm Incorporated, "LDPC rate compatible design," 3GPP TSG-RAN WG1 NR Ad Hoc, R1-1700830, Spokane, USA (Jan. 16-20, 2017).

Samsung, "Discussion on partial retransmission for eMBB," 3GPP TSG RAN WG1 Meeting NR#1, R1-1700959, Spokane, USA (Jan. 16-20, 2017).

Samsung, "Discussion on Rate Matching for LDPC Codes," 3GPP TSG-RAN WG1 NR Ad-Hoc Meeting, R1-1700977, Spokane, USA (Jan. 16-20, 2017).

Samsung, "Segmentation and concatenation for data channel," 3GPP TSG RAN WG1 Meeting #89, R1-1708045, Hangzhou, P.R. China (May 15-19, 2017).

Session Chairman (Nokia), "Chairman's Notes of Agenda Item 5.1.5 Channel coding," 3GPP TSG RAN WG1 AH_NR Meeting, R1-1701384, Spokane, USA (Jan. 16-20, 2017).

Third Generation Partnership Project, "Technical Specification Group Radio Access Network; Study on Scenarios and Requirements for Next Generation Access Technologies; (Release 14)," 3GPP TR 38.913 V0.3.0 (Mar. 2016).

Third Generation Partnership Project, "Technical Specification Group Radio Access Network; Study on Scenarios and Requirements for Next Generation Access Technologies; (Release 14)," 3GPP TR 38.913 V14.1.0 (Dec. 2016).

Third Generation Partnership Project, "Technical Specification Group Radio Access Network; Study on Scenarios and Requirements for Next Generation Access Technologies; (Release 14)," 3GPP TR 38.913 V14.3.0 (Jun. 2017).

Third Generation Partnership Project, "Technical Specification Group Radio Access Network; Evolved Universal Terrestrial Radio Access (E-UTRA); Physical layer procedures (Release 14)," 3GPP TS 36.213 V14.1.0 (Dec. 2016).

Third Generation Partnership Project, "Technical Specification Group Radio Access Network; Evolved Universal Terrestrial Radio Access (E-UTRA); Physical layer procedures (Release 14)," 3GPP TS 36.213 V14.5.0 (Dec. 2017).

Third Generation Partnership Project, "Technical Specification Group Radio Access Network; Evolved Universal Terrestrial Radio Access (E-UTRA); Physical layer procedures (Release 15)," 3GPP TS 36.213 V15.0.0 (Dec. 2017).

Third Generation Partnership Project, "Technical Specification Group Radio Access Network; Evolved Universal Terrestrial Radio Access (E-UTRA); Physical layer procedures (Release 10),"3GPP TS 36.213 V10.13.0 (Jun. 2015).

(56) References Cited

OTHER PUBLICATIONS

Third Generation Partnership Project, "Technical Specification Group Radio Access Network; Evolved Universal Terrestrial Radio Access (E-UTRA); Multiplexing and channel coding (Release 13)," 3GPP TS 36.212 V13.1.0 (Mar. 2016).
Third Generation Partnership Project, "Technical Specification Group Radio Access Network; Evolved Universal Terrestrial Radio Access (E-UTRA); Multiplexing and channel coding (Release 14)," 3GPP TS 36.212 V14.1.1 (Jan. 2017).
Third Generation Partnership Project, "Technical Specification Group Radio Access Network; Evolved Universal Terrestrial Radio Access (E-UTRA); Multiplexing and channel coding (Release 15)," 3GPP TS 36.212 V15.0.1 (Jan. 2018).
Third Generation Partnership Project, "Technical Specification Group Radio Access Network; Evolved Universal Terrestrial Radio Access (E-UTRA); Multiplexing and channel coding (Release 14)," 3GPP TS 36.212 V14.5.1 (Jan. 2018).
Third Generation Partnership Project, "Technical Specification Group Radio Access Network; NR; Multiplexing and channel coding (Release 15)," 3GPP TS 38.212 V15.0.0 (Dec. 2017).
Third Generation Partnership Project, "Technical Specification Group Radio Access Network; Multiplexing and channel coding (TDD) (Release 14)," 3GPP TS 25.222 V14.0.0 (Mar. 2017).
Third Generation Partnership Project, "Technical Specification Group Radio Access Network; Multiplexing and channel coding (TDD) (Release 13)," 3GPP TS 25.222 V13.0.0 (Dec. 2015).
Third Generation Partnership Project, "Technical Specification Group Radio Access Network; Multiplexing and channel coding (TDD) (3G TS 25.222 version 3.1.0)," 3G TS 25.222 V3.1.0 (Dec. 1999).
Third Generation Partnership Project, "Technical Specification Group Radio Access Network; NR; Physical layer procedures for control (Release 15)," 3GPP TS 38.213 V15.0.0 (Dec. 2017).
Third Generation Partnership Project, "Technical Specification Group Radio Access Network; NR; Physical layer procedures for data (Release 15)," 3GPP TS 38.214 V15.0.0 (Dec. 2017).
Third Generation Partnership Project, "Technical Specification Group Radio Access Network; Evolved Universal Terrestrial Radio Access (E-UTRA); Physical layer; Measurements (Release 15)," 3GPP TS 36.214 V15.0.1 (Jan. 2018).
Third Generation Partnership Project, "Technical Specification Group Radio Access Network; Evolved Universal Terrestrial Radio Access (E-UTRA); Physical layer; Measurements (Release 14)," 3GPP TS 36.214 V14.4.0 (Dec. 2017).
Third Generation Partnership Project, "Technical Specification Group Radio Access Network; Evolved Universal Terrestrial Radio Access (E-UTRA); Physical layer; Measurements (Release 14)," 3GPP TS 36.214 V14.1.0 (Dec. 2016).
Zte et al., "Consideration on Flexibility of LDPC Codes for NR," 3GPP TSG-RAN WG1 AH NR Meeting, R1-1700245, Spokane, USA (Jan. 16-20, 2017).
Ericsson, "On LDPC Code Parameters for NR," 3GPP TSG RAN WG1 AH_NR Meeting, R1-1700110, Spokane, USA (Jan. 16-20, 2017).

* cited by examiner

1600

(a) Scheme 1: evenly distributed over the buffer (b) Scheme 2: evenly distributed over parity bits (c) Scheme 3: evenly distributed over P2 parity bits

2500A

| A | A | N | A | N | A | A | A | N | A |

| A | A | A | A | A | A | A | A | N | A |

| A | A | A | A | A | A | A | A | A | A |

| N | N | N | N | N | N | N | N | N | N |

FIG. 25D

METHOD AND APPARATUS FOR LOW-DENSITY PARITY-CHECK (LDPC) CODING

CROSS REFERENCE TO RELATED APPLICATIONS

This application is the U.S. National Stage, under 35 U.S.C. § 371, of International Application No. PCT/US2018/016170 filed Jan. 31, 2018, which claims the benefit of U.S. Provisional Patent Appln. No. 62/454,623, which was filed on Feb. 3, 2017; U.S. Provisional Patent Appln. No. 62/475,126, which was filed on Mar. 22, 2017; U.S. Provisional Patent Appln. No. 62/500,897, which was filed on May 3, 2017; U.S. Provisional Patent Appln. No. 62/519,671, which was filed on Jun. 14, 2017; U.S. Provisional Patent Appln. No. 62/543,033, which was filed on Aug. 9, 2017; U.S. Provisional Patent Appln. No. 62/556,079, which was filed on Sep. 8, 2017; and U.S. Provisional Patent Appln. No. 62/565,716, which was filed on Sep. 29, 2017; the contents of which are hereby incorporated by reference herein.

SUMMARY

An apparatus and method are described. The apparatus includes a transceiver and processor, which attach transport block (TB) level CRC bits to a TB, select an LDPC base graph (BG) based on a code rate (CR) and TB size of the TB including TB level CRC bits, determine a number of code blocks (CBs) to use for segmenting the TB including TB level CRC bits depending on the selected LDPC BG, determine a single CB size for each of the CBs based on the number of CBs, segment the TB including TB level CRC bits into the CBs based on the number of CBs and CB size, pad zeros to a last CB of the CBs in the segmented TB, attach CB level CRC bits to each CB in the segmented TB, encode each CB in the segmented TB using the selected LDPC base graph, and transmit the encoded CBs.

BRIEF DESCRIPTION OF THE DRAWINGS

A more detailed understanding may be had from the following description, given by way of example in conjunction with the accompanying drawings, wherein like reference numerals in the figures indicate like elements, and wherein:

FIGS. 25A, 25B, 25C and 25D are diagrams of another example of TB-level ACK/NACK assisted CBG level ACK/NACK feedback and re-transmission based on the example of FIGS. 24A, 24B, 24C and 24D;

DETAILED DESCRIPTION

Figure 1A:
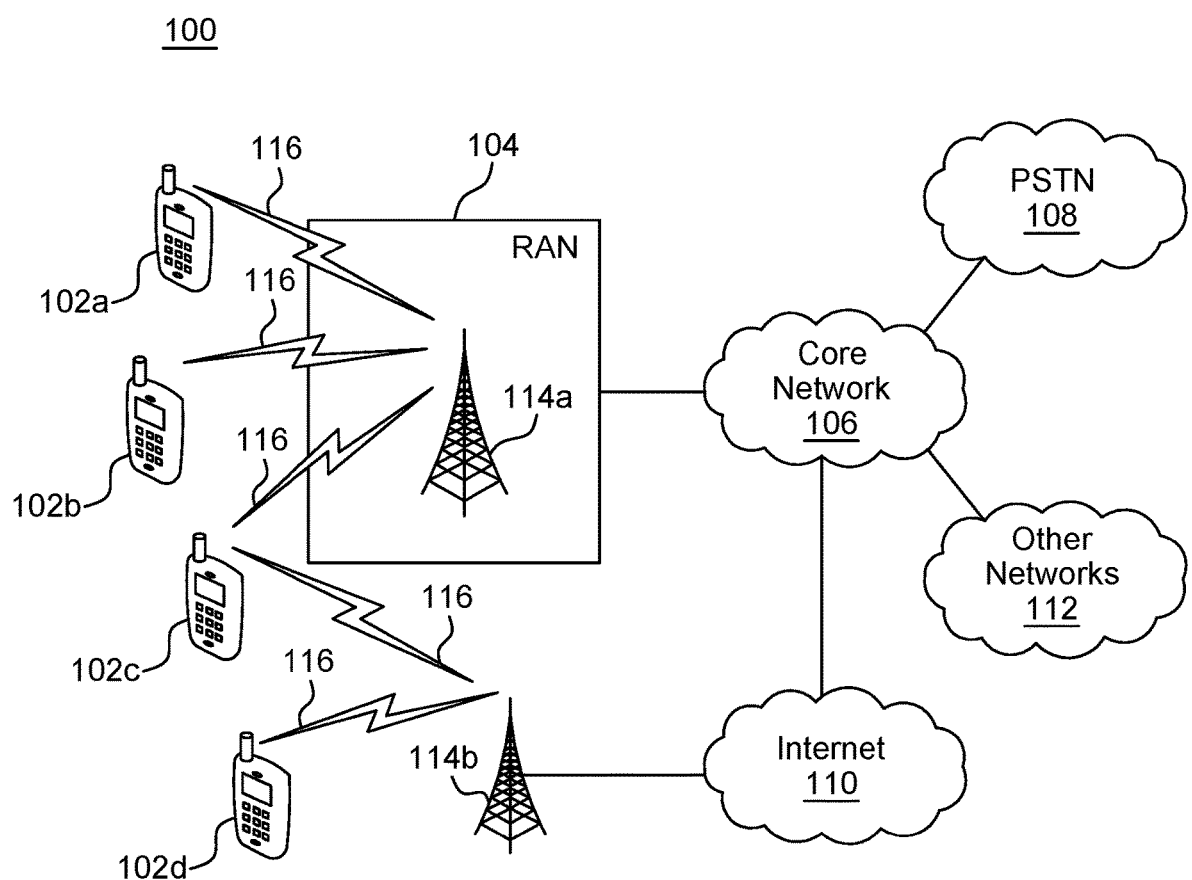
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
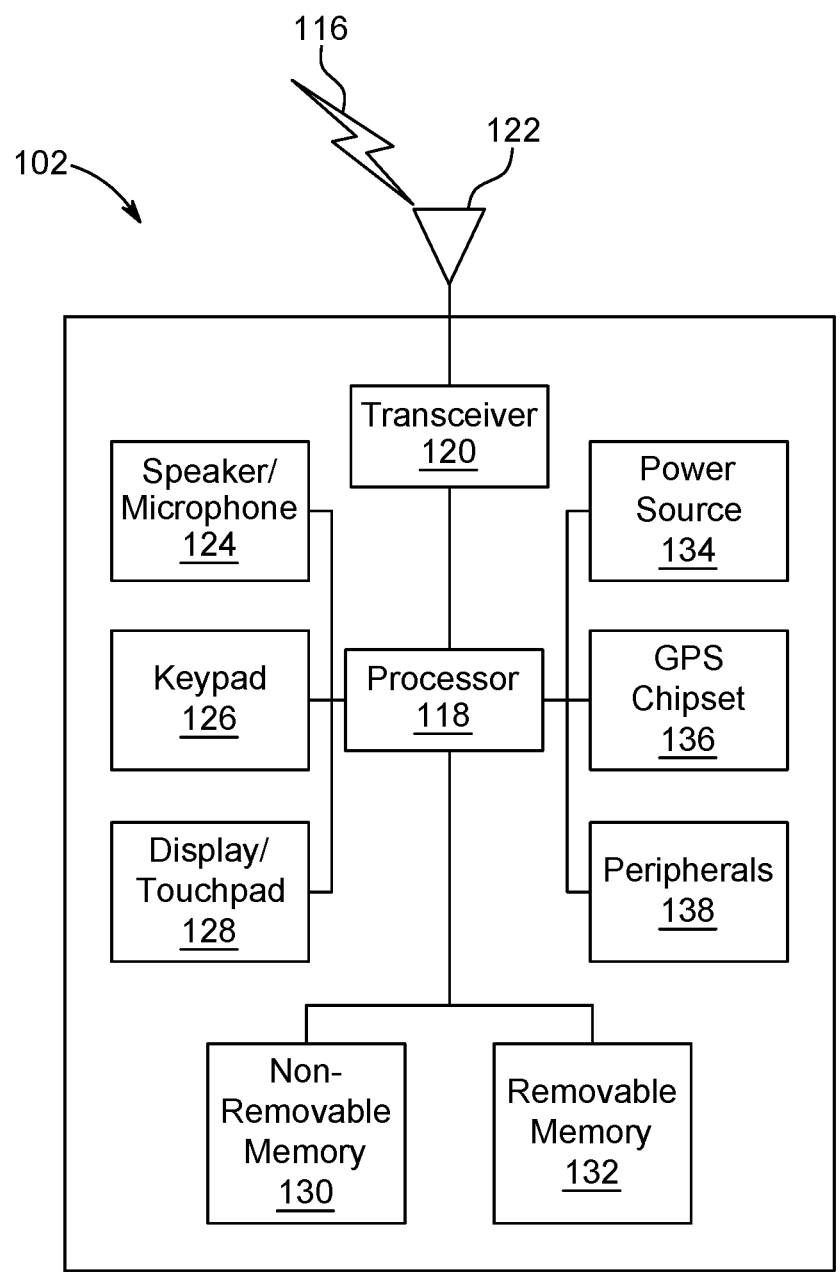
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit 139 to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
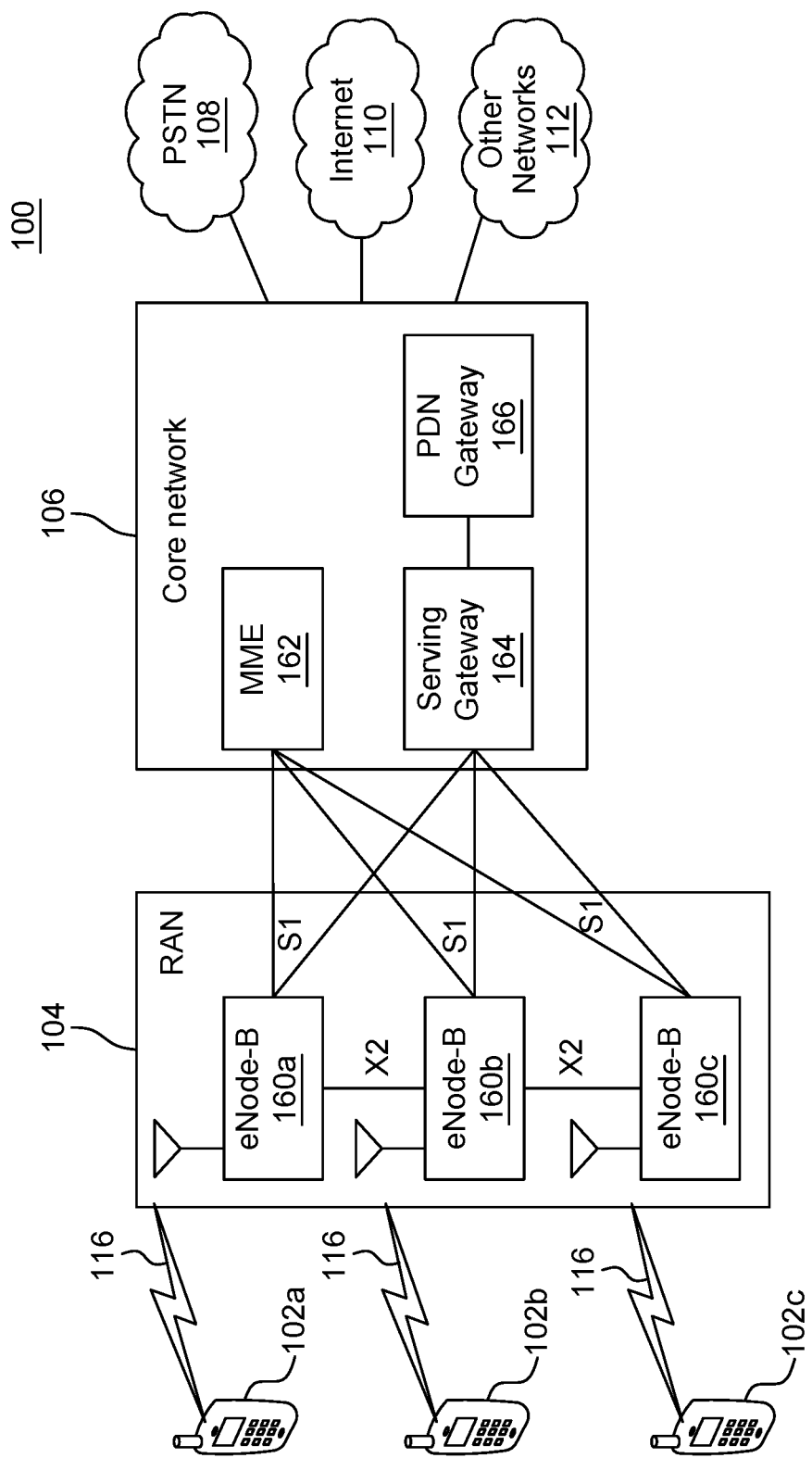
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements is depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing and time domain processing may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
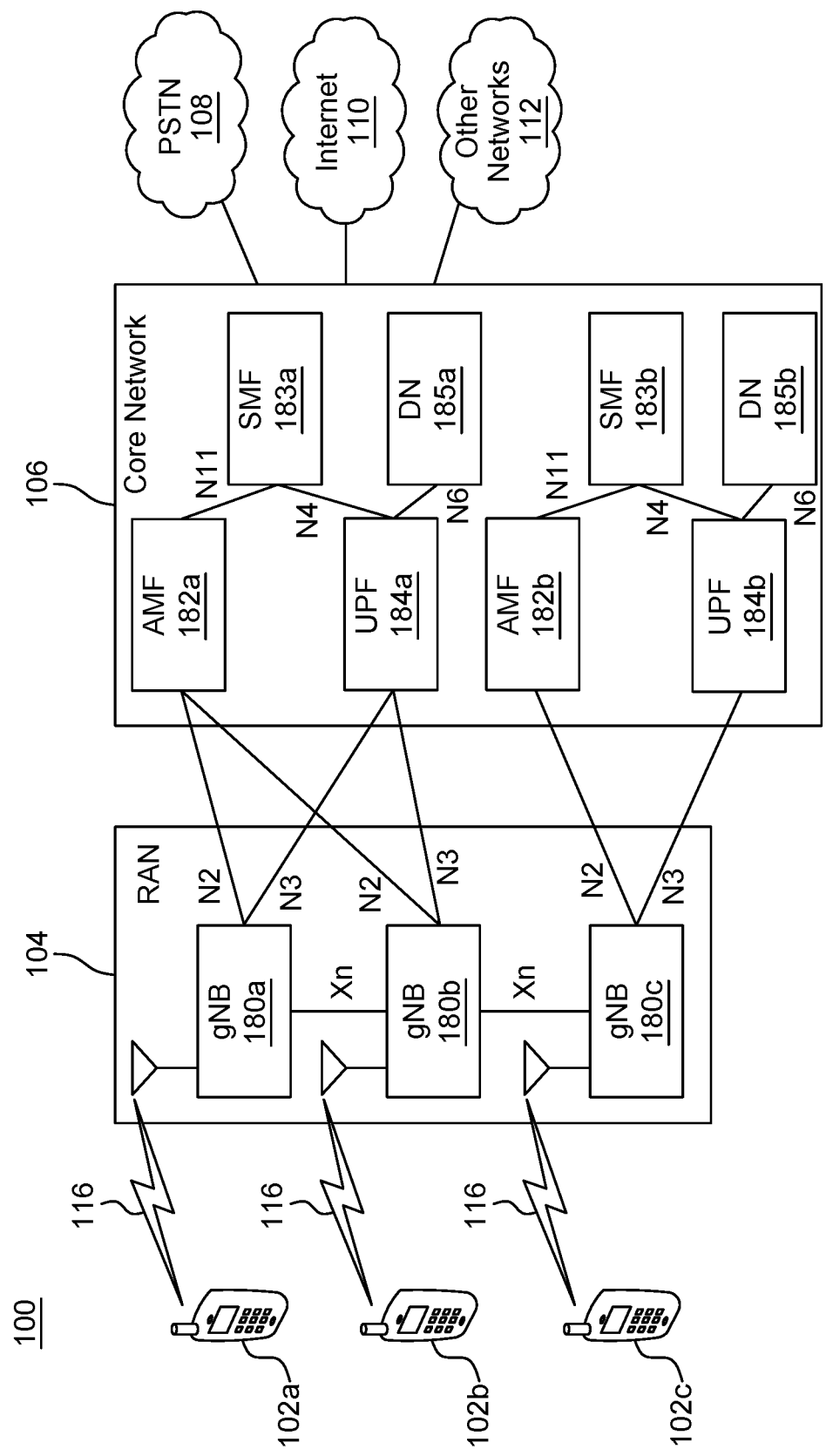
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a, 184b, at least one Session Management Function (SMF) 183a, 183b, and possibly a Data Network (DN) 185a, 185b. While each of the foregoing elements is depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-ab, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Several deployment scenarios and use cases have been defined in the recent 3GPP standards discussions, including indoor hotspot, dense urban, rural, urban macro, and high speed deployment scenarios and Enhanced Mobile Broadband (eMBB), Massive Machine Type Communications (mMTC) and Ultra Reliable and Low latency Communications (URLLC) use cases. Different use cases may focus on different requirements, such as higher data rate, higher spectrum efficiency, low power and higher energy efficiency, lower latency and higher reliability.

Figure 2:
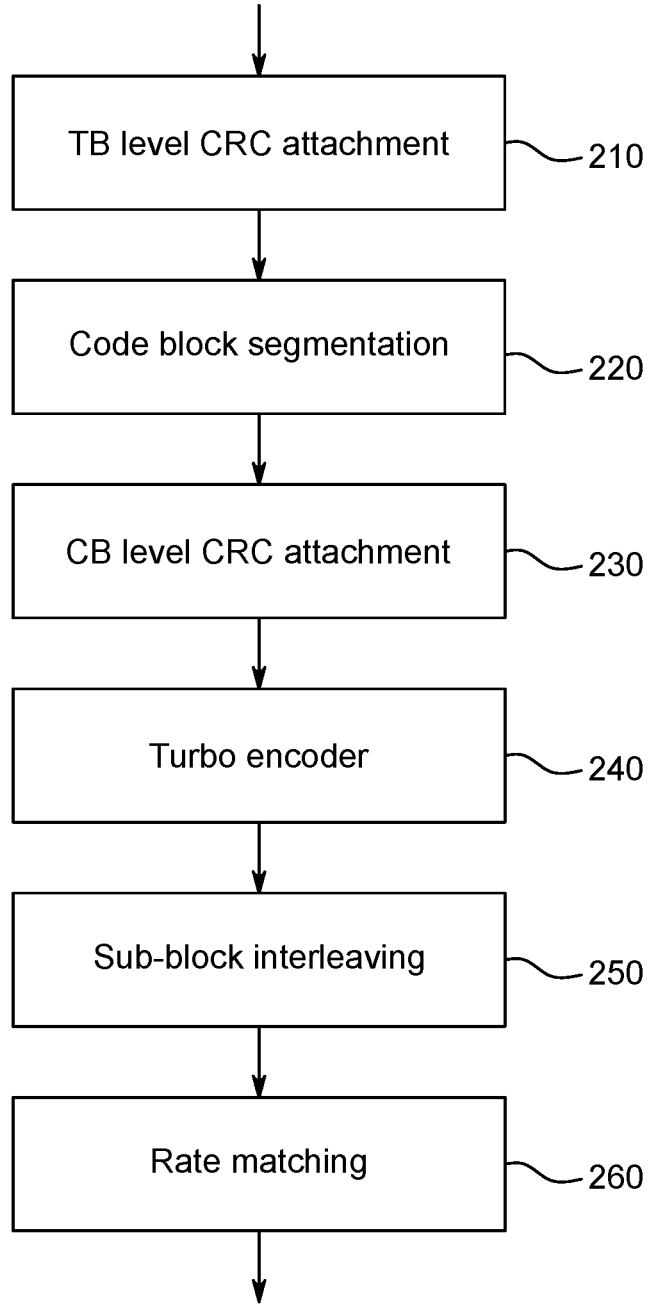
FIG. 2 is a flow diagram of an example method for Long term Evolution (LTE) data channel coding and signalling.

FIG. 2 is a flow diagram 200 of an example method for LTE data channel coding and signalling. In LTE downlink data transmission, the eNB may have a Transport Block (TB) destined for a WTRU. A 24-bit cyclic redundancy check (CRC) may be attached to the TB at the TB level (210). If the TB with the 24-bit CRC attached is larger than the maximum code block size (e.g., 6144 bits), then it will be segmented (220). The number of segments is equal to C=⌈TBS/6144−24⌉, where TBS is the number of bits of the original TB without the CRC attached. The TB with the CRC attached may be almost equally separated among the C segments. If the number of segments is larger than 1, an additional 24-bit CRC may be appended to each code block (CB) at the CB level (230). The actual number of bits in each segment may depend on the supported block size in the turbo code internal interleaver parameters.

Each code block may be encoded by a turbo code with fixed mother code rate of ⅓ (240). The systematic bits and two sets of parity bits may then be passed to the sub-block interleaver and saved in a certain order in a circular buffer (250). Rate matching and/or incremental redundancy hybrid automatic repeat request (IR-HARQ) may be used to send the desired number of bits from the circular buffer (260). Each redundancy version (RV) may correspond to a different starting point of the circular buffer.

The number of bits to be sent in each transmission may depend on the number of Resource Blocks (RBs) allocated for the transmission and the modulation order and coding rate (CR). The modulation order and coding rate may be determined by the DL channel condition, and the number of RBs allocated for the transmission may be obtained from a look-up table.

To facilitate successful decoding at the WTRU, the eNB may transmit some coding and modulation related information to the WTRU. This information may be provided in the Downlink Control Information (DCI), which is sent together with the CB.

On a condition that a WTRU receives the DCI, the WTRU will check the DCI (e.g., format 1/1A/1B) for RB assignment, 5-bit modulation and coding scheme (MCS) information, 3-bit HARQ process number, 1-bit new data indicator, and 2-bit RV. The RB assignment tells the WTRU how many RBs are assigned to the WTRU ($N_{RB}$) and where they are located. The 5-bit MCS information implies both modulation order M and TBS index $I_{TBS}$. Based on $N_{RB}$ and $I_{TBS}$, the WTRU may determine the TB size (TBS) based on the look-up table. Following the same procedure as the eNB, the WTRU will know the number of segmented code blocks C and the CB size (CBS) of each CB, $K_i$, $1 \leq i \leq C$.

The WTRU may determine the channel coding rate using the following approximate formula:

$$\text{Coding Rate} = \frac{(TBS) + 24}{(\#RE) \cdot M \cdot 90\%}.$$

In the formula, #RE is the total number of resource elements allocated and may be equal to $168 \cdot N_{RB}$ (e.g., 168 REs/RB (=12 subcarriers/PRB times 14 symbols/TTIs)). The modulation order M may imply the number of bits per RE, and 90% considers that 10% resource elements are allocated for control or reference signals.

LDPC codes are forward error correction codes that may be supported for 3GPP and Institute of Electrical and Electronics Engineers (IEEE) 802 applications. For 3GPP applications, for example, consider a (N, K) Quasi-Cyclic LDPC (QC-LDPC) code, where K is the information block length and N is the coded block length. The parity check matrix H may be a sparse matrix with size (N−K)×N. A QC-LDPC code may be uniquely defined by its base matrix with size J×L:

$$B = \begin{bmatrix} B_{1,1} & \cdots & B_{1,L} \\ \vdots & \ddots & \vdots \\ B_{J,1} & \cdots & B_{J,L} \end{bmatrix}.$$

Each component in the base matrix may be a Z×Z circulant permutation matrix or an all zero matrix. A positive integer value of $B_{i,j}$ may represent the circulant permutation matrix that is circularly right shifted $B_{i,j}$ from the Z×Z identity matrix. An identity matrix may be indicated by $B_{i,j}=0$, while a negative value of $B_{i,j}$ may indicate an all zero matrix, and N=L·Z.

A given QC-LDPC may be used for a fixed code rate. For rate-matching/IR-HARQ support, the code extension of a parity check matrix may be used. In embodiments, a protograph matrix (or protomatrix) may be used. A protomatrix with size J×L may correspond to a coding rate of $$\frac{L-J}{L}.$$

sub-matrix of the promatrix from the left-top corner with size J'×L' may also be a value parity check matrix if L'−J'=L−J. This sub-matrix may correspond to a coding rate of $$\frac{L'-J'}{L'},$$

which is larger than $$\frac{L-J}{L}.$$

To support where the coding rate decreases with re-transmissions, a matrix extension from some smaller J values to some larger J value may be executed. In general, the minimum code rate from a protomatrix may be given by $$r_{min} = r_q = \frac{L-J}{L},$$

while the maximum code rate from a protomatrix may be given by $r_{max}=r_1$.

Figure 3:
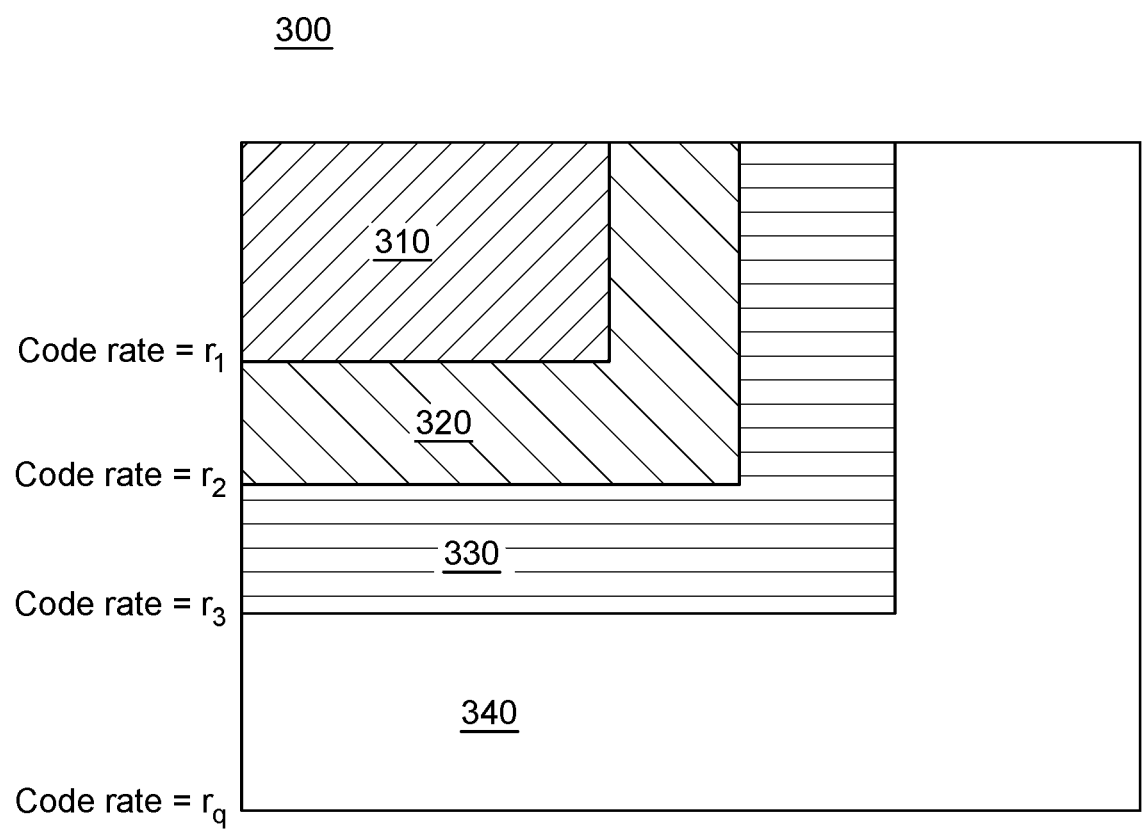
FIG. 3 is a diagram of an example protomatrix.

FIG. 3 is a diagram of an example protomatrix 300. In the example illustrated in FIG. 3, the protomatrix 300 includes four sub-matrices 310, 320, 330 and 340, which correspond to code rates $r_1$, $r_2$, $r_3$ and $r_q$, respectively.

Regardless of which sub-matrix is used, its supporting information block length is (L−J)·Z. The lifting size Z may be selected such that (L−J)·Z is larger than the actual information block length K, and the difference (L−J)·Z=K may be handled through zero-padding.

For IEEE 802, in IEEE 802.11ac, for example, three different LDPC code word lengths are supported: 658 bits, 1296 bits, and 1944 bits. For packets shorter than 322 bytes, which code word size to use may need to be determined. For packets longer than 322 bytes, a code word size of 1944 bits may always be used.

The initial step of encoding may be to select the code word length and determine the number of code words based on the size of the packet and MCS used. This may be followed by computing the amount of shortening bits and then producing parity bits. If necessary, puncturing or repetition may then be performed.

3GPP next generation (NG) standard discussions have included possible introduction of code block group (CBG) level CRC. The working assumption is that CBG-based transmission with single/multi-bit HARQ-acknowledgement (HARQ-ACK) feedback is supported in 3GPP Release 15 with the characteristics of: only allowing CBG-based transmission or re-transmission for the same TB of a HARQ process, a CBG may include all CBs of a TB regardless of the size of the TB, a CBG may include one TB, and CBG granularity may be configurable.

As mentioned above, in LTE systems, the coding scheme for the data channel is based on turbo coding with a fixed mother code rate of ⅓. In 5G systems, however, a flexible LDPC coding scheme has been adopted for the eMBB data channel. For such systems, QC-LDPC codes will be used and variable information block size will be supported through lifting and shortening operations and variable coding rate will be supported through code extension of a parity-check matrix. The parity-check matrix will be based on protomatrices, which may be expanded from a high coding rate of ⅚ to a lower coding rate (e.g., as low as ⅕). Hence, there may be no fixed mother code rate for LDPC codes in 5G systems as there is for LTE systems.

In order to facilitate the encoding and decoding operations at both the transmitter and the receiver, for 5G systems, for example, the transmitter may need to determine the mother code rate, and the mother code rate may need to be synchronized between the transmitter and the receiver. Embodiments described herein provide generic procedures and associated signaling support for LDPC coding in systems such as the 5G systems described above.

Further, due to the narrowband nature of LTE, in LTE, it is ensured that each OFDM symbol carries only one CB. However, the large bandwidth allocation in new radio (NR) may lead to many CBs per OFDM symbol. By way of example, for an embodiment where 4 MIMO layers, 256 QAM modulation and 3300 resource elements (REs) or RBs are used, there can be, at most, 12 CBs in each OFDM symbol considering the code rate of ⅚ and CB information bits of 8448 bits. In general, the number of CBs in each OFDM symbol per codeword may be approximately:

$$\frac{M \cdot \# \text{ subcarriers} \cdot \# \text{ layers}}{8448/C},$$

where M is the modulation order for all layers and C is the code rate. This makes a CB very susceptible to burst errors or deep fades. If the CBs are spread over very different frequency locations, CB performance will be greatly improved due to frequency diversity gain. Also, it may be preferred that each CB within one HARQ-feedback unit has roughly the same performance for convenience of scheduling and reducing HARQ-feedback overhead. Hence, the use of a symbol level interleaver may force all CBs to have roughly the same performance. Embodiments described herein provide for a suitable symbol level interleaver.

Figure 4A:
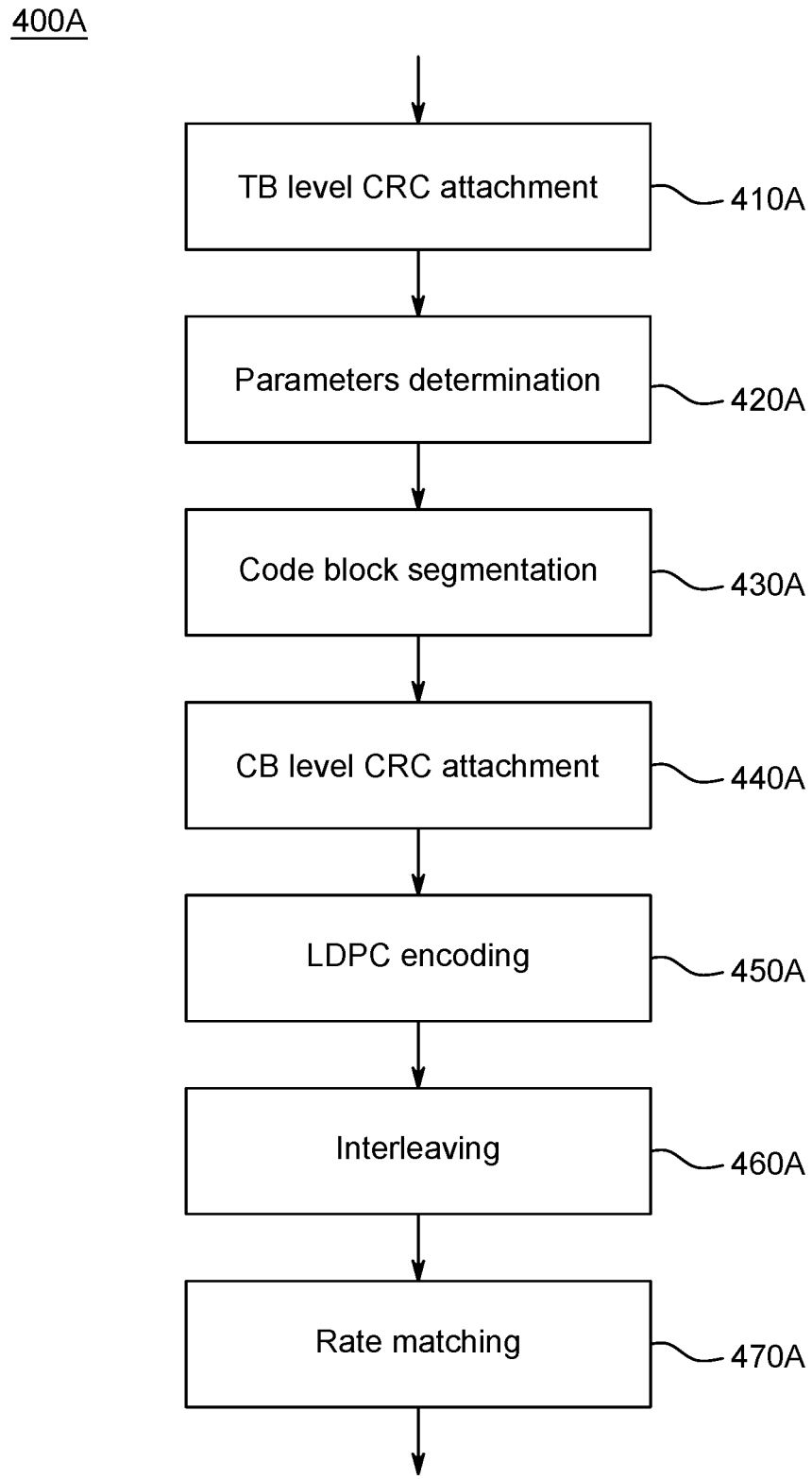
FIG. 4A is a flow diagram of an example method of transport block (TB) processing for a data channel using Quasi-Cyclic LDPC (QC-LDPC) codes.

FIG. 4A is a flow diagram 400A of an example method of TB processing for a data channel using QC-LDPC codes. For purposes of the example illustrated in FIG. 4A, assume a protomatrix based QC-LDPC code is used for channel coding, the largest supported lifting size of the QC-LDPC code is $Z_{max}$, and the whole protomatrix is size J×L. Given these assumptions, the largest codeword size may be given by L·$Z_{max}$. The set of supported lifting sizes may be represented as Z={$Z_1$, . . . , $Z_{|z|}$=$Z_{max}$} and the supported information block sizes may accordingly be represented as K={$Z_1$·(L−J), . . . , $Z_{|z|}$·(L−J)}.

In the example illustrated in FIG. 4A, a TB may have a transport block size (TBS) of A bits. A CRC having $C_1$ bits may be attached to the TB (410A). $C_1$ may be the TB level CRC length, which may be, for example, 24, 16 or other value less than 24.

Segmentation parameters for the TB processing may be determined (420A). The parameters may include a number of CB segments, a length of each CB segment, one or more LDPC code lifting sizes, and the mother code rate of the LDPC code.

Regarding the number of CB segments, the TB with TBS of A bits with $C_1$ CRC bits attached and having a total size of (A+$C_1$) may be partitioned into multiple segments. The number of segments may be determined by:

$$B = \left\lceil \frac{A + C_1}{(L-J) \cdot Z_{max} - C_2} \right\rceil, \quad \text{Equation (1)}$$

where $C_2$ is the CB level CRC length, which may be 24, 16 or other value.

Regarding the length of each code block segment and the number of padding bits, the padded bits may be zeros, a known sequence, or a subset of a known sequence, cyclically repeated from the information bits. There are a number of different ways of partitioning the TB. Examples are described below with respect to FIGS. 5, 6 and 7.

Regarding the one or more LDPC code lifting sizes, since each supported information block size may correspond to a unique lifting size, the lifting size of each segment may be determined by supported information block size. For the embodiments described below with respect to FIGS. 5 and 6 with equal partitioning of the TB with CRC, the segments of size K+ correspond to a lifting size Z+, and the segments of size K− correspond to a lifting size of Z−. In embodiments, it is possible that Z+=Z−. For the embodiment described below with respect to FIG. 7 with equal partitioning of the TB with CRC to fit in supported information block sizes, the last segment may correspond to a lifting size Z−, while the other segments may correspond to the maximum lifting size $Z_{max}$. In embodiments, it is possible that Z−=$Z_{max}$.

Regarding the mother CR of the LDPC code, FIG. 2 above shows that a protomatrix may contain LDPC codes with multiple CRs depending on the size of the corresponding sub-matrix. Unlike the LTE Turbo codes where the mother code rate is fixed at ⅓, the mode code for LDPC codes may have multiple optional code rates between $r_{max}$ and $r_{min}$ from a protomatrix. Accordingly, the mother code rate of the LDPC code will need to be determined.

The decision as to what mother code rate to use may depend on the data quality of service (QoS), which may include both latency and reliability requirements. In principle, for the high reliability requirement, the low mother code rate may be used while for the low reliability requirement, the high mother code rate may be used. For the small latency requirement, the higher mother code rate may be used; while for the large latency requirement, the low mother code rate may be used.

To facilitate the signaling and complexity, the number of possible mother code rates may be limited to less than the number of rows of the protomatrix. Some typical code rates may be supported. For example, the possible mother code rates may be {⅓, ⅖, ½, ⅔}. The mother code rates could then specify which sub-matrix of the protomatrix is to be used for encoding. This may also specify the memory to be used to store the coded blocks for re-transmissions.

Once the segmentation parameters are determined, code block segmentation (430A) may be performed, for example, to pad zeros to the TB and then segment them accordingly. Different ways to pad the zeros and segment the TB with padded zeros are described in more detail below, for example, with respect to FIGS. 5, 6 and 7.

CB level CRC attachment (440A) may be performed, for example, by attaching C2 CRC bits to each segmented code block. Unlike the LTE Turbo codes, the LDPC code has self-parity check functionality at the end of each iteration. Hence, the number of CB level CRC bits for the LDPC code may be much less than for the Turbo code (e.g., 24 bits). In embodiments, the value of C2 may be 16 bits, 8 bits, 4 bits or even 0 bit.

CB group (CBG) level CRC attachment (not shown) may be optionally performed, for example, by attaching C3 CRC bits to each CBG. This is described in more detail below with respect to FIGS. 18A and 18B. The number of CBG CRC bits for the LDPC code may be less than 24 bits. In other words, the value of C3 may be 16 bits, 8 bits, 4 bits or even 0 bit. The number of CBs within a CBG may depend on the total number of segmented CBs, WTRU capability and latency requirement.

LDPC encoding (450A) may then be performed, for example, by encoding each segmented CB using, for example, the determined mother LDPC code parity check matrix. In embodiments, the lifting size for each segmented TB may be pre-determined. A coded block may be provided as a result of the LDPC encoding 450A.

In general, due to its sparsity nature, interleaving for LDPC coding may not be needed. However, interleaving (460A) may be used to improve performance, for example, in the case of burst puncturing/interfering, as may be accomplished using the multiplexing used in URLLC and eMBB. This may be due to the localized parity node/variable node connections in QC-LDPC codes. Since the interleaving (460A) may not be of benefit in all scenarios, it may be considered to be optional and may be activated/deactivated in some embodiments depending on the scenario. The coded blocks, which may or may not be interleaved, may be saved in memory, such as in a circular buffer, for use in transmissions and re-transmissions.

Rate matching (470A) may be performed, for example, for puncturing or repetitioning, based on the circular buffer, to fit the desired code rates. Details for how this may be done using a single circular buffer or multiple circular buffer HARQ designs are provided below. In embodiments, rate matching (470A) may be performed before interleaving (460A) without departing from the scope of the embodiments described herein.

Figure 4B:
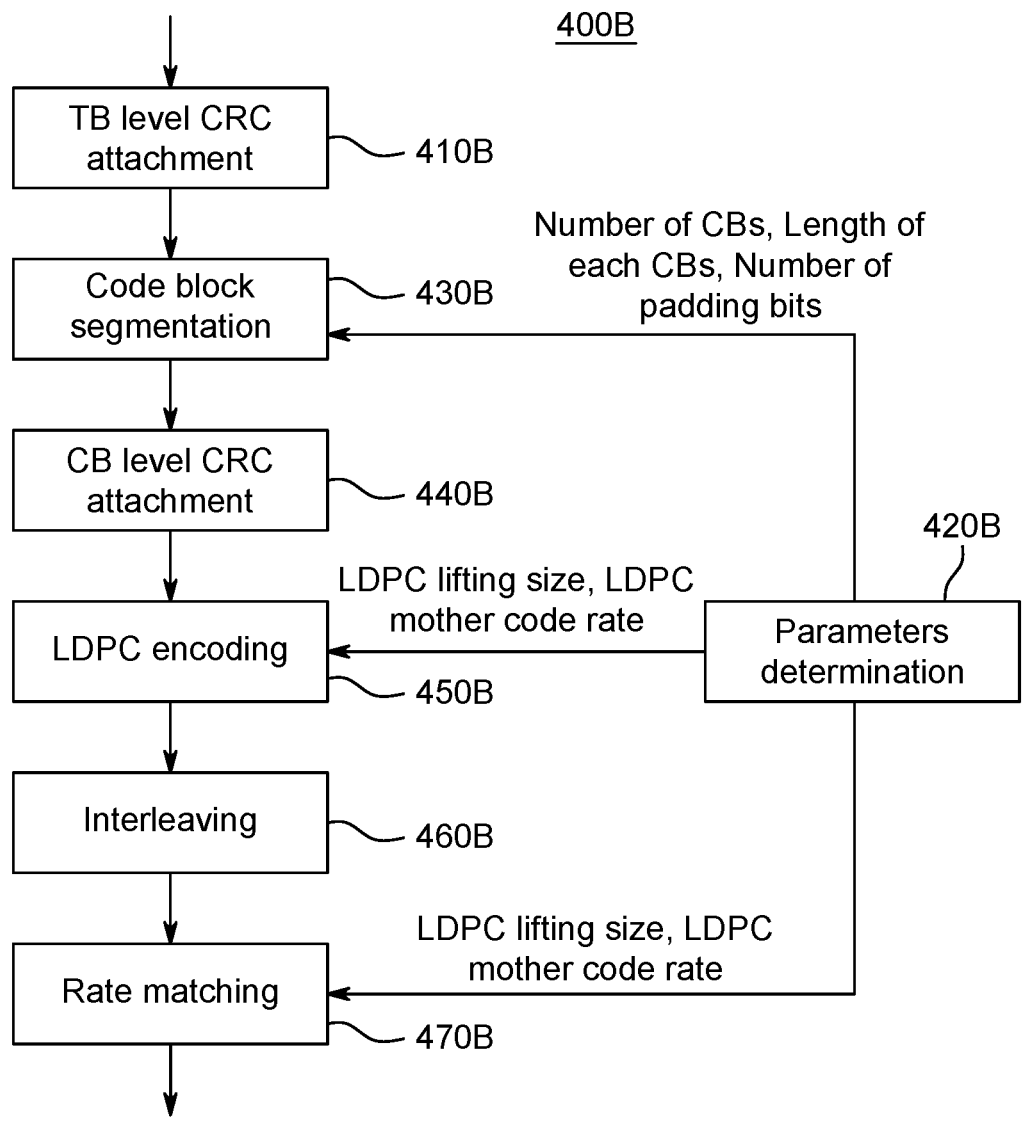
FIG. 4B is a flow diagram of another example method of TB processing for a data channel using QC-LDPC codes.

FIG. 4B is a flow diagram 400B of another example method of TB processing for a data channel using QC-LDPC codes. In the example illustrated in FIG. 4B, the TB level CRC attachment 410B, the parameters determination 420B, the code block segmentation 430B, the CB level CRC attachment 440B, the LDPC encoding 450B, the interleaving 460B and the rate matching 470B may be performed the same as, or similarly to, the corresponding procedures 410A, 420A, 430A, 440A, 450A, 460A and 470A described above with respect to FIG. 4A. However, in the example illustrated in FIG. 4B, the parameters can be determined (420B) at any time and provided for use during each relevant procedure. For example, the number of CBs, length of each CB, and number of padding bits may be provided for use during code block segmentation 430B, and LDPC lifting size and LDPC mother code rate may be provided for use during LDPC encoding 450B and rate matching 470B.

Figure 5:
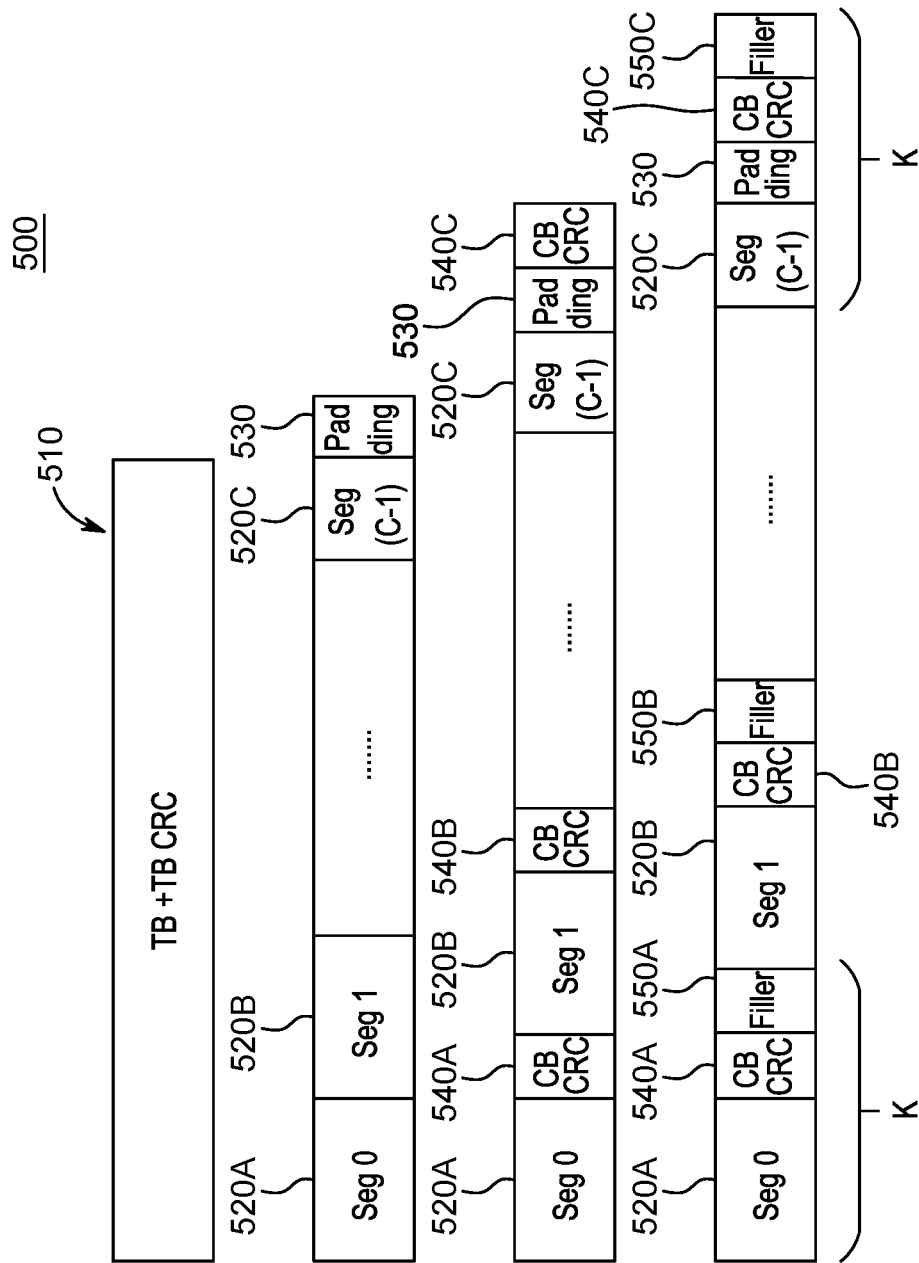
FIG. 5 is a diagram of an example of code block (CB) generation with equal partitioning of a TB including TB level cyclic redundancy check (CRC)

FIG. 5 is a diagram 500 of an example of CB generation with equal partitioning of the TB including the TB level CRC. In the example illustrated in FIG. 5, a TB with TB level CRC attached (510) is partitioned into segments or CBs 520A, 520B and 520C. Each segment 520 may be of size $$\frac{A + C_1}{B},$$

where $$\frac{A + C_1}{B}$$

is an integer. Otherwise, each of the first B−1 segments 520 is of size $$\left\lceil \frac{A+C_1}{B} \right\rceil,$$

while the last segment (e.g., segment 520C in FIG. 5) is of size $(A+C_1)-(B-1)$.

$$\left\lceil \frac{A+C_1}{B} \right\rceil.$$

In an embodiment where the last segment 520C is a different size than the other segments 520A and 520B, the last segment 520C may be padded with $$B \cdot \left\lceil \frac{A+C_1}{B} \right\rceil - (A+C_1)$$

zeros 530 such that all CBs (corresponding to a segment 520 plus a CB CRC 540 plus any filler bits 550) are of the same size of $$\left\lceil \frac{A+C_1}{B} \right\rceil.$$

In embodiments (not known), the padding 530 could alternatively be added to a different segment, such as the first segment 520A, which may, in such an embodiment, have a different size than the rest of the segments 520B and 520C. CB CRCs 540A, 540B and 540C may then be added to each CB.

Filler bits 550A, 550B and 550C may then be added. In embodiments, $K^+$ may be set as the smallest K in set K, which may be larger than or equal to $$\left\lceil \frac{A+C_1}{B} \right\rceil + C_2.$$

The set K may be the set of supported information block lengths, either from a single base matrix or from the union of two base matrices. Given this, the number of filler bits for each segment may be $$K^+ - \left\lceil \frac{A+C_1}{B} \right\rceil - C_2.$$

Here, the ceiling operation, $\lceil x \rceil$, is used. However, it may be replaced by a round operation. The round operation may return the closest integer or floor operation, which may return the largest integer smaller than the number x.

In the example illustrated in FIG. 5, the CB level CRC 540 is added before the filler bits 550. In this example, the difference between the padding bits and the filler bits is that the padding bits are sent over the air with the source bits while the filler bits are removed after LDPC encoding.

Figure 6:
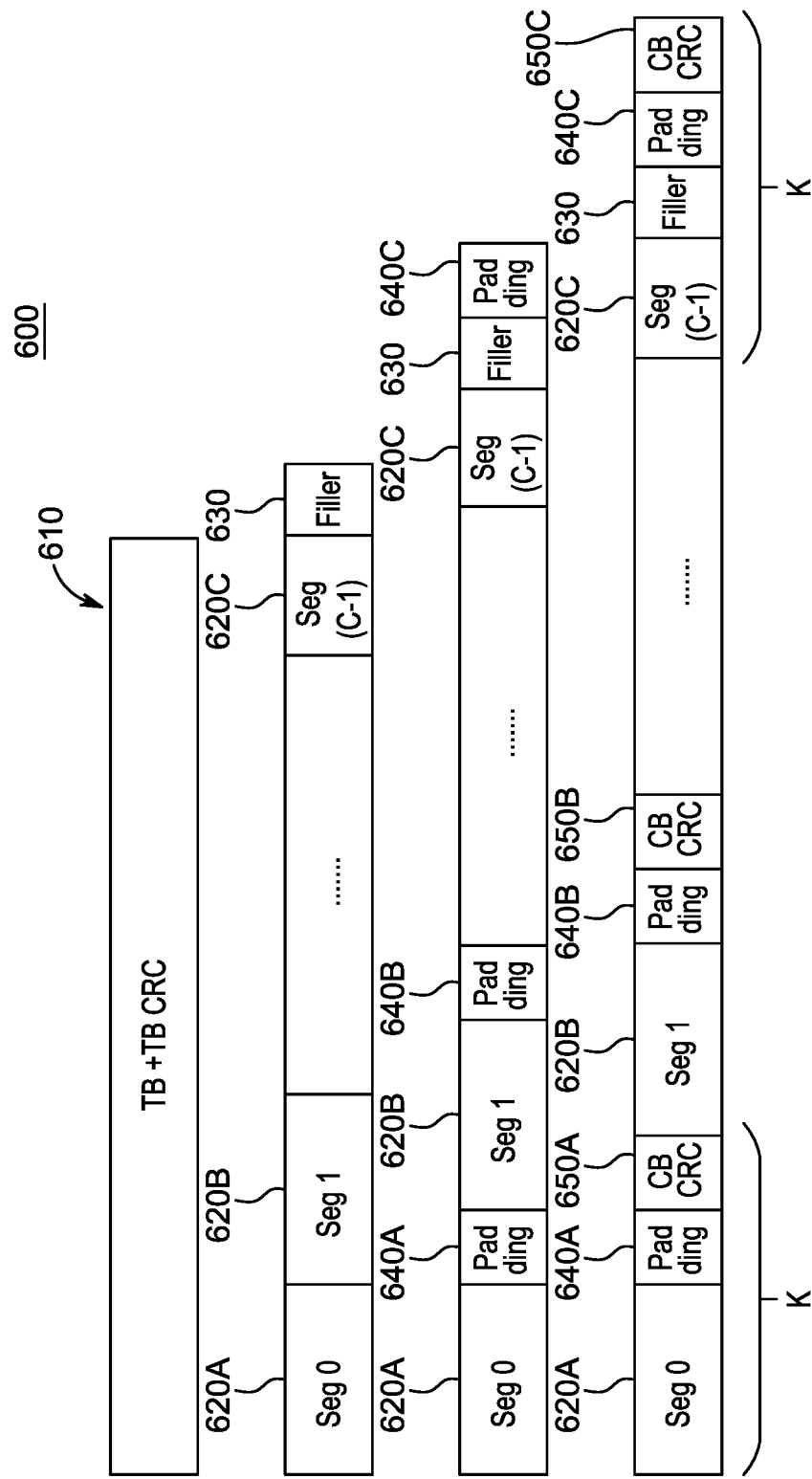
FIG. 6 is a diagram of another example of CB generation with equal partitioning of the TB including TB level CRC.

FIG. 6 is a diagram 600 of another example of CB generation with equal partitioning of the TB including TB level CRCs. In the example illustrated in FIG. 6, a TB with TB level CRC attached (610) is partitioned into segments or CBs 620A, 620B and 620C. Each segment 620 may be of size $$\frac{A+C_1}{B},$$

where $$\frac{A+C_1}{B}$$

is an integer. Otherwise, each of the first B−1 segments 620 is of size $$\left\lceil \frac{A+C_1}{B} \right\rceil,$$

while the last segment (e.g., segment 620C in FIG. 6) is of size $$(A+C_1) - (B-1) \cdot \left\lceil \frac{A+C_1}{B} \right\rceil.$$

In the example illustrated in FIG. 6, filler bits 630 may be added to the last segment 620C.

In the example illustrated in FIG. 6, padding 640A, 640B and 640C is added to each CB before the CB level CRC 650A, 650B and 650C is added. In such an embodiment, $K^+$ may be set as the smallest K in set K, which may be larger than or equal to $$\left\lceil \frac{A+C_1}{B} \right\rceil + C_2 \cdot K^-$$

may be set as the smallest K in the set K, which may be larger than or equal to $$(A+C_1) - (B-1) \cdot \left\lceil \frac{A+C_1}{B} \right\rceil + C_2.$$

The set K is the set of supported information block lengths, either from a single base matrix or from the union of two base matrices. Given this, the number of zero-padding bits for the first B−1 segments may be $$K^+ - \left\lceil \frac{A+C_1}{B} \right\rceil - C_2,$$

and the number of zero-padding bits for the last segment may be $$K^- - (A+C_1) + (B-1) \cdot \left\lceil \frac{A+C_1}{B} \right\rceil - C_2.$$

The ceiling operation, $\lceil x \rceil$, is used here. However, it may be replaced by a round operation. The round operation may return the closest integer or floor operation, which may return the largest integer smaller than the number x. Alternatively, if a single lifting size is preferred, the information block size may be used as $\max(K^+, K^-)$. The number of zero-padding bits may be adjusted accordingly.

Figure 7:
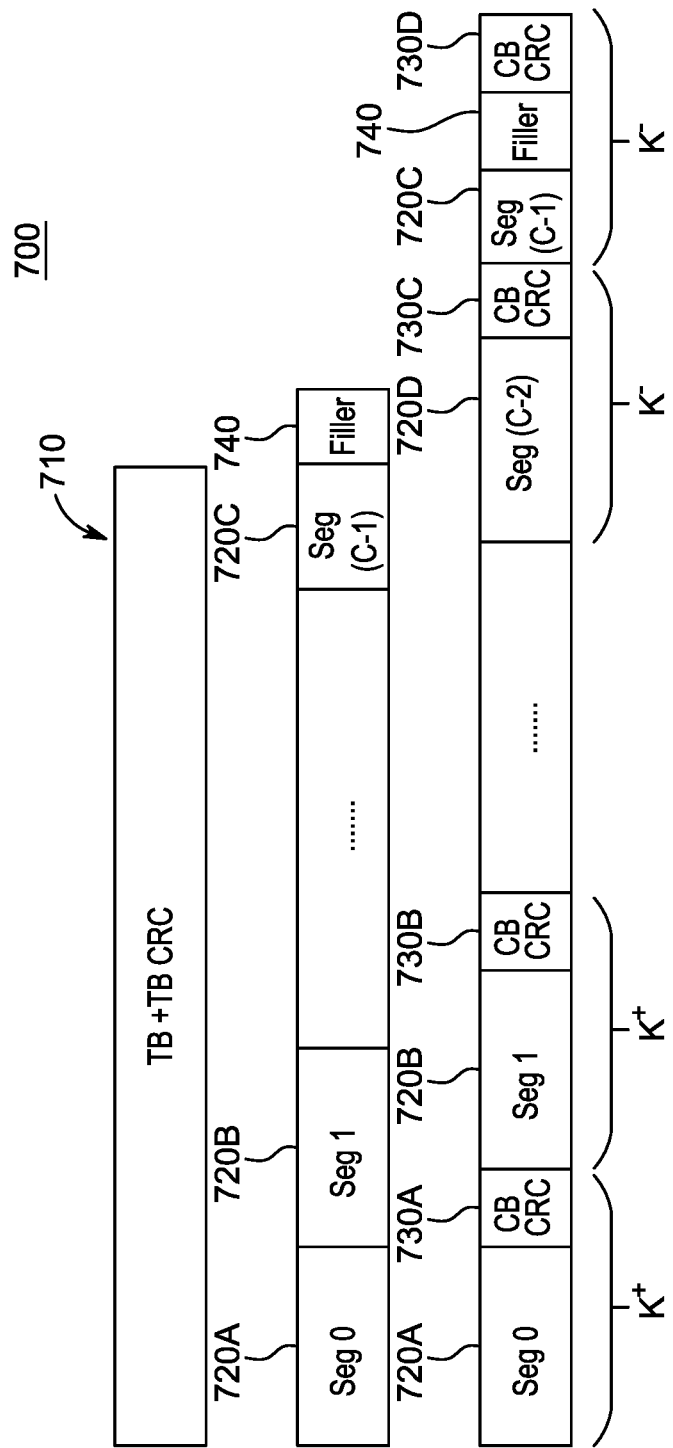
FIG. 7 is a diagram of an example of CB generation with equal partitioning of the TB including TB level CRC to fit in supported information block sizes.

FIG. 7 is a diagram 700 of an example of CB generation with equal partitioning of the TB including TB level CRC to fit in supported information block sizes. In the example illustrated in FIG. 7, the TB with the TB CRC 710 is partitioned into segments or CBs 720A, 720B and 720C. Filler 740 may be added to the last segment 720C, as shown. CB CRCs 730A, 730B, 730C and 730D may be added to each CB. $K^+$ may be set as the smallest K in the set K such that:

$$B \cdot K^+ \geq A + C_1 + B \cdot C_2, \quad \text{Equation (2)}$$

and $K^-$ may be set as the largest K in the set K such that $K < K^+$. Then, the number of segments with length $K^-$ may be equal to $$C^- = \left\lfloor \frac{B \cdot K^+ - (A + C_1 + B \cdot C_2)}{K^+ - K^-} \right\rfloor, \quad \text{Equation (3)}$$

and the number of segments with length $K^+$ may be equal to $$B - \left\lfloor \frac{B \cdot K^+ - (A + C_1 + B \cdot C_2)}{K^+ - k^-} \right\rfloor.$$

The set K may be the set of supported information block lengths, either from a single base matrix or from the union of two base matrices. The number of segments with length $K^+$ may be equal to $C^+ = B - C^-$. In this embodiment, the number of zero padding bits may be equal to $$\left\lfloor \frac{B \cdot K^+ - (A + C_1 + B \cdot C_2)}{K^+ - K^-} \right\rfloor \cdot K^- + \left(B - \left\lfloor \frac{B \cdot K^+ - (A + C_1 + B \cdot C_2)}{K^+ - k^-} \right\rfloor\right) \cdot K^+ - (A + C_1 + B \cdot C_2).$$

In another embodiment, the TB may be partitioned with the maximum supported information block size first. Each of the first B−1 segments may be of the size $Z_{max} \cdot (L-J) - C_2$, while the last segment may be of the size $(A+C_1) - (B-1) \cdot [Z_{max} \cdot (L-J) - C_2]$. $K^-$ may be set as the smallest K in the set K, which may be larger than or equal to $(A+C_1) - (B-1) \cdot [Z_{max} \cdot (L-J) - C_2]$. Then the number of zero-padding bits for the last segment may be $K^- - (A+C_1) + (B-1) \cdot [Z_{max} \cdot (L-J) - C_2]$.

For all of the segmentation embodiments described above, the order of segments may be changed. On a condition that CBG-level CRC is applied, the formula to calculate the number of CBs per TB may be adjusted. For example, the $C_2$ size may be modified in equation (1) by taking into account the CBG-level CRC. Consider the example that a CBG is composed of X CBs. $C_2$ in equation (1) may be adjusted to $$C_2 + \left\lceil \frac{CRC_{CBG}}{X} \right\rceil,$$

where $CRC_{CBG}$ is the CBG level CRC size. Similar operations may be applied in determining the CB segmentation sizes. For example, in the embodiment described above with respect to FIG. 7, equation (2) may be modified to $B \cdot K^+ \geq A + C_1 + B \cdot C_2 + X \cdot CRC_{CBG}$ and equation (3) may be modified to $$C^- = \left\lfloor \frac{B \cdot K^+ - (A + C_1 + B \cdot C_2 + X \cdot CRC_{CBG})}{K^+ - K^-} \right\rfloor.$$

In embodiments, parameters determined in 420A and 420B in FIGS. 4A and 4B, respectively, may be determined at least in part based on a selected base graph (BG). Specific examples of segmentation and determining parameters based on the selected BG follow below. BG selection is described in detail below with respect to FIGS. 8-11.

For purposes of the specific examples that follow, assume two BGs are defined as follows. BG #1 may have base matrix dimensions of 46×68 with systematic puncturing of 2 columns, $K_{b1}=22$, $R_{max,1}=22/25$, $R_{min,1}=1/3$, and $K_{cb,max1}=8448$. BG #2 may have base matrix dimensions of 42×52 with systematic puncturing of 2 columns, $K_{b2}<=10$, $R_{max,2}=2/3$, $R_{min,2}=1/5$, and $K_{cb,max2}=2560$. In embodiments, the value $K_{cb,max2}=2560$ may be adjusted to 3840. Hence, in the specific examples that follow, the value of 2560 may be replaced by 3840.

In a specific example based on the example illustrated in FIG. 5, the input bit sequence to the code block segmentation may be denoted by $b_0, b_1, b_2, b_3, \ldots, b_{B-1}$, where $B>0$. If B is larger than the maximum code block size $K_{cb}$, segmentation of the input bit sequence may be performed and an additional CRC sequence of $L=L_{CB}$ bits may be attached to each CB. The maximum CB size may be: $K_cb=8448$. Alternatively, $K_cb$ may be selected as $K_{cb,max2}$ for a given code rate range. The chosen $K_{cb}$ may depend on the BG/matrix selection method. The filler bits may be set to <NULL> at the input to the encoder, and the total number of CBs C may be determined by:

```
if B ≤ K_cb
    L = 0
    Number of code blocks: C = 1
    B' = B
else
    L = L_CB
    Number of code blocks: C = ⌈B/(K_cb − L)⌉.
    B' = B + C · L
end if
```

The bits output from CB segmentation for $C \neq 0$ may denoted by $c_{r0}, c_{r1}, c_{r2}, c_{r3}, \ldots, c_{r(K_r-1)}$, where $0 \leq r < C$ is the code block number and $K_r$ is the number of bits for the CB number r. The number of bits in each CB (applicable for $C \neq 0$ only) may be determined by:

```
K_+ = ⌈B'/C⌉;
For LDPC base graph 1,
    K_b = 22.
For LDPC base graph 2,
    If B > 640
        K_b = 10;
    elseif B > 560
        K_b = 9;
    elseif B > 192
        K_b = 8;
```

-continued

```
    else
        K_b = 6;
    end
``` find the minimum value of Z in all sets of lifting sizes, denoted as $Z_{min}$, such that $K_b \cdot Z_{min} \geq K_4$, and denote $K'=K_b \cdot Z_{min}$;

```
For i = B to B + (C · K_+ - B')
    b_i = 0;
end
s = 0;
for r = 0 to C - 1
    K" = K_+;
    k = 0;
    while k < K" - L
        c_rk = b_s;
        k = k + 1;
        s = s + 1;
    end while
    if C > 1
```

The sequence $c_{r0}, c_{r1}, c_{r2}, c_{r3}, \ldots, c_{r(K''-L-1)}$ is used to calculate the CRC parity bits $p_{r0}, p_{r1}, p_{r2}, \ldots, p_{r(L-1)}$.

```
        while k < K"
            c_rk = P_r(k+L-K");
            k = k + 1;
        end while
    end if
    while k < K'
        c_rk =< NULL >;
        k = k + 1;
    end while
end for
```

In a specific example based on the example illustrated in FIG. 6, the input bit sequence to the code block segmentation may be denoted by $b_0, b_1, b_2, b_3, \ldots, b_{B-1}$, where B>0. If B is larger than the maximum code block size $K_{cb}$, segmentation of the input bit sequence may be performed and an additional CRC sequence of $L=L_{CB}$ bits may be attached to each CB. The maximum CB size may be: $K_{cb}$=8448. Alternatively, $K_{cb}$ may be selected as $K_{cb,max2}$ for a given code rate range. The chosen $K_{cb}$ may depend on the BG/matrix selection method. The filler bits may be set to <NULL> at the input to the encoder, and the total number of CBs C may be determined by:

```
if B ≤ K_cb
    L = 0
    Number of code blocks: C = 1
    B' = B
else
    L = L_CB
    Number of code blocks: C = ⌈B/(K_cb - L)⌉.
    B' = B + C · L
end if
```

The bits output from CB segmentation, for C≠0 may be denoted by $c_{r0}, c_{r1}, c_{r2}, c_{r3}, \ldots, c_{r(K_r-1)}$, where 0≤r<C is the code block number, and $K_r$ is the number of bits for the code block number r. The number of bits in each code block (applicable for C≠0 only) may be determined by:

```
K_+ = ⌈B'/C⌉;
For LDPC base graph 1,
    K_b = 22.
For LDPC base graph 2,
    If B > 640
        K_b = 10;
    elseif
    B > 560
        K_b = 9;
    elseif B > 192
        K_b = 8;
    Else
        K_b = 6;
    End
``` find the minimum value of z in all sets of lifting sizes, denoted as $Z_{min}$, such that $K_b \cdot Z_{min} \geq K_4$, and denote $K'=K_b \cdot Z_{min}$;

```
s = 0;
for r = 0 to C - 1
    if r < C - 1
        K" = K_+;
    else
        K" = B' - (C - 1)K_+;
    end
    k = 0;
    while k < K"-L
        c_rk = b_s;
        k = k + 1;
        s = s + 1;
    end while
    if C > 1
```

The sequence $c_{r0}, c_{r1}, c_{r2}, c_{r3}, \ldots c_{r(K''-L-1)}$ is used to calculate the CRC parity bits $p_{r0}, p_{r1}, p_{r2}, \ldots, p_{r(L-1)}$.

```
        while k < K"
            c_rk = P_r(k+L-K");
            k = k + 1;
        end while
    end if
    while k < K'
        c_rk =< NULL >;
        k = k + 1;
    end while
end for
```

As mentioned above, parameter determination 420A/420B may depend on BG selection. For BG selection, multiple base protograph matrices may be defined to cover a different range of block sizes and/or code rates. The range of block sizes and/or code rates may partially overlap. For a given length of CB segment ($N_{seg}$), there may be two or more lifting sizes that correspond with two or more available protograph matrices. In embodiments, protograph matrix selection may be based on one or more parameters, including, for example, code word length, extra puncture bit size, padding bit size and/or shortening bit size.

A code word length $N_{l_m}^m$ may correspond to a protograph matrix m (m∈{1, ..., M}) with a corresponding lifting size $l_m$ ($l_m$∈{1, ..., $L_m$}), where M is the number of supported protograph matrices and $L_m$ is the number of lifting sizes corresponding to the $m^{th}$ protograph matrix. Extra puncture bit size may refer to the bits needed to be punctured due to rate matching. An extra puncture bit size $N\_Pun_{l_m}^m$ may correspond to a protograph matrix m (m∈{1, ..., M}) with a corresponding lifting size $l_m$ ($l_m$∈{1, ..., $L_m$}), where M is the number of supported protograph matrices and $L_m$ is the number of lifting sizes corresponding to the $m^{th}$ protograph matrix. A padding bit size $N\_Pad_{l_m}^m$ may correspond to a protograph matrix m (m∈{1, . . . , M}) with a corresponding lifting size $l_m$ ($l_m$∈{1, . . . , $L_m$}), where M is the number of supported protograph matrices and $L_m$ is the number of lifting sizes corresponding to the $m^{th}$ protograph matrix. A shortening bit size $N\_Shortening_{l_m}^m$ may correspond to a protograph matrix m (m∈{1, . . . , M}) with a corresponding lifting size $l_m$ ($l_m$∈{1, . . . , $L_m$}), where M is the number of supported protograph matrices and $L_m$ is the number of lifting sizes corresponding to the $m^{th}$ protograph matrix.

Certain rules may be defined for protograph matrix selection. The rules may be combined or independently used to select a protograph matrix.

One protograph matrix selection rule may include comparing the code word length from the M protograph matrices to find the protograph matrix m that satisfies m=argmin ($|N_{l_m}^m - N_{seg}|$). In this way, a protograph matrix that provides the closest effective code word length to the supported segment length may be selected. Alternatively, the selection criteria may be modified to use the smallest $N_{l_m}^m$, which is larger than $N_{seg}$. In this way, shortening for rate matching may be limited. Alternatively, the selection criteria may be modified to use the largest $N_{l_m}^m$ that is smaller than $N_{seg}$. In this way, extra puncturing for rate matching may be limited.

Another protograph matrix selection rule may include comparing the extra puncture bit sizes from the M protograph matrices to find the protograph matrix m that satisfies m=argmin($N\_pun_{l_m}^m$). In this way, a protograph matrix that requires the least extra puncturing may be selected.

Another protograph matrix selection rule may include comparing the padding bit sizes from the M protograph matrices to find the protograph matrix m that satisfies m=argmin($N\_pad_{l_m}^m$). In this way, a protograph matrix that requires the least padding bits may be selected.

Yet another protograph matrix selection rule may include comparing the shortening bit size from the M protograph matrices to find the protograph matrix m that satisfies m=argmin($N\_shortening_{l_m}^m$). In this way, a protograph matrix that requires the least shortening bits may be selected.

In an embodiment, a single base protograph matrix may be used for all block lengths. Such embodiment is simpler to implement. However, it may lose some performance at a certain range. Accordingly, in other embodiments, multiple base matrices may be applied based, for example, on WTRU capabilities or WTRU category. Specifically, a single overall base protograph matrix may be adopted by all the WTRUs, which may simplify the design of the WTRU since a single protograph matrix may be stored at the WTRU. For a more advanced WTRU, such as one with high capabilities or WTRU categories that correspond to supporting higher data rates, a second or even third protograph matrix may be adopted. This may further improve channel coding performance at a certain region. In such embodiments, the WTRU may send WTRU capability information to the base station (e.g., eNB) via an RRC message in the initial RRC connection setup procedure.

In embodiments, a WTRU's capability for supporting multiple protograph matrices may be implied by WTRU category. For example, for WTRU categories 1, 2, 3, 4, only a single protograph matrix may be used; for WTRU categories 5, 6, 7, 8, two protograph matrices may be used; and for other WTRU categories, three protograph matrices may be used. The WTRU's capability to support multiple protograph matrices may also be explicitly included in the WTRU capability information.

Where a TB may be segmented into segments having sizes that may not be identical, additional base protograph matrix selection criteria may be applied. For example, it may be preferable that a single base protograph matrix is selected for all CBs in a TB. As an example, a detailed protograph matrix selection procedure is described below. In this example, two base protograph matrices are defined. Protograph matrix 1 may have a base matrix size $J^1 \times L^1$, a lifting size$[Z_1^1 \ldots V_{max1}^1]$, and minimum supported coding rate $R^1$. Protograph matrix 2 may have a base matrix size $J^2 \times L^2$, a lifting size $[Z_1^2 \ldots Z_{max2}^2]$, and a minimum supported coding rate $R^2$. While two base protograph matrices are defined for this example, the example may be easily extended to the case where more than two protograph matrices are available for use.

In this example, it may be assumed that matrix 1 has a larger base matrix and supports longer codewords with a higher coding rate. In other words, in this example, $K_{max}^1 > K_{max}^2$ and $R^1 > R^2$, where $K_{max}^1 = (L^1 - J^1) \cdot Z_{max1}^1$, and $K_{max}^2 = (L^2 - J^2) \cdot Z_{max2}^2$ is the maximum information block size for each protograph matrix, respectively. For a given TB with size A, targeted coding rate R, and TB level CRC size $C_1$, the following procedures for base protograph matrix selection and TB segmentation may be may be used.

A first procedure is a code rate based procedure. In this procedure, if the targeted coding rate $R > R^1$, protograph matrix 1 with $K_{max}^1$ may be selected. The segmentation procedure may be the same as described above, but equation (1) may be modified as $$B = \left\lceil \frac{A + C_1}{K_{max}^1 - C_2} \right\rceil.$$

If the targeted coding rate $R < R^1$, protograph matrix 2 with $K_{max}^2$ may be selected. The segmentation procedure may be the same as described above, but equation (1) may be modified as $$B = \left\lceil \frac{A + C_1}{K_{max}^1 - C_2} \right\rceil.$$

A second procedure is a code rate first procedure. If the targeted coding rate $R \geq R^1$, $K_{max}^1$ may be used for segmentation. The segmentation procedure may be the same as described above, but equation (1) may be modified as $$B = \left\lceil \frac{A + C_1}{K_{max}^1 - C_2} \right\rceil.$$

After segmentation, segments may be produced that have, at most, two different segmentation sizes $S_1$ and $S_2$, where S=max (S1, S2). K may be set as the smallest K in the set K that is larger than or equal to S. In this example, K may be defined as the union of supported information block size by both protograph matrices. Selection of the protograph matrix may depend on K in this case. Specifically, if the selected K corresponds to a protograph matrix, then this protograph matrix may be selected.

If two shift sizes are allowed, $K^+$ may be set as K above, and set $K^-$ may be set as the smallest K in the set K that is larger than or equal to min(S1, S2). If the targeted coding rate $R < R^1$, protograph matrix 2 with $K_{max}^2$ may be selected. The segmentation procedure may be the same as described above, but equation (1) may be modified as $$B = \left\lceil \frac{A + C_1}{K_{max}^2 - C_2} \right\rceil.$$

A third procedure is a code length based procedure. In this procedure, $K_{max}^1$ may be used for segmentation. The segmentation procedure may be the same as described above, but equation (1) may be modified as $$B = \left\lceil \frac{A + C_1}{K_{max}^1 - C_2} \right\rceil.$$

Using this procedure, after segmentation, segments having, at most, two different segment sizes, $S_1$ and $S_2$, may be provided, where S=max(S1, S2). K may be set as the smallest K in the set K that is larger than or equal to S. In this procedure, K may be defined as the union of supported information block sizes by both protograph matrices. Selection of the protograph matrix may depend on K in this case. If the selected protograph matrix does not support the target rate, an additional repetition or puncturing scheme may be applied. If two shift sizes are allowed, then $K^+$ may be set as the K above, and $K^-$ may be set as the smallest K in the set K that is larger than or equal to min(S1, S2).

Figure 8:
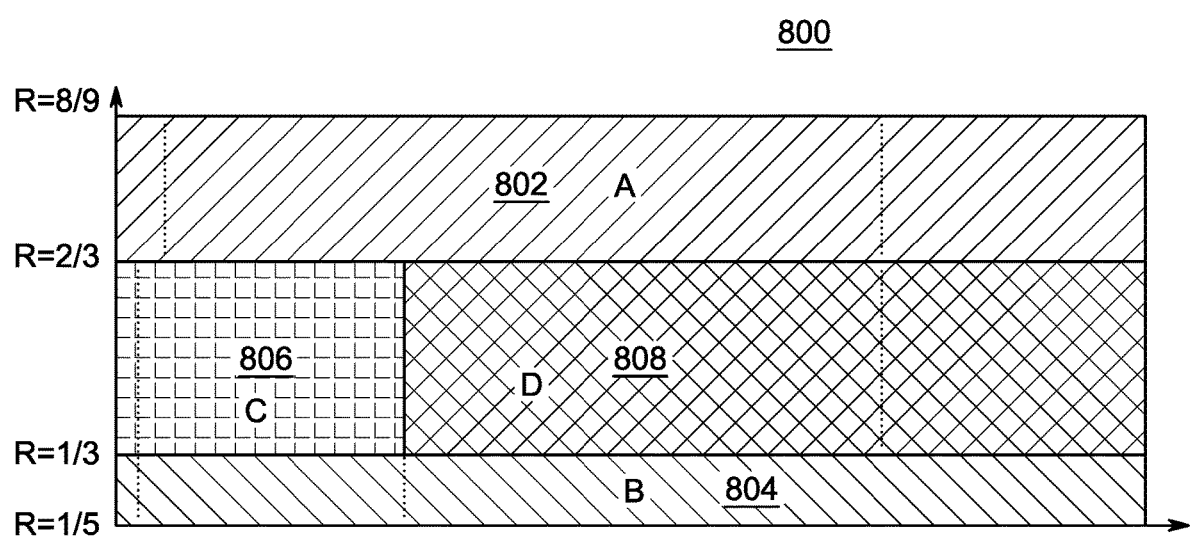
FIG. 8 is a diagram of four coverage regions defined in terms of code rate (CR) and information bit size that may or may not be supported by a base graph 1 and a base graph 2.

FIG. 8 is a diagram 800 of four coverage regions defined in terms of code rate and information bit size that may or may not be supported by base graph 1 (BG #1) and base graph 2 (BG #2), as defined above. In the example illustrated in FIG. 8, four regions are defined: region A (802) having a code rate R>⅔, region B (804) having a code rate R<⅓, region C (806) having a code rate 1/3≤R≤⅔ and a TBS≤2560, and region D (808) having a code rate 1/3≤R≤⅔ and a TBS>2560. While specific code rate values and TBS thresholds are defined in FIG. 8, the CR threshold and/or TBS threshold may be replaced with other values consistent with the embodiments described herein. For example, the value of 2560 may be replaced with the value 3840 depending on $K_{cb,max2}$, the value ⅓ may be replaced by the value ¼, and so on. Further, the TBS value described herein may, in embodiments, include the TB level CRC.

Since the decision as to which BG is used will affect the CB segmentation process, given the coverage regions illustrated in FIG. 8 and described herein, BG selection may depend on code rate and TBS. Alternatively, BG selection may depend on code rate and CBS.

BG #1, as described above, is designed to support region A (802), while BG #2, as described above, does not support region A (802). If BG #2 is to be used in region A (802), extra puncturing schemes will need to be provided. Performance-wise, a well-defined base matrix that supports the coding rate would generally be better than puncturing from a lower rate base matrix. Accordingly, BG #1 would be best used for region A (802). If the TB with TB level CRC bits attached is larger than $K_{cb}$=8448, segmentation will be needed. Accordingly, where the coding rate is greater than ⅔, BG #1 may be selected.

BG #2, as described above, is designed to support the range of coding rates in region B (804) while BG #1 does not support such coding rates. If BG #1 is to be used in region B (804), extra matrix extension or repetition schemes will need to be provided. Performance-wise, a well-defined base matrix that supports the coding rate would generally be better than repetition of a higher rate base matrix. Accordingly, BG #2 would be best used for region B (804). If the TB with TB level CRC bits attached is larger than $K_{cb}$=2560, segmentation will be needed. Accordingly, where the coding rate is less than ⅓, BG #2 may be selected.

In embodiments, a smaller rate threshold, such as ¼, may be used to define the upper limit of region B (804). This may be due to a performance comparison between BG #1 and BG #2 after considering both segmentation loss and block error ratio (BLER) performance.

Both BG #1 and BG #2 have coverage in Region C (806), and no segmentation would be needed. For Region C (806), two BG selection procedures may be considered. In a first procedure, BG #2 may always be selected for Region C (806) because BG #2 is designed for short block sizes and lower coding rates. In a second procedure, a BG with smaller filler bits may be chosen and, thus, BG #1 may be selected in some instances. For the second procedure, Region C (806) supports all information bit lengths from BG #1 and BG #2, and the BF having the closest information bit length that is just bigger than the given TBS may be selected.

A simulation is described below focusing on the cases where the first procedure and the second procedure have different BG selection preferences. In detail, the simulation evaluates the performance of BG #1 and BG #2 in the cases that BG #1 has less filler bits than BG #2. Thus, with the first procedure, BG #1 may be selected, and with the second procedure, BG #2 may be selected.

In the simulation, an additive white Gaussian noise (AWGN) channel and quadrature phase shift keying (QPSK) modulation are assumed, and it is assumed that the TBS includes the TB level CRC bits. Two coding rates, ⅓ and ⅔, are evaluated, which correspond to the smallest and largest coding rates directly supported by BG #2. For each coding rate, three different TBS=[86, 390, 1936] have been chosen. The number of filler bits required is shown in Table 1 below. In all of the simulated TBSs, BG #1 has less filler bits than BG #2.

TABLE 1

| | TB size | | |
|---|---|---|---|
| | 86 | 390 | 1936 |
| BG#1 | 2 | 6 | 0 |
| BG#2 | 4 | 26 | 144 |

When filler bits are used, the number of generated coded bits depends on the size of the filler bits and is greater than TBS/rate. To make the comparison fair, the AWGN noise level needs to be adjusted according to the coded bit size such that the signal to noise ratios per information bit are the same for BG #1 and BG #2.

Figure 9:
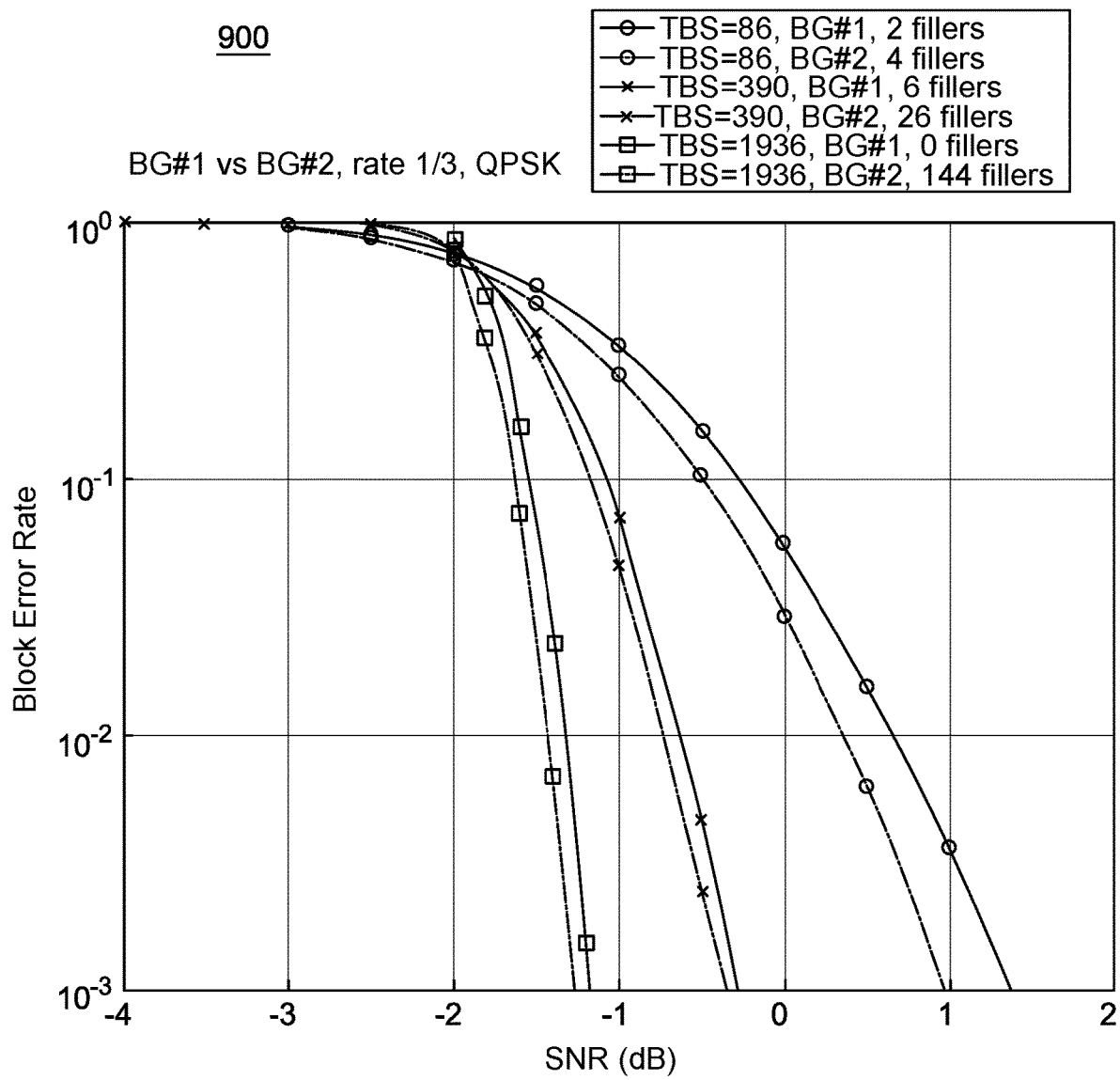
FIG. 9 is a graph providing a performance comparison between base graph 1 and base graph 2 with CR ⅓ where base graph 1 has less filler bits than base graph 2.
Figure 10:
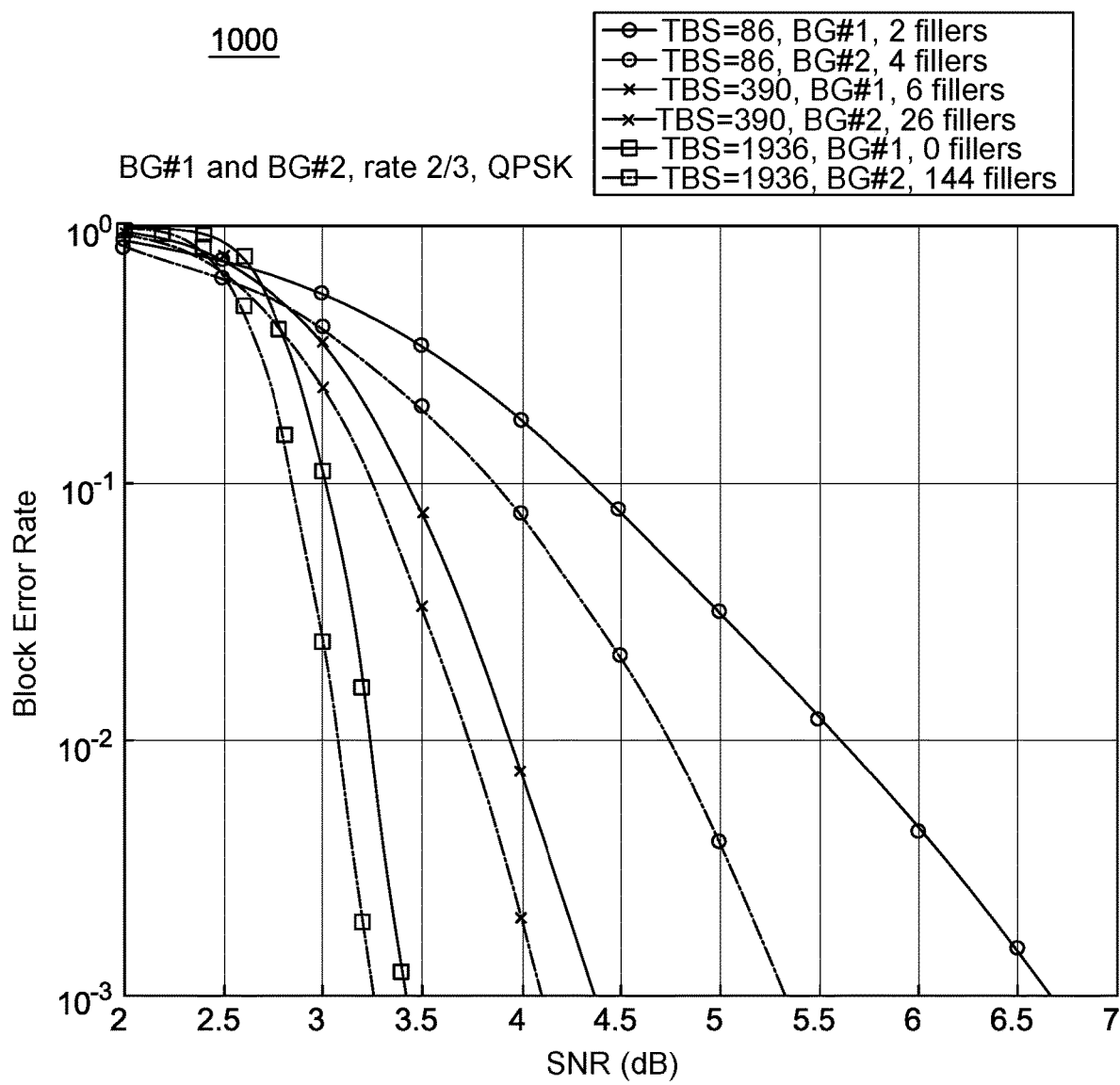
FIG. 10 is a graph providing a performance comparison between base graph 1 and base graph 2 with CR ⅔ where base graph 1 has less filler bits than base graph 2.

FIG. 9 is a graph 900 providing a performance comparison between BG #1 and BG #2 with rate 1/3 where BG #1 has less filler bits. FIG. 10 is a graph 1000 providing a performance comparison between BG #1 and BG #2 with rate 2/3 where BG #1 has less filler bits than BG #2. As shown in FIGS. 9 and 10, the BLER performances of BG #2 are consistently better than the BLER performances of BG #1, even where BG #1 has less filler bits. Accordingly, for ⅓≤R≤⅔ and TBS≤2560, BG #2 has better performance than BG #1 even if more filler bits are requested for BG #2. Accordingly, in embodiments, for ⅓≤R≤⅔ and TBS≤2560, BG #2 may be selected. Further, in embodiments, the rate threshold used in the BG selection may be a different value, such as replacing ⅓≤R≤⅔ with ¼≤R≤⅔, for example. In embodiments, a larger TBS threshold, such as 3840, may be used.

Both BG #1 and BG #2 support the coding rates of region D (808). If the TB block length is within the range of (2560, 8448), BG #1 may support them directly if a lifting value Z is chosen and some filler bits are used. BG #2 cannot directly support the coding rates. However, it can support the coding rates if segmentation is performed using $K_{cb}$=2560.

In general, LDPC codes perform better when a longer codeword is used. This is especially true in the fading channel where a longer codeword can provide better diversity gain to compensate bursty errors.

A simulation for region D (808) is described below. In the simulation, an AWGN channel and QPSK modulation are assumed, TBS=5120 is chosen, and it is assumed that the TBS includes TB level CRC bits.

Figure 11:
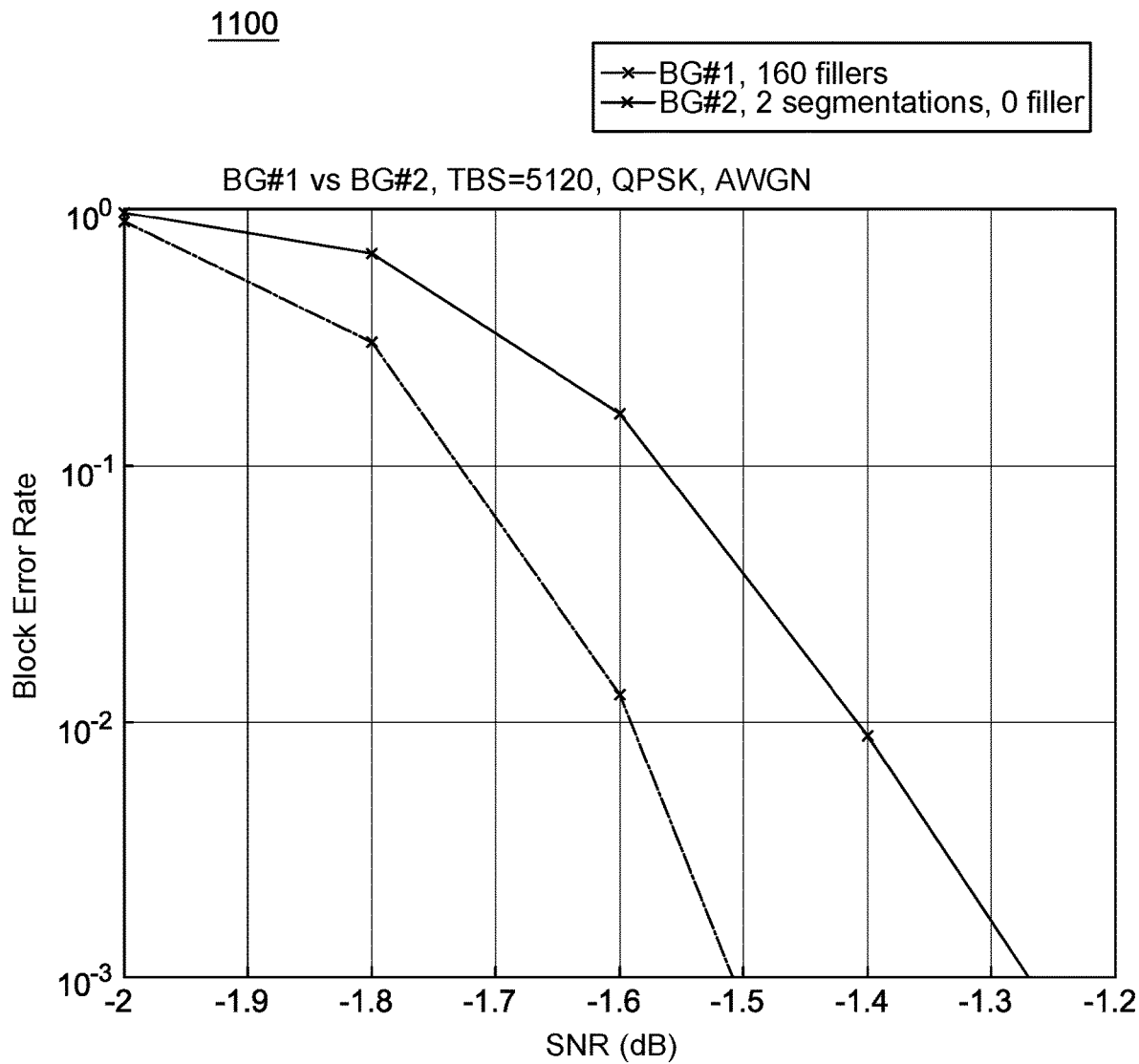
FIG. 11 is a graph providing a performance comparison between base graph 1 and base graph 2 with CR ⅓, base graph 1 being selected with 160 filler bits, and base graph 2 being selected with two segmentations and zero filler bits.

FIG. 11 is a graph 1100 providing a performance comparison between BG #1 and BG #2 with code rate 1/3. When BG #1 is used, 160 filler bits are utilized. When BG #2 is used, the TB is segmented to two CBs, where each CB has K=2560 with zero filler bits. BG #1 outperforms BG #2 by around 0.2 dB at BLER=1%. In this simulation, the extra CRC bits for the second CB when BG #2 is selected and segmentation is performed are not considered. If extra CRC bits are considered, the performance of BG #2 will be worse. Accordingly, for $1/3 \leq R \leq 2/3$ and TB>2560, BG #1 has better performance than BG #2. Thus, for $1/3 \leq R \leq 2/3$ and TB>2560, BG #1 may be chosen in some embodiments. In embodiments, the rate threshold used may be substituted for another value. For example, $1/4 \leq R \leq 2/3$ may be used instead of $1/3 \leq R \leq 2/3$. In embodiments, a larger TBS threshold, such as 3840, may be used.

In the embodiments described above with respect to FIG. 8, threshold rates of 1/3 and 2/3 are used. However, they may be modified to other rates depending on the definitions used for BG #1 and BG #2. Further, TBS thresholds of 2560 and 8448 are used in the embodiments described above with respect to FIG. 8. However, they may be modified to other lengths depending on the BG #1 and BG #2 definitions.

In an example BG selection procedure, BG #1 may be defined as having base matrix dimensions of 46×68, systematic puncturing of 2 columns, $K_{b1}$=22, and $R_{max,1}$=22/25, $R_{b1}$=1/3, and $K_{cb,max1}$=8448. BG #2 may be defined as having base matrix dimensions of 42×52, systematic puncturing of 2 columns, $K_{b2} \leq$10, $R_{max,2}$=2/3, $R_{min,2}$=1/5, and $K_{cb,max2}$=2560.

The input bit sequence to the code block segmentation is denoted by $b_0, b_1, b_2, b_3, \ldots, b_{B-1}$, where B>0. If B is larger than the maximum code block size $K_{cb}$, segmentation of the input bit sequence may be performed and an additional CRC sequence of $L=L_{CB}$ bits may be attached to each code block. The maximum code block size and BG selection procedure may depend on desired coding rate R and TB size B:

```
If R <1/3
    K_cb= 2560;
    BG#2 is selected
Else If rate >2/3
    K_cb = 8448;
    BG#1 is selected
Else
    If B >2560
        K_cb=8448 or 2560;
        BG#1 is selected
    Else
        No segmentation is needed
        BG#2 is selected
        (Alternative method, selecting a base
        graph with smaller number of filler bits).
    end
end
```

In the specific example described above, 1/3 and 2/3 are used as two rate thresholds. However, they may be modified to other rates depending on the BG #1 and BG #2 definitions. Similarly, 2560 and 8448 are used as two length thresholds in the specific example described above. However, they may also be modified to other lengths depending on the BG #1 and BG #2 definitions.

For CRC attachment, TB level CRC may have C1 bits and TB level CRC may have C2 bits. A CB group (CBG) level CRC may be inserted with C3 bits. C1, C2 and C3 may be predefined or predetermined. Alternatively, C1, C2 and C3 may be selected from a predefined or predetermined set S, which may include several integer numbers. For example, S={0, 4, 8, 16, 24}. The CRC size selection may depend on one, or a combination, of data QoS type (e.g., eMBB, URLLC, etc.), WTRU capability, and/or level of CRC (e.g., C1, C2 or C3). Regarding data QoS, as an example, for URLLC, longer CRC codes may be selected. Regarding WTRU capability, some WTRUs may support one CRC value or a subset of S values. The CRC value used may be chosen from the CRC value set the WTRU supports.

Rate matching (470A/470B) for LDPC coded transport channels may be defined per coded block and may include puncturing or repetitioning, interleaving coded bit streams, and bit collection and storage in circular buffers. Embodiments using double, multiple and singular circular buffers for rate matching are described below.

In an embodiment, a double circular buffer may be used to obtain more reliable HARQ re-transmission with LDPC codes. When a double circular buffer is used, each transmission, including re-transmissions, may carry some information bits.

Figure 12:
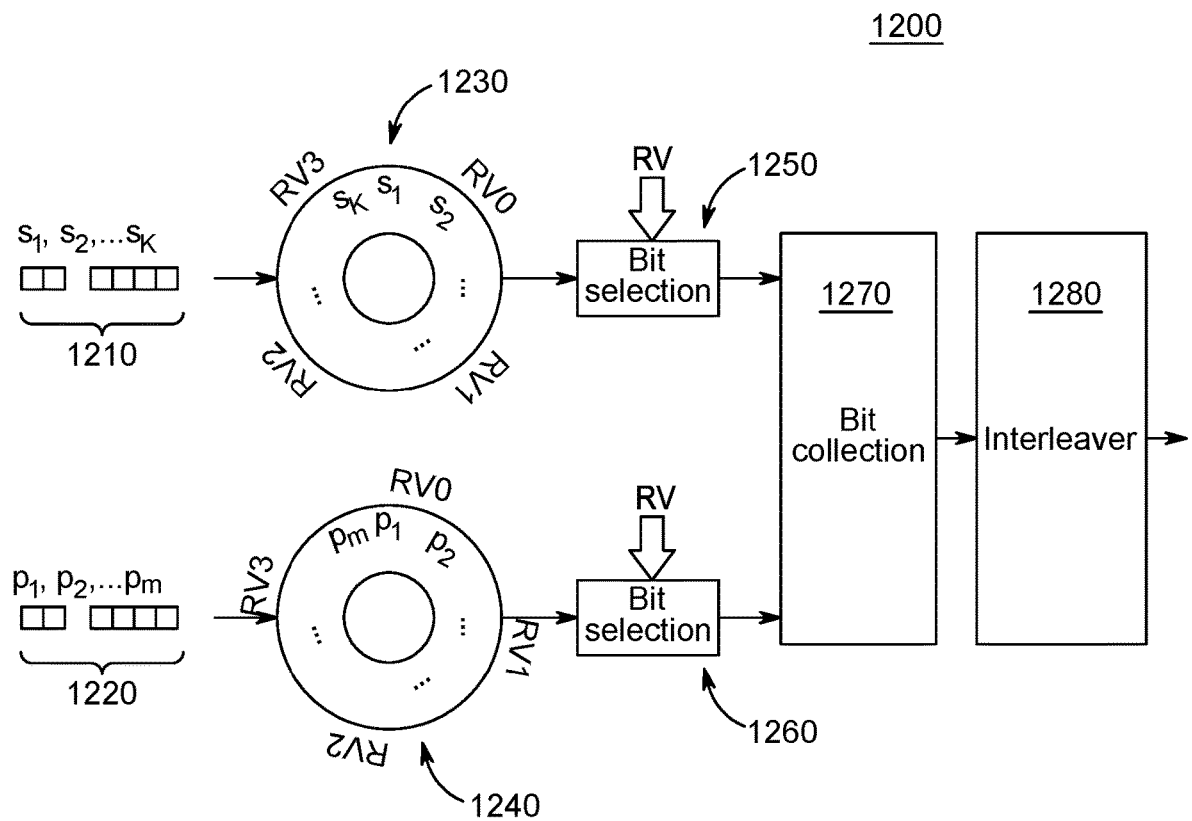
FIG. 12 is a diagram of an example double circular buffer for rate matching and hybrid automatic repeat request (HARQ)

FIG. 12 is a diagram 1200 of an example double circular buffer for rate matching and HARQ. In the example illustrated in FIG. 12, after LDPC encoding during which information bits are encoded with the mother LDPC code or the LDPC code with the lowest data rate, a set of information bits $\{s_1, s_2, \ldots, s_K\}$ 1210 and a set of parity check bits $\{p_1, p_2, \ldots, p_M\}$ 1220 may be obtained. Here, K is the length of the information bits 1210 and M is the length of the parity bits 1220. LDPC encoding procedures may allow puncturing of information bits. In such a scenario, the punctured information bits may be included in the information bit set.

In embodiments, the encoded information bit set 1210 and the parity check bit set 1220 may optionally be passed to a sub-block interleaver (not shown). In an embodiment, the sub-block interleaver may depend on the RV value. For different RV values, or different re-transmissions, the interleaver may be different. A set of interleavers may be defined for a set of RV values. The interleaver used may be predetermined or predefined.

The information bits 1210 may be inserted to a circular buffer 1230 (e.g., an information circular buffer), and the parity check bits 1220 may be inserted into a different circular buffer 1240 (e.g., parity circular buffer). Bit selection 1250 and 1260 may be used to extract consecutive bits from each respective buffer 1230 and 1240 to match the number of available resource elements (e.g., A bit in total). A number of different methods may be used to extract the A bits. Example methods are described below.

For RV=0 (the first transmission), K−nZ consecutive information bits may be extracted from the information circular buffer 1230. For example, bit $\{s_{NZ+1}, \ldots, s_K\}$ may be extracted. In this example, Z is the lifting size and nZ are the number of punctured bits from the information bit set 1210. A−(K−nZ) consecutive parity bits may be extracted from the parity circular buffer 1240. For example, bit $\{p_1, \ldots, P_{Z-K+nZ}\}$ may be extracted. For RV>0 (re-transmissions), a subset of information bits from the information circular buffer 1230 may be selected. The size of the subset may be predetermined or predefined. For example, a fixed ratio $R_{ip}$ may be predefined, predetermined or signaled. The ratio $R_{ip}$ may be a ratio of information bits to parity check bits carried in the re-transmission, and round($R_{ip}$*A) may be the size of information bits selected. Here, round is a function to obtain the closest integer number. Alternatively, ceil( ) or floor( ) may be used instead of round( ). Here, ceil(x) is a function to obtain the smallest integer that is bigger than x, and floor(x) is a function to obtain the biggest integer that is smaller than x. The subset may start from a location that may be determined based on RV number, the size of the subset, $R_{ip}$, and/or A. The transmission for different RVs may or may not have overlapped bits.

A subset of parity check bits from the parity circular buffer 1240 may be selected. The size of the subset may be predetermined or predefined. For example, if $R_{ip}$ is used, then A−round($R_{ip}$*A) bits may be selected. The subset may start from a location that may be determined based on RV number, the size of the subset, $R_{ip}$, and/or A. For example, the subset may start right after the selected subset from last transmission.

An optional additional interleaver (not shown) may be included after bit selection 1250/1260. In embodiments, the interleaver may depend on RV value. For different RV values, or different re-transmissions, the interleaver may be different. A set of interleavers may be defined for a set of RV values. The interleaver used may be predetermined or predefined.

If an additional interleaver is included, it may provide extra diversity for HARQ re-transmission. For example, the interleaver may be designed to re-order the bit to constellation symbol mapping. For example, when 64 QAM is utilized, [b0, b1, b2, b3, b4, b5] may be mapped to one 64 QAM constellation point in RV0. Then, interleaved version (e.g., [b1, b0, b3, b2, b5, b4] or [b5, b4, b3, b2, b1, b0]) may be mapped to a symbol in RV1 and so on.

Selected information bits and parity check bits may be passed on for bit collection 1270 where a bit stream may be formed. For example, the bit stream may include information bits followed by parity check bits. An interleaver 1280 may be applied to the bit stream provided as a result of bit collection 1270. In embodiments, the use of the double circular buffer may be signaled, e.g., by a device, such as a WTRU.

In embodiments, a multiple circular buffer based HARQ scheme may be used. Each of the multiple buffers may correspond to a subset of the coded bits. The buffers may or may not have overlapped bits. The partition of coded bits to buffers may depend on the importance of the bits to the decoder. For example, in a system with 3 buffers, buffer 1 may carry the most important bits, while buffer 2 may carry a subset of bits that may be less important than that in buffer 1 but more important than the bits carried in the rest of the buffers. Buffer 3 may carry the least important bits.

A set of ratios may be defined for each RV value. The set of ratios may determine the number of bits to be selected from the corresponding buffer in the corresponding RV version. For example, for RV value equal to k, the set of ratios may be $[R_{k,1}s, R_{k,2}, \ldots, R_{k,B}]$, where B is the number of buffers utilized. The following restriction may be applied:

$$R_{k,1}+R_{k,2}+ \ldots +R_{k,B}=1$$

and $$0 \leq R_{k,b} \leq 1, b=1, \ldots, B.$$

In order to select and form a codeword with length A for RV k, $A \cdot R_{k,1}$ bits may be selected from buffer 1; $A \cdot R_{k,2}$ bits may be selected from buffer 2, and so on. If $A \cdot R_{k,b}$ is not an integer number, the closest integer may be selected. Alternatively, the greatest integer that is smaller than $A \cdot R_{k,b}$ may be used, or the smallest integer that is greater than $A \cdot R_{k,b}$ may be used. For the last buffer, $A - \Sigma_{b=1}^{B-1} R_{k,b}$ bits may be selected.

The ratio sets may be predefined in the standards. For example, with a given number of buffers, the ratio sets for each RV value may be specified. Alternatively, the ratio sets may be predetermined by the eNB or transmitter. In this way, the ratio sets may be signaled explicitly.

A set of starting positions may be defined for each RV value. The set of starting positions may determine the position in the corresponding buffer from which the $A \cdot R_{k,b}$ bits may be selected in the corresponding RV. For example, for RV value equal to k, the set of starting positions may be $[SP_{k,1}, SP_{k,2}, \ldots, SP_{k,B}]$, where B is the number of buffers utilized. The following restriction may be applied:

$$1 \leq SP_{k,b} \leq Buffer\_Size_b, b=1, \ldots, B, Buffer\_Size_b \text{ is the } b^{th} \text{ buffer size.}$$

Figure 13:
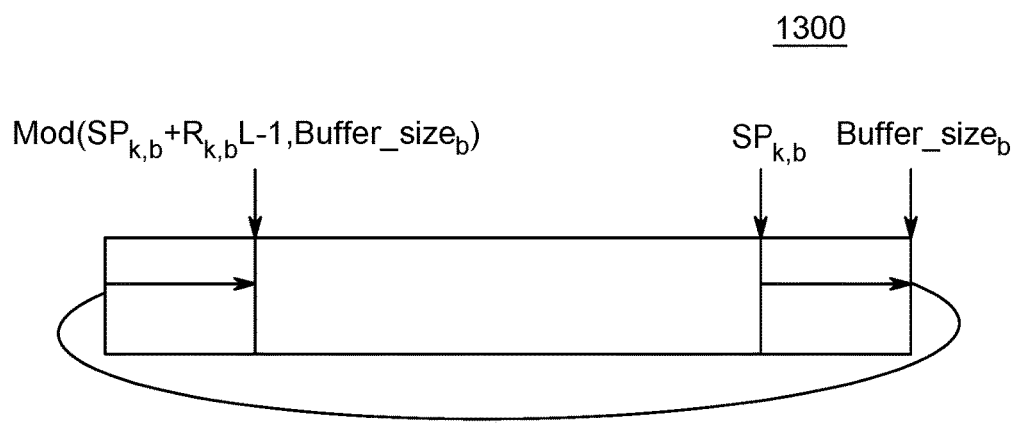
FIG. 13 is a diagram of an example method of bit selection using multiple circular buffers.

FIG. 13 is a diagram 1300 of an example method of bit selection using multiple circular buffers. In the example illustrated in FIG. 13, in order to select bits and form a codeword with length A for RV k, $A \cdot R_{k,b}$ bits may be circularly selected from position $SP_{k,B}$ to position mod($SP_{k,b}+A \cdot R_{k,b}-1$, Buffer_Sizeb) in buffer b.

The starting position sets may be predefined in the specifications. For example, with a given number of buffers, the starting position sets for each RV value may be specified. Alternatively, the starting position sets may be predetermined by the base station (e.g., eNB) or transmitter. In this way, the starting position sets may be signaled explicitly. Since starting position may be a value restricted by the buffer size, a normalized starting position may be used. For example, the normalized starting position may be defined as $$\frac{SP_{k,b}}{Buffer\_Size_b}.$$

The number of buffers (e.g., B in the example provided above) may be predefined and/or predetermined and signaled explicitly. The buffer size (e.g., $Buffer\_Size_b$) may be predefined and/or predetermined and signaled explicitly.

Figure 14:
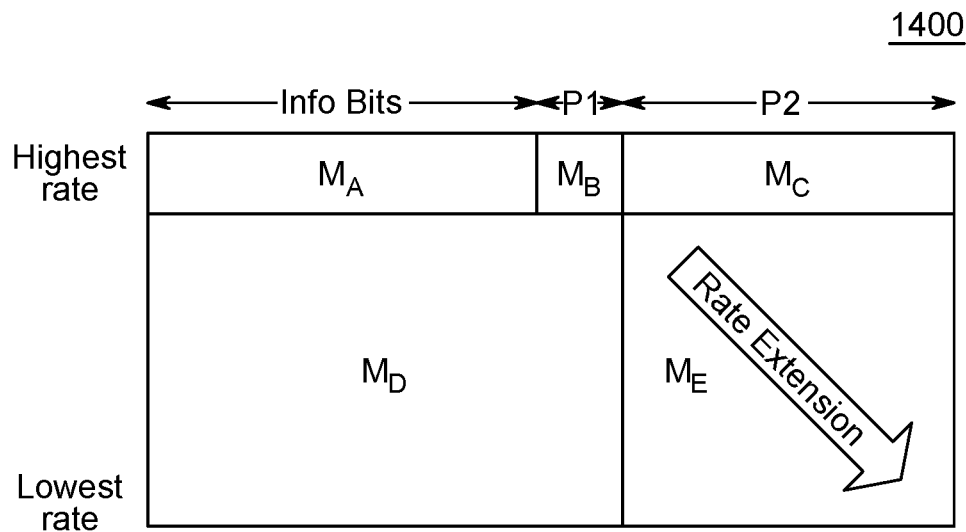
FIG. 14 is diagram of a structured LDPC base graph for supporting LDPC codes in a rate range (lowest rate, highest rate) for use with multiple circular buffers.

FIG. 14 is diagram 1400 of a structured LDPC base graph for supporting LDPC codes in a rate range (lowest rate, highest rate) for use with multiple circular buffers. In embodiments, an LDPC codeword may be generated using a structured LDPC base graph with the format illustrated in FIG. 14. In the example illustrated in FIG. 14, the highest rate LDPC codes may correspond to a subset of the graph including $[M_A, M_B]$, while information bits may correspond to submatrix $M_A$, and $P_1$ parity bits may correspond to submatrix $M_B$. In order to get lower rate codes, matrix extension may be used and extra $P_2$ parity check bits may be generated. With these structured LDPC codes, the codeword corresponding to the lowest data rate may have three parts: information bits, $P_1$ parity bits, and $P_2$ parity bits, which may have different priority for the decoder. Thus, three buffers may be defined to carry them.

In embodiments, the following information and/or parameters may be signaled: capability of multiple circular buffer rate matching, number of buffers B and their corresponding sizes Buffer_Size$_b$, RV number k, the corresponding ratio set $[R_{k,1}, R_{k,2}, \ldots, R_{k,B}]$, the corresponding position set $[SP_{k,1}, SP_{k,2}, \ldots, SP_{k,B}]$, codeword size A, and whether the additional interleaver is used.

In embodiments, a singular circular buffer may be used. In such embodiments, the bit sequence provided as a result of the channel coding may be sent to the single circular buffer. The buffer size may depend on the size of the base graph and lifting size.

Figure 15:
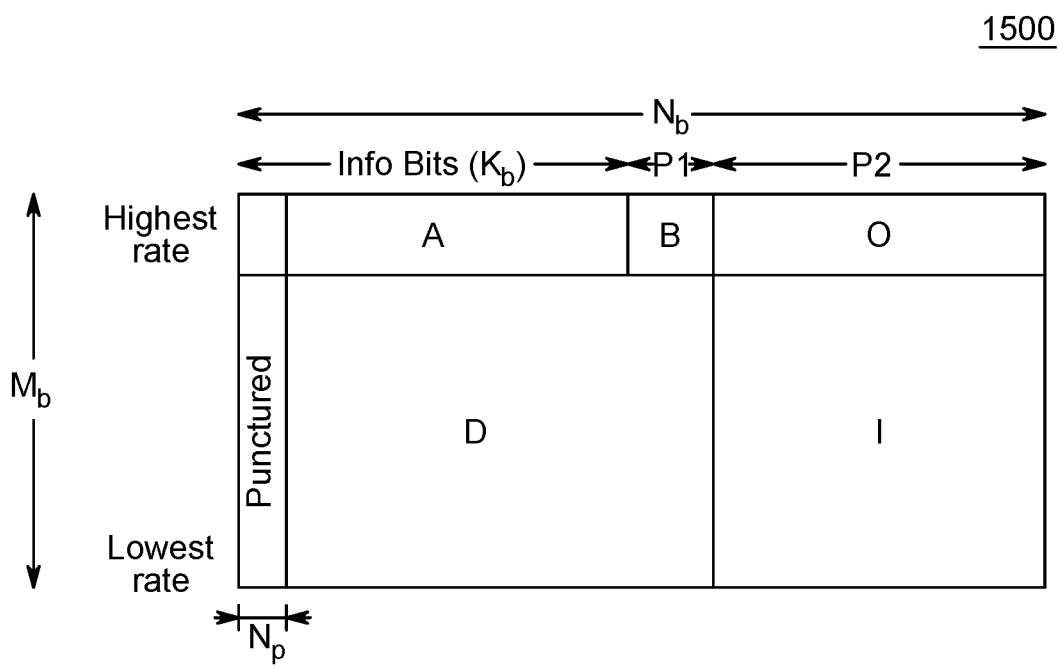
FIG. 15 is a diagram of an example base graph for use with a single circular buffer.

FIG. 15 is a diagram 1500 of an example base graph for use with a single circular buffer. In the example illustrated in FIG. 15, the base graph has a size $M_b \times N_b$, and the lifting size is Z. The buffer size $N_{buffer}$ may be $N_b \cdot Z$ if all of the punctured bits are included in the buffer. In other embodiments, if the $N_p \cdot Z$ punctured bits are not included in the buffer, the buffer size may be $N_b \cdot Z - N_p \cdot Z$, where $N_p$ is the number of punctured columns in the base graph. For example, if the first two columns of the base graph are punctured, then $N_p=2$. In one example, the base graph may have size of 46×68, and the first 2 columns may be punctured. If punctured bits are not considered in the buffer, then the buffer size may be 66 Z.

On a condition that the information bit size is not directly supported by the specified lifting values, zero padding or filler bits may be inserted to make the number of information bits an integer number of a selected lifting size Z. The filler bits may enter the circular buffer.

In embodiments, the filler bits may be removed before transmission. In such embodiments, the following assumptions may be made. K may be the number of information bits. K' may be the smallest supported information bit size supported by the selected base graph that is bigger than K. Here, K' is an integer number of the lifting size Z. F=K'−K may be the total number of filler bits. F' may be the number of actually used filler bits. F' may not be always the same as F due to the RV version and coding rate. For example, the lowest supported data rate determined by the base graph size may be ⅓. However, the base graph may be used to support a lower data rate transmission, such as rate 1/5. In an embodiment, the codeword generated by rate 1/3 may be inserted to a circular buffer, and K/(coding rate) number of bits may be obtained from the circular buffer and transmitted. In this way, the part of the bits in the circular buffer may be repeated, which may include the filler bits. R may be the desired coding rate. The circular buffer size may be N-buffer. Coded bits in the circular buffer may be $[c_0, c_1, \ldots, c_{N_{buffer}-1}]$.

A detailed rate matching procedure using the single circular buffer may include calculating the codeword size with filler bits: N'=K'/R. Given an RV starting point S, the end point index E=mod(S+N'−1, $N_{buffer}$) may be calculated. The selected bits may be obtained from starting point S to ending point E. The actual number of filler bits F' may be counted. Normally, F' may be zero or an integer number. The number F' filler bits may be removed.

In an embodiment, the filler bits may not be removed before transmission. In this case, the filler bits may be used to signal control information. For example, all '0' filler bits may be used to signal control information A while all '1' filler bits may be used to signal control information B. In an embodiment, fixed starting locations for each RV may be pre-selected with a total number of supported RVs $N_{maxRV}$ and buffer size $N_{buffer}$.

Figure 16:
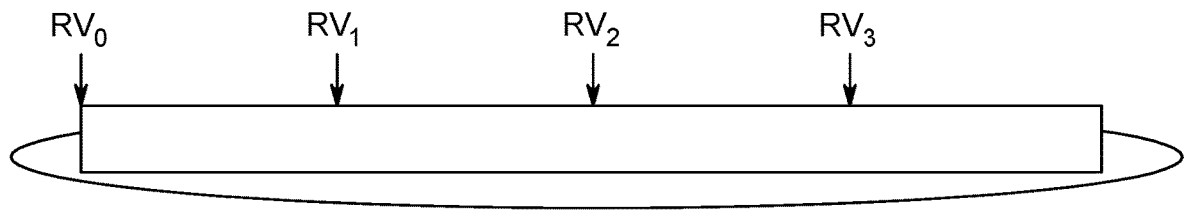
FIG. 16 is a diagram showing example fixed starting locations with four redundancy versions (RVs) ($N_{maxRV}=4$) for a scheme where corresponding RV starting points are evenly distributed over the buffer, a scheme where the RV starting points are evenly distributed over the parity bits, and a scheme where the RV starting points are evenly distributed over P2 parity bits.
Figure 16:
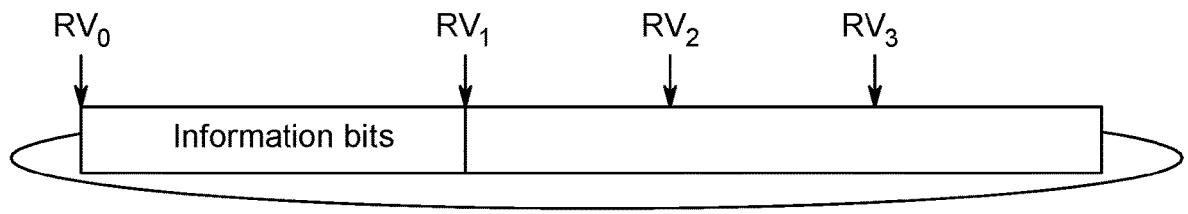
Figure 16:
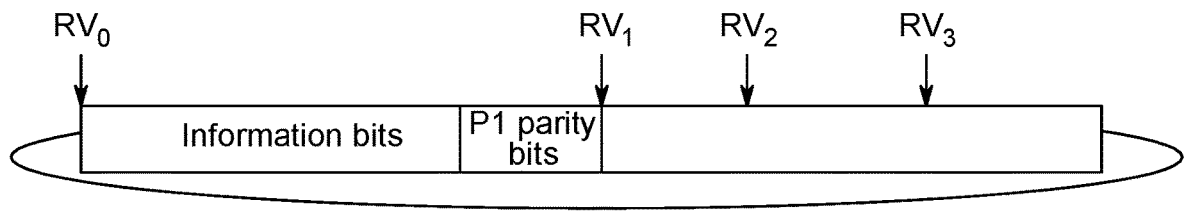

FIG. 16 is a diagram 1600 showing example fixed starting locations with four RVs ($N_{maxRV}$=4) for a scheme where RV starting points are evenly distributed over the buffer (a), a scheme where the RV starting points are evenly distributed over the parity bits (b), and a scheme where the RV starting points are evenly distributed over P2 parity bits.

For the scheme where the RVs are evenly distributed over the buffer (a), the fixed RV starting location may be selected such that the locations $\{S_0, S_1, \ldots, S_{N_{maxRV}-1}\}$ are evenly distributed over the buffer such that $$S_k = \left\lfloor \frac{N_{buffer}}{N_{maxRV}} \right\rfloor * k,$$

where k=0, 1, ..., $N_{maxRV}$−1 is the RV index. If the first $N_pZ$ punctured bits may be included in the buffer, the equation may be modified to $$S_k = \left\lfloor \frac{N_{buffer}}{N_{maxRV}} \right\rfloor * k + N_pZ \text{ or}$$

$$S_k = \left\lfloor \frac{N_{buffer} - N_pZ}{N_{maxRV}} \right\rfloor * k + N_pZ.$$

Alternatively, the locations may be calculated based on the base graph and then converted to the indices in the buffer. For example:

$$S_k = \left\lfloor \frac{N_b}{N_{maxRV}} \right\rfloor * k * Z \text{ or}$$

$$S_k = \left\lfloor \frac{N_b}{N_{maxRV}} \right\rfloor * k * Z + N_pZ \text{ or}$$

$$S_k = \left\lfloor \frac{N_b - N_p}{N_{maxRV}} \right\rfloor * k * Z + N_pZ.$$

For example, for the base graph dimension of 46×68 where the first 2 columns may be punctured, the buffer size is 66Z. If the punctured systematic bits do not enter the circular buffer, then the starting positions $[S_0, S_1, S_2, S_3]$=[0, 16Z, 32Z, 48Z].

In the examples described above, and in examples that follow, the operation floor( ) is used. However, in embodiments, it may be replaced by operation ceil( ) or round( ). Where floor(x) gives the largest integer that is smaller than or equal to x, ceil(x) gives the smallest integer that is larger than or equal to x, and round(x) gives the integer that is closest to x. By applying the ceiling or round operations instead of the floor operation, the starting positions $[S_0, S_1, S_2, S_3]$=[0, 17Z, 33Z, 50Z]. Another possible selection may be $[S_0, S_1, S_2, S_3]$=[0, 16Z, 33Z, 49Z], which is based on the formula $$S_k = \left\lfloor \frac{k \cdot N_{buffer}}{N_{maxRV}} \right\rfloor = \left\lfloor \frac{k \cdot N_b}{N_{maxRV}} \right\rfloor * Z.$$

For the base graph dimension of 42×52 where the first 2 columns may be punctured, the buffer size is 50Z. If the punctured systematic bits do not enter the circular buffer, then the starting positions $[S_0, S_1, S_2, S_3]=[0, 12Z, 24Z, 36Z]$, by using the floor operations, or the starting positions $[S_0, S_1, S_2, S_3]=[0, 13Z, 25Z, 38Z]$, by using the ceiling or round operations. Another possible selection could be $[S_0, S_1, S_2, S_3]=[0, 12Z, 25Z, 37Z]$.

In embodiments, the evenly distributed RV starting points described above may be combined with the design of a self-decodable RV other than RV0. For example, the starting point of RV3 may be moved forward toward the end of the buffer so that it is self-decodable. This may result in $[S_0, S_1, S_2, S_3]=[0, 17Z, 33Z, 56Z]$ and $[S_0, S_1, S_2, S_3]=[0, 13Z, 25Z, 43Z]$ for BG2.

For the scheme where the RVs are evenly distributed over the parity bits (b), the fixed RV starting location may be selected such that the first location is selected from the beginning of the codeword except the punctured location, and the rest of the locations may be evenly distributed over the parity bits. If the punctured systematic bits are not saved in the circular buffer, $$S_k = \begin{cases} 0 & k=0 \\ K_b Z + \left\lfloor \frac{N_{buffer} - K_b Z}{N_{maxRV} - 1} \right\rfloor *(k-1) & k>0 \end{cases},$$

where $k=0, 1, \ldots, N_{maxRV}-1$ is the RV index and $K_b=N_b-M_b$, and $K_b Z$ is the information bit length. If the first $N_p Z$ punctured bits may be included in the buffer, the equation may be modified to:

$$S_k = \begin{cases} N_p Z & k=0 \\ K_b Z + \left\lfloor \frac{N_{buffer} - K_b Z}{N_{maxRV} - 1} \right\rfloor *(k-1) + N_p Z & k>0 \end{cases} \text{ or }$$

$$S_k = \begin{cases} N_p Z & k=0 \\ K_b Z + \left\lfloor \frac{N_{buffer} - K_b Z - N_p Z}{N_{maxRV} - 1} \right\rfloor *(k-1) + N_p Z & k>0 \end{cases}.$$

Alternatively, the locations may be calculated based on the base graph and then converted to the indices in the buffer. For example:

$$S_k = \begin{cases} 0 & k=0 \\ K_b Z + \left\lfloor \frac{N_b - K_b}{N_{maxRV} - 1} \right\rfloor *(k-1)Z & k>0 \end{cases} \text{ or }$$

$$S_k = \begin{cases} N_p Z & k=0 \\ K_b Z + \left\lfloor \frac{N_b - K_b}{N_{maxRV} - 1} \right\rfloor *(k-1)Z + N_p Z & k>0 \end{cases} \text{ or }$$

$$S_k = \begin{cases} N_p Z & k=0 \\ K_b Z + \left\lfloor \frac{N_b - K_b - N_p}{N_{maxRV} - 1} \right\rfloor *(k-1)Z + N_p Z & k>0 \end{cases}.$$

In a variation of the scheme where RVs are evenly distributed over the parity bits, the fixed RV starting locations may be selected such that they are separated by $K_b$. The fixed RV starting location may be selected such that the locations $\{S_0, S_1, \ldots, S_{N_{maxRv}-1}\}$ are evenly distributed over the buffer and separated by Kb such that $S_k=\mathrm{mod}(K_b Z*k, N_{buffer})$, where $k=0, 1, \ldots, N_{maxRV}-1$ is the RV index and $K_b=N_b-M_b$ and $K_b Z$ is the information bit length. If the first $N_p$ punctured bits may be included in the buffer, the equation may be modified to $S_k=\mathrm{mod}(K_b Z*k, N_{buffer}) + N_p Z$ or $S_k=\mathrm{mod}(K_b Z*k, N_{buffer} - N_p Z) + N_p Z$.

In another variation of the scheme where RVs are evenly distributed over the parity bits, the fixed RV starting location may be selected such that the locations $RV\{S_0, S_1, \ldots, S_{N_{maxRv}-1}\}$ may be evenly distributed over the buffer and separated by $K_b - N_p$ such that $S_k=\mathrm{mod}((K_b-N_p)Z*k, N_{buffer})$, where $k=0, 1, \ldots, N_{maxRV}-1$ is the RV index, $K_b=N_b-M_b$ and $K_b Z$ is the information bit length, and $N_p$ corresponds to the punctured blocks. If the first $N_p$ punctured bits may be included in the buffer, the equation may be modified to $S_k=\mathrm{mod}(K_b-N_p)Z*k, N_{buffer}) + N_p Z$ or $S_k=\mathrm{mod}(K_b-N_p)Z*k, N_{buffer} - N_p Z) + N_p Z$.

For the scheme where the RVs are evenly distributed over P2 parity bits (c), the fixed RV starting location may be selected such that the first location is selected from the beginning of the codeword except the punctured location, and the rest of the locations may be evenly distributed over the second part of the parity bits (i.e., the $P_2$ parity bits as shown in FIG. 16). The example RV starting location $RV_0$ is shown in FIG. 16, and $$S_k = \begin{cases} 0 & k=0 \\ (K_b + P_1)Z + \left\lfloor \frac{N_{buffer} - K_b Z - P_1 Z}{N_{maxRV} - 1} \right\rfloor *(k-1) & k>0 \end{cases},$$

where $k=0, 1, \ldots, N_{maxRv}-1$ is the RV index and $K_b=N_b-M_b$, and $K_b Z$ is the information bit length. If the first $N_p$ punctured bits may be included in the buffer, the equation may be modified to:

$$S_k = \begin{cases} N_p Z & k=0 \\ (K_b + P_1)Z + \left\lfloor \frac{N_{buffer} - K_b Z - P_1 Z}{N_{maxRV} - 1} \right\rfloor *(k-1) + N_p Z & k>0 \end{cases} \text{ or }$$

$$S_k = \begin{cases} N_p Z & k=0 \\ (K_b + P_1)Z + \left\lfloor \frac{N_{buffer} - K_b Z - P_1 Z - N_p Z}{N_{maxRV} - 1} \right\rfloor *(k-1) + N_p Z & k>0 \end{cases}.$$

Alternatively, the locations may be calculated based on the base graph and then converted to the indices in the buffer. For example:

$$S_k = \begin{cases} 0 & k=0 \\ (K_b + P_1)Z + \left\lfloor \frac{N_b - K_b - P_1}{N_{maxRV} - 1} \right\rfloor *(k-1)Z & k>0 \end{cases} \text{ or }$$

$$S_k = \begin{cases} N_p Z & k=0 \\ (K_b + P_1)Z + \left\lfloor \frac{N_b - K_b - P_1}{N_{maxRV} - 1} \right\rfloor *(k-1)Z + N_p Z & k>0 \end{cases} \text{ or }$$

$$S_k = \begin{cases} N_p Z & k=0 \\ (K_b + P_1)Z + \left\lfloor \frac{N_b - K_b - P_1 - N_p}{N_{maxRV} - 1} \right\rfloor *(k-1)Z + N_p Z & k>0 \end{cases}.$$

In a variation of the scheme where the RVs are evenly distributed over the P2 parity bits, the fixed RV starting locations may be selected such that they are separated by $K_b + P_1$. The fixed RV starting location may be selected such that the locations $\{S_0, S_1, \ldots, S_{N_{maxRv}-1}\}$ may be evenly distributed over the buffer and separated by Kb such that $S_k = \text{mod}((K_b+P_1)Z^*k, N_{buffer})$, where $k=0, 1, \ldots, N_{maxRV}-1$ is the RV index and $K_b = N_b - M_b$, and $K_bZ$ is the information bit length. If the first $N_p$ punctured bits may be included in the buffer, the equation may be modified to $S_k = \text{mod }(K_b+P_1)Z^*k, N_{buffer})+N_pZ$ or $S_k = \text{mod}(K_b+P_1)Z^*k, N_{buffer}-N_pZ)+N_pZ$.

In another variation of the scheme where the RVs are evenly distributed over the P2 parity bits, the fixed RV starting locations may be selected such that they are separated by $K_b+P_1-N_p$. The fixed RV starting location may be selected such that the locations $\{S_0, S_1, \ldots, S_{N_{maxRv}-1}\}$ may be evenly distributed over the buffer and separated by Kb such that $S_k = \text{mod}((K_b+P_1-N_p)Z^*k, N_{buffer})$, where $k=0, 1, \ldots, N_{maxRV}-1$ is the RV index. $K_b = N_b - M_b$ and $K_bZ$ is the information bit length. If the first $N_p$ punctured bits may be included in the buffer, the equation may be modified to $S_k = \text{mod}(K_b+P_1-N_p)Z^*k, N_{buffer})+N_pZ$ or $S_k = \text{mod }((K_b+P_1-N_p)Z^*k, N_{buffer}-N_pZ)+N_pZ$.

Once the circular buffer is formed, the bits in the buffer may be $[b_0, b_1, \ldots, b_{N_{buffer}-1}]$. For each transmission, the transmitter may be able to select one of the RV indices to transmit. For example, for the m-th transmission, the transmitter may select $RV_k$. If the expected codeword length is N, then the transmitted bits may be $[b_{S_k}, \ldots, b_{S_k+N-1}]$.

Different re-transmission versions may have different performance. The performance may also depend on the code rate or codeword length. A smaller number of overlapped bits in each transmission may introduce better performance. If $N_{maxRV}=4$, then a natural order of RV is $[RV_0, RV_1, RV_2, RV_3]$. An unnatural RV order may, however, be used to achieve better HARQ performance. For example, in embodiments, the following RV order may be used: $[RV_0, RV_2, RV_3, RV_1]$. If the self-decodable RV starting positions are considered, then the following RV order may also be applied: $[RV_0, RV_2, RV_1, RV_3]$.

While LDPC codes defined for the system may have multiple protograph matrices that may correspond to multiple parity check matrices, the multiple protograph matrices may be defined based on the information block length. For example, if information block length is greater than a threshold (i.e., X, LDPC protograph matrix 1 may be used); otherwise, LDPC protograph matrix 2 may be used. In some embodiments, segmentation may introduce uneven bit distribution. When segmentation is performed, it may be possible that one or more segmentations may fall in the range of protograph matrix 1 while the other segmentation(s) may fall in the range of protograph matrix 2.

For example, the transmit block may have Y information bits, which is larger than the maximum supported information bits. Thus, segmentation may be performed. Due to some uneven separation, one segment has Y1 bits and the other has Y2 bits. It is possible that that Y1>X and Y2<X, which may trigger 2 LDPC codes.

Embodiments are described that may resolve this issue, for example, by pre-padding the smaller segment or segments such that the size of the padded segments is larger than the threshold X and, thus, the same LDPC protograph matrix may be used. In another embodiment, the number of segments may be increased by 1 such that the length of each segment may belong to the region less than the threshold X.

As mentioned above, in embodiments, bit interleaving may be performed after rate matching and right before modulation. In one embodiment, a block interleaver may be used. To determine the size of the block interleaver, one or more of the following parameters may be considered: lifting sizes Z, modulation order or number of bits in a modulated symbol, number of data streams supported, and allocated RB sizes or smallest supported RB size.

Figure 17:
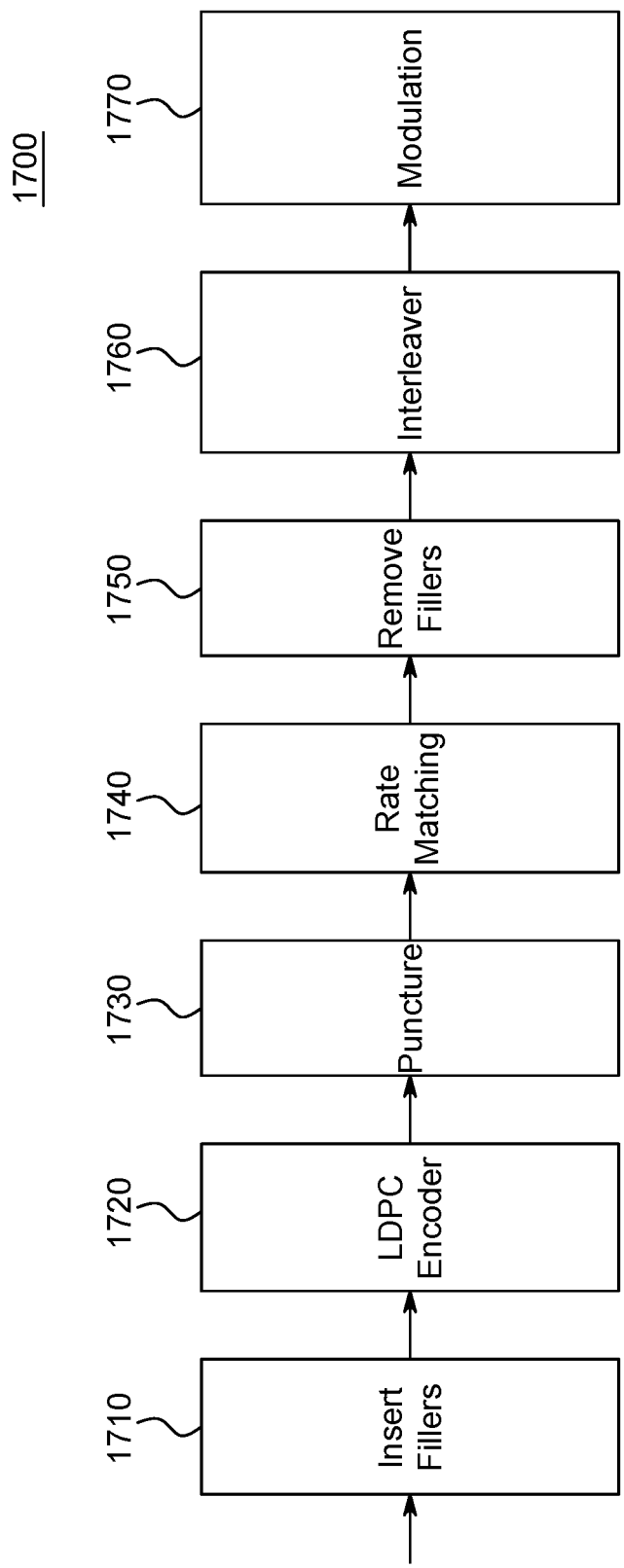
FIG. 17 is a flow diagram of an example LDPC encoding procedure with interleaving.

FIG. 17 is a flow diagram 1700 of an example LDPC encoding procedure with interleaving. As described above, given a TBS and code rate, LDPC base graph selection and segmentation may be performed. LDPC coding operations may then be performed. In the example illustrated in FIG. 17, the transmitter may then insert filler bits (1710), perform LDPC encoding (1720), puncture the first 2Z information bits (1730), pass the output to a circular buffer (1740), perform rate matching (1740), remove fillers (1750), perform interleaving (1760) and perform modulation (1770).

To perform rate matching (1740), the number of bits $N_{cb}$ to be transmitted may be calculated. $N_{cb}$ may be a function of modulation order, number of filler bits, and resource block allocation. For example, $N_{rb}$ RBs may be allocated to the transmission, where each RB may carry $N_{symPerRB}$ modulated symbols, and the modulation order may be M. It may be assumed that the number of filler bits is $N_{filler}$. In this scenario, $N_{cb} = N_{rb} \cdot N_{symPerRB} \cdot \log_2 M + N_{filler}$, and Ncb bits may be read out of the circular buffer.

To perform interleaving (1760), a block interleaver may be used where the number of rows may be determined by modulation order. For example, for 64QAM, the modulation order M=64, and the number of rows in the block interleaver may be set to $m=\log 2(M)=6$. The block interleaver may be row-wise write and column-wise read.

Several modulation mapping orders may be defined, including natural order, reverse order and circular shifted order. For natural order, each column of bits read from the block interleaver may be sent directly to the modulation mapper. For reverse order, each column of bits read from the block interleaver may be reversed and then sent to the modulation mapper. For example, for 64QAM modulation, the natural order of a column of bits out of the block interleaver may be [m0, m1, m2, m3, m4, m5]. The reverse order may be [m5, m4, m3, m2, m1, m0], and the input to the modulator may be in the reverse order. For circular shifted order, each column of bits read from the block interleaver may be circular shifted by $S_{shift}$ bits. For example, for 64QAM modulation, the natural order of a column of bits out of the block interleaver may be [m0, m1, m2, m3, m4, m5]. The circular shifted order with $S_{shift}=2$ may be [m2, m3, m4, m5, m0, m1], and the input to the modulator may be in the circular shifted order. The circular shifted order with $S_{shift}=4$ may be [m4, m5, m0, m1, m2, m3], and input to the modulator may be in the circular shifted order.

In embodiments, a Modulation Mapping Order Index (MMOI) may be assigned to each unique modulation mapping order discussed above. For example, as shown in Table 2 below, MMOI=0 may indicate the natural order. MMOI=1 may indicate the reverse order. MMOI=2 may indicate the circular shifted order with $S_{shift}=\text{mod}(2,\log 2(M))$. MMOI=3 may indicate the circular shifted order with $S_{shift}=\text{mod}(4,\log 2(M))$. MMOI=4 may indicate the circular shifted order with $S_{shift}=\text{mod}(6,\log 2(M))$. MMOI=5 may indicate the circular shifted order with $S_{shift}=\text{mod}(8,\log 2(M))$. The above mentioned modulation orders are provided as examples. However, a system may adopt the same set of modulation orders, a larger set of modulation orders, or a subset of modulation orders. Depending on transmission scenario, an MMOI may be determined, signaled and/or implied.

In an embodiment of MMOI determination or pre-configuration, the same MMOI may be applied for the entire CB. MMOIs 0 and 1 (corresponding to Natural order and Reverse order) may be used. In embodiments, the MMOI may be determined by RV and/or new data indicator (NDI). In other embodiments, the MMOI may be preconfigured. For example, for RV0 with a new data transmission (i.e., NDI is toggled), MMOI=0. For RV0 with re-transmission (i.e., NDI is not toggled), MMOI=1. For RV1, MMOI=1. For RV2, MMOI=0. For RV3, MMOI=1.

In another embodiment, the same MMOI may be applied for the entire CB. MMOI 0, 1 and 2/3/4/5 (corresponding to Natural order, Reverse order and Circular shifted orders) may be used. In embodiments, the MMOI may be determined by RV and/or NDI. In other embodiments, the MMOI may be preconfigured. For example, for RV0 with new data transmission (i.e., NDI is toggled), MMOI=0. For RV0 with re-transmission (i.e., NDI is not toggled), MMOI=1. For RV1, MMOI=2 (i.e., Sshift=mod(2, log 2(M))). For RV2, MMOI=4 (i.e., Sshift=mod(6, log 2(M))). For RV3, MMOI=3 (i.e., Sshift=mod(4, log 2(M))).

Figure 18A:
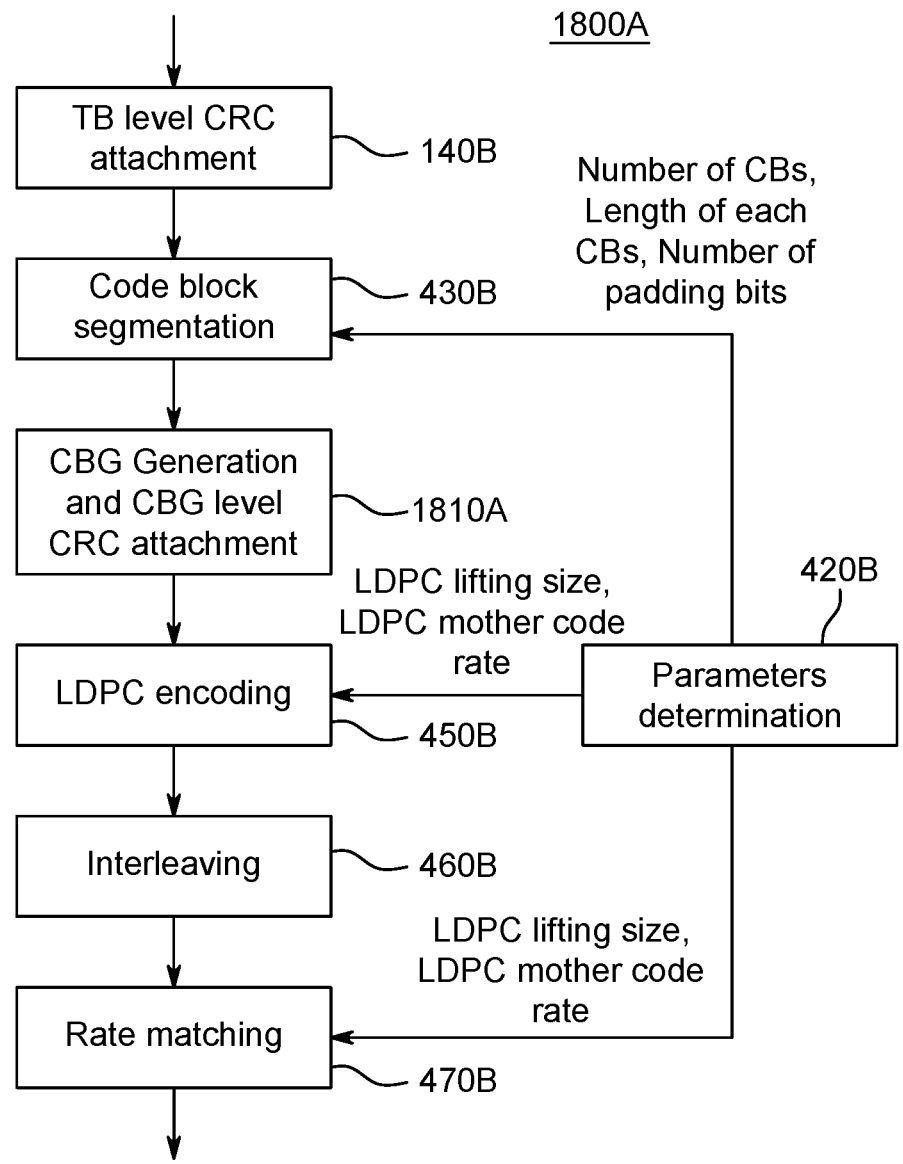
FIG. 18A is a flow diagram of an example method of TB processing for a data channel using CQ-LDPC codes with code block group (CBG) level CRC.
Figure 18B:
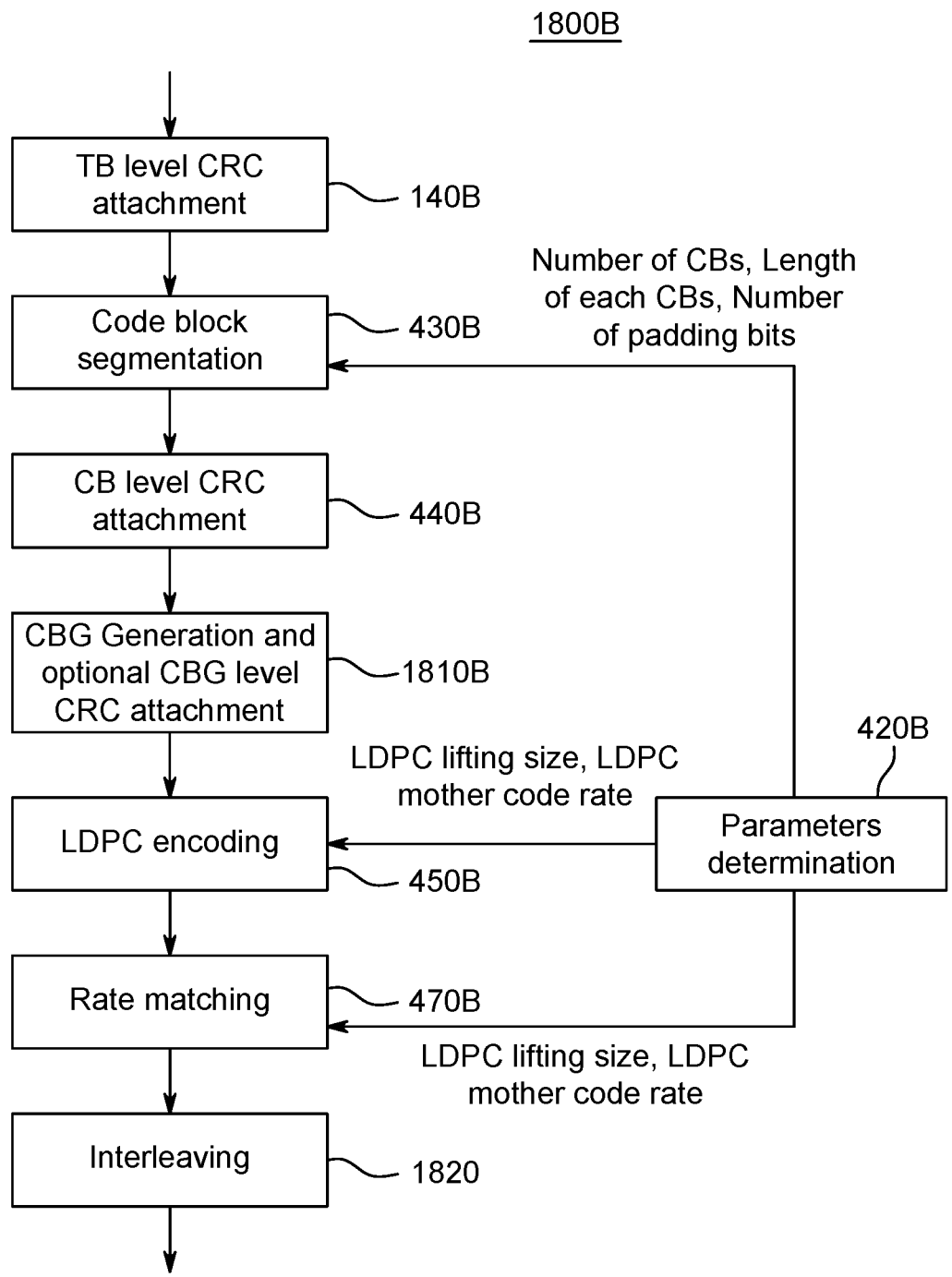
FIG. 18B is a flow diagram of another example method of TB processing for a data channel using QC-LDPC codes with CBG level CRC.

FIG. 18B is a flow diagram 1800B of another example method of TB processing for a data channel using QC-LDPC codes with CBG level CRC. In the example illustrated in FIG. 18B, the CBG operations described above with respect to FIG. 18A are combined with the CB operations described above with respect to FIG. 4B. Blocks that are the same between FIGS. 4B, 18A and 18B have the same labels. In the example illustrated in FIG. 18B, the method includes interleaving 1820 after the rate matching (470B) instead of the interleaving 460B before the rate matching.

CBGs may be generated using a number of different methods. In one embodiment of CBG generation, the number of CBs in each CBG may be configured. B may be a value representing the total number of segmented CBs in a single TB. This value may be determined during parameters determination (420B) and may be used during code block segmentation (430B). Let $S_1, \ldots, S_B$ be the sizes of the segmented CBs. L may be the total number of CBGs in a TB,

TABLE 2

|  | MMO1 = 0 (natural) | MMOI = 1 (reverse) | MMOI = 2 (circular) | MMOI = 3 (circular) | MMOI = 4 (circular) |
|---|---|---|---|---|---|
| 16QAM | 0, 1, 2, 3 | 3, 2, 1, 0 | 2, 3, 0, 1 | 0, 1, 2, 3 | 2, 3, 0, 1 |
| 64QAM | 0, 1, 2, 3, 4, 5 | 5, 4, 3, 2, 1, 0 | 2, 3, 4, 5, 0, 1 | 4, 5, 0, 1, 2, 3 | 0, 1, 2, 3, 4, 5 |
| 256QAM | 0, 1, 2, 3, 4, 5, 6, 7 | 7, 6, 5, 4, 3, 2, 1, 0 | 2, 3, 4, 5, 6, 7, 0, 1 | 4, 5, 6, 7, 0, 1, 2, 3 | 6, 7, 0, 1, 2, 3, 4, 5 |

In another embodiment, different MMOIs may be applied for one CB. For example, the CB may be partitioned into P parts, and each part may have one MMOI. In embodiments, the MMOI may be determined by RV and/or NDI. In other embodiments, the MMOI may be preconfigured. For example, there may be P=4 partitions per CB. The partition may be performed uniformly, for example, as in Table 3 below. In embodiments, the MMOI assignments provided in these examples may be modified consistent with the embodiments described herein.

TABLE 3

|  | Part 1 | Part 2 | Part 3 | Part 4 |
|---|---|---|---|---|
| RV0 | MMOI = 0 | MMOI = 2 | MMOI = 3 | MMOI = 4 |
| RV1 | MMOI = 2 | MMOI = 3 | MMOI = 4 | MMOI = 0 |
| RV2 | MMOI = 3 | MMOI = 4 | MMOI = 0 | MMOI = 2 |
| RV3 | MMOI = 1 | MMOI = 2 | MMOI = 0 | MMOI = 3 |

The internal parity check capability of an LDPC decoder may improve its false alarm performance. Hence, in embodiments, the CB level CRC may not be needed to achieve the required false alarm criteria. Instead, a group of blocks may share a common CRC to reduce overhead and, thus, increase the throughput of the data transmissions.

FIG. 18A is a flow diagram 1800A of an example method of TB processing for a data channel using CQ-LDPC codes with CBG level CRC. Flow diagram 1800A is identical to the flow diagram 400B in FIG. 4B except that CB level CRC attachment (440B) is replaced with CBG generation and CBG level CRC attachment (1810A). In embodiments, CB level CRC (440B) may be seen as a special case of CBG level CRC 1810A with group size equal to 1.

For CBG generation and CBG level CRC attachment (1810A), the CBG may be formed by concatenating several CBs and attaching CRC bits to each CBG. Several parameters may need to be determined for CBG generation and CBG level CRC attachment (1810A), including the number of CGs in a TB, the number of CBs in each CBG, and the CRC length for each CBG.

and $X_1, \ldots, X_L$ may be the number of CBs in L CBGs. L and $X_1, \ldots, X_L$ may be determined in one of a number of different ways. In the embodiments that follow, the methods may be signaled by the first embodiment of CBG-related signaling described below.

In one embodiment, the number of CBs in a CBG (e.g., $X_{max}$) may be pre-defined or pre-configured. L may be set such that $$L = \left\lceil \frac{B}{X_{max}} \right\rceil.$$

The number of CBs in the first L−1 CBGs may be equal to $X_{max}$, while the number of CBs in the last CBG may be equal to $B-(L-1)*X_{max}$. In other words:

$$X_i = X_{max}, i = 1, \ldots, L-1$$

$$X_L = B - (L-1)*X_{max}.$$

The number of CBs in the first mod(B,L) CBG may be $$\left\lceil \frac{B}{L} \right\rceil,$$

while the number of CBs in the remaining L−mod(B,L) CBGs may be $$\left\lfloor \frac{B}{L} \right\rfloor.$$

In other words:

$$X_i = \left\lceil \frac{B}{L} \right\rceil, i = 1, \ldots, \text{mod}(B, L),$$

-continued $$X_i = \left\lfloor \frac{B}{L} \right\rfloor, i = \mod(B, L)+1, \ldots, L.$$

In another embodiment, the number of bits supported in a CBG (e.g., $P_{max}$) may be pre-defined or pre-configured. $Y_1, \ldots, Y_B$ may be the number of bits in each code block of a TB. The number of CBs in the first CBG may be set as the largest value $X_1$ such that $\Sigma_{i=1}^{X_1} Y_i \leq P_{max}$; the number of CBs in the second CBG may be set as the largest value $X_2$ such that $$\sum_{i=X_1}^{X_2} Y_i \leq P_{max};$$

and so on.

In another embodiment of CBG generation, the number of CBGs in each TB may be configured. A communication system may have some restrictions on the maximum number (e.g., B') of ACK/NACK feedback bits per TB. It is clear that $L \leq \min\{B, B'\}$. In this case, the maximum numbers (i.e., B') of CBG in a TB may be pre-defined or pre-configured. If a TB has a total of B segmented CBs in a single TB, each CBG may have $$\left\lceil \frac{B}{B'} \right\rceil$$

CBs. Here, the last CBG may contain less than $$\left\lceil \frac{B}{B'} \right\rceil$$

CBs. In an alternative scheme for grouping CBs, with the given maximum number (e.g., B') of CBGs per TB, some CBGs may be set to contain $$\left\lceil \frac{B}{B'} \right\rceil$$

CBs and other CBGs may be set to contain $$\left\lfloor \frac{B}{B'} \right\rfloor$$

CBs. $B_1'$ may be the number of CBGs containing $$\left\lceil \frac{B}{B'} \right\rceil$$

CBs, and $B_2'$ may be the number of CBGs containing $$\left\lfloor \frac{B}{B'} \right\rfloor$$

CBs. The values of $B_1'$ and $B_2'$ may be determined by the following equations:

$$B_1' + B_2' = B'; \quad b). \quad B_1' \cdot \left\lceil \frac{B}{B'} \right\rceil + B_2' \cdot \left\lfloor \frac{B}{B'} \right\rfloor = B$$

(specifically, $$B_1' = B - B' \cdot \left\lfloor \frac{B}{B'} \right\rfloor \text{ and } B_2' = B' \cdot \left\lceil \frac{B}{B'} \right\rceil - B).$$

It is possible that the first $B_1'$ CBGs contain $$\left\lceil \frac{B}{B'} \right\rceil$$

CBs while the last $B_2'$ CBGs contain $$\left\lfloor \frac{B}{B'} \right\rfloor$$

CBs. It is also possible that the first $B_2'$ CBGs contain $$\left\lfloor \frac{B}{B'} \right\rfloor$$

CBs while the last $B_1'$ CBGs contain $$\left\lceil \frac{B}{B'} \right\rceil$$

CBs.

On a condition that $B \leq B'$, each CBG may only contain a single CB. Since the total number of CBGs is less than B', some additional signaling may be needed to inform the receiver. This embodiment may include signaling using the second embodiment of CBG related signaling described below.

In another embodiment, the two embodiments of CBG generation described above may be combined depending on the TB size. For a large TB size (e.g., eMBB traffic), it may be desirable to limit the ACK/NACK feedback signaling overhead. For a small to medium TB size, it may be desired to specify the number of CBs for each CBG so that proper CB sets may be formed and transmitted in a timely manner. This embodiment may be implemented by applying the following: if TB size>TB_thres, then the second CBG generation embodiment described above may be applied. Otherwise, the first CBG generation embodiment described above may be applied. TB_thres may be pre-defined or configured by RRC messaging. Based on this embodiment, either the first or second CBG generation embodiment described above may be selected to determine the number of CBGs or the number of CBs in each CBG, respectively, which may be signaled to the receiver for decoding using the corresponding methods of CBG signaling described below.

In embodiments, multiple level CBG may be used to avoid re-transmissions of entire CBs within a large CBG. For an initial transmission, a receiver may generate a single bit ACK or NACK per CBG, depending on the decoding success or failure of the CBs within the CBG. A transmitter may re-transmit all CBs of a CBG if it corresponds to a NACK. For the re-transmissions, the CBG size may be reduced, for example, to a sub-CBG size. In other words, the receiver may generate a single bit ACK or NACK per sub-CBG for the re-transmitted CBs, depending on the decoding success or failure of the CBs within sub-CBGs. The transmitter may, in a second re-transmission, send all CBs of a sub-CBG if the sub-CBG corresponds to a NACK. This may avoid re-transmission of all CBs of the CBG. The sub-CBG size may continue to reduce with the next rounds of re-transmissions.

Consider, for example, a two-level CBG, where the CBG corresponds to the initial transmissions and the sub-CBG corresponds to all rounds of re-transmissions. For the initial transmission, 1 bit ACK/NACK per CBG may be used. If feedback is ACK, then 1 bit ACK/NACK per CBG may continue to be used for the new transmission. If a 1 bit feedback NACK is used for the initial transmission, then sub-CBG level ACK/NACK may be used for the re-transmissions, and a 1 bit ACK/NACK per sub-CBG may be used.

Figure 19:
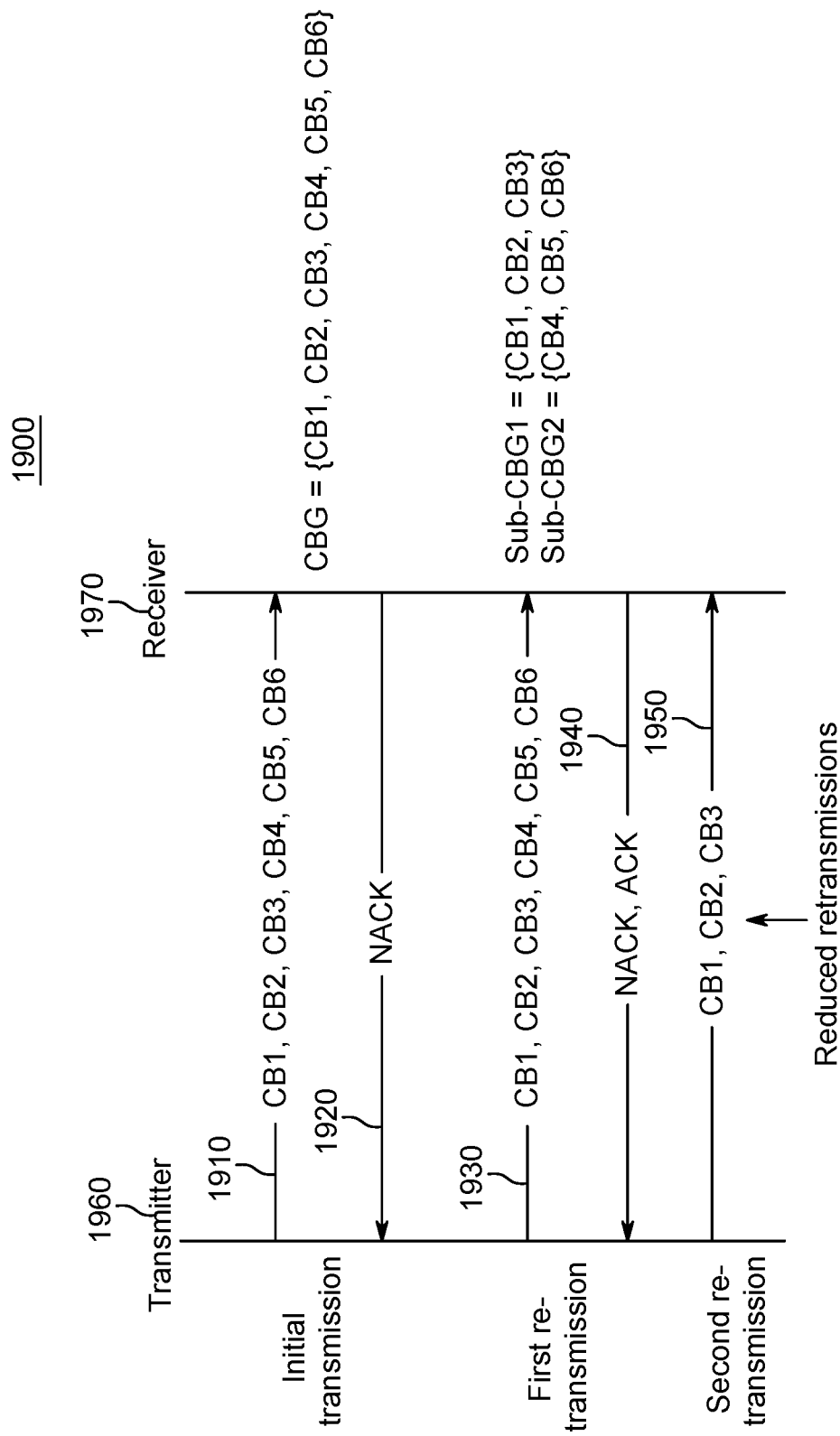
FIG. 19 is a diagram of an example of two-level CBG.

FIG. 19 is a diagram 1900 of example of two-level CBG. In the example illustrated in FIG. 19, a CBG includes 6 CBs, and a sub-CBG includes 3 CBs. A transmitter 1960 may send an initial transmission 1910 of a CBG. On a condition that a CB (e.g., the first CB1) in a CBG is not decoded correctly after the initial transmission 1910, a receiver 1970 may feedback a single bit NACK 1920. The transmitter 1960 may then re-transmit all 6 CBs in the CBG in a first re-transmission 1930. Since these 6 CBs belong to two sub-CBGs, the feedback for the first re-transmission 1930 may be composed of two bits, one per sub-CBG.

In the illustrated example, the first CB is again not decoded correctly after the first re-transmission 1930. The feedback 1940, here, is (NACK, ACK), where the NACK implies the failed decoding of the first sub-CBG and the ACK implies the successful decoding of the second sub-CBG. Upon receiving the feedback 1940, the transmitter 1960 will only send the 3 CBs in the first sub-CBG in the second re-transmission 1950. This may reduce the required transmissions.

Alternatively, the CBG level acknowledgement may be asymmetric. If the CBG is successfully detected, a bit may be set in the CBG ACK. If the CBG is not successfully detected, a bitmap may be used in the CBG NACK. Each bit in the bitmap may correspond to one CB in the CBG. If the CB is considered successfully detected, the corresponding bit in the bitmap may be set to 0. Otherwise, it may be set to 1. In this example, 0 and 1 may be exchanged. The number of bits in the bitmap may be explicitly signaled in the NACK. Alternatively, the number of bits in the bitmap may be implicit and determined by the number of CBs per CBG, which may be known at both the transmitter and the receiver.

To determine the CRC length for each CBG, one of a number of different methods may be used. In one embodiment, the CBG level CRC length $C_3$ may depend on the number (e.g., X) of CBs in a CBG. For example, a long CRC length may be used for a group of more CBs to achieve the similar false alarm rate (FAR) performance as for a short CRC length with a group of less CBs. For example, assume the supported CBG level CRC lengths are $CRC_1 \leq CRC_2 \leq CRC_3$ bits. The CBG level CRC lengths may be determined by:

$C_3 = CRC_1$, if $X<$Thres1;

$C_3 = CRC_2$, if Thres1$\leq X<$Thres2;

$C_3 = CRC_3$, if Thres2$\leq X$, where Thres1<Thres2.

In another embodiment, the CBG level CRC length $C_3$ may depend on CB size (e.g., Y bits per CB) in a CBG. For example, a long CRC length may be used for a CBG with a larger CB size, while a short CRC length may be used for a CBG with a smaller CB size. The CBG level CRC lengths may be determined by:

$C_3 = CRC_1$, if $Y<$Thres3;

$C_3 = CRC_2$, if Thres3$\leq Y<$Thres4;

$C_3 = CRC_3$, if Thres4$\leq Y$, where Thres3<Thres4. This embodiment and the immediately preceding embodiment may be used under the assumption of uniform CBG generation, as described above.

In yet another embodiment, the CBG level CRC length may be CBG-specific based on the total CB sizes within a CBG. Specifically, the CBG level CRC length $C_3$ may depend on the summation of CB sizes within a CBG. For example, let $Y_i$ be CB size of the $i^{th}$ CB within a CBG. The CBG level CRC lengths may be determined by:

$C_3 = CRC_1$, if $\Sigma_{i=1}^{X} Y_i <$Thres5;

$C_3 = CRC_2$, if Thres5$<\Sigma_{i=1}^{X} Y_i <$Thres6;

$C_3 = CRC_3$, if Thres6$\leq \Sigma_{i=1}^{X} Y_i$, where Thres5<Thres6.

It is mentioned above that, in the LDPC encoding process, the mother code rate of an LDPC code may be determined based on the data QoS. For downlink transmissions in cellular systems, the eNB may determine the mother code rate of the LDPC code. This mother code rate information may need to be sent to the WTRU so that the WTRU may use the same parity check matrix for decoding.

In embodiments, the mother code rate is different (or lower) than the code rate of each transmission. In LTE systems, for example, the 5-bit MCS index and the RB assignment information are contained in the DCI information block. Both MCS index and RB assignment imply the length of the coded block. Also, based on a look-up table, the TBS size may be determined. Then, the receiver may derive the length of each segment. The code rate may then be determined for the transmission. The WTRU may still need to know the mother code rate so that it will allocate enough memory for the re-transmissions and use the proper parity check matrix for decoding.

For example, suppose there are R supported mother code rates. A total of $\lceil \log_2 R \rceil$ bits may be used to indicate this mother code rate. For example, R=4, and 2-bit information for mother code rates may be generated. These $\lceil \log_2 R \rceil$ bits may be placed in the DCI, together with other parameters, and delivered to the WTRU.

Since the mother code rate may be just one time information sent over several re-transmissions, this information may be combined with a new data indicator bit. For example, if the new data indicator is 1, then $\lceil \log_2 R \rceil$ bits mother code rate may be contained in the DCI. If the new data indicator is 0, then no mother code rate information may be needed in the DCI, as these are just re-transmissions and the same mother code rate may be used.

In the example described above, the absolute mother code rate may be encoded and transmitted in the DCI since the mother code rate is generally less than the code rate of each transmission. Hence, it may be a waste to use the full $\lceil \log_2 R \rceil$ bits to indicate the mother code rate given the code rate of the current transmission. It may only indicate possible mother code rates less than the code rate of the current transmission. Here, the mother code rate relative to the code rate of the current transmission may be used. For example, suppose the full set of mother code rates is {⅓, ⅖, ½, ⅔} and the code rate of the current transmission is already 0.45. Then the possible mother code rates may only be {⅓, ⅖}. Hence, 1-bit information may be used.

For uplink transmissions in cellular systems, the eNB may also determine, for example, the modulation and coding scheme, redundancy version, RB assignment, and NDI for the WTRU. This information may be contained in DCI format 0 and sent to the WTRU. The WTRU may follow this instruction for this uplink transmission. Again, for uplink transmissions, the mother code rate of the LDPC code may also be contained in the DCI format 0. This information may only be needed for the transmission since it remains the same for the re-transmissions.

It is mentioned above that protograph matrix selection may be implied by WTRU category, which may be included in WTRU-capability information. Once a base station (e.g., eNB) receives the WTRU-category information, it may make the protograph matrix selection accordingly.

Figure 20:
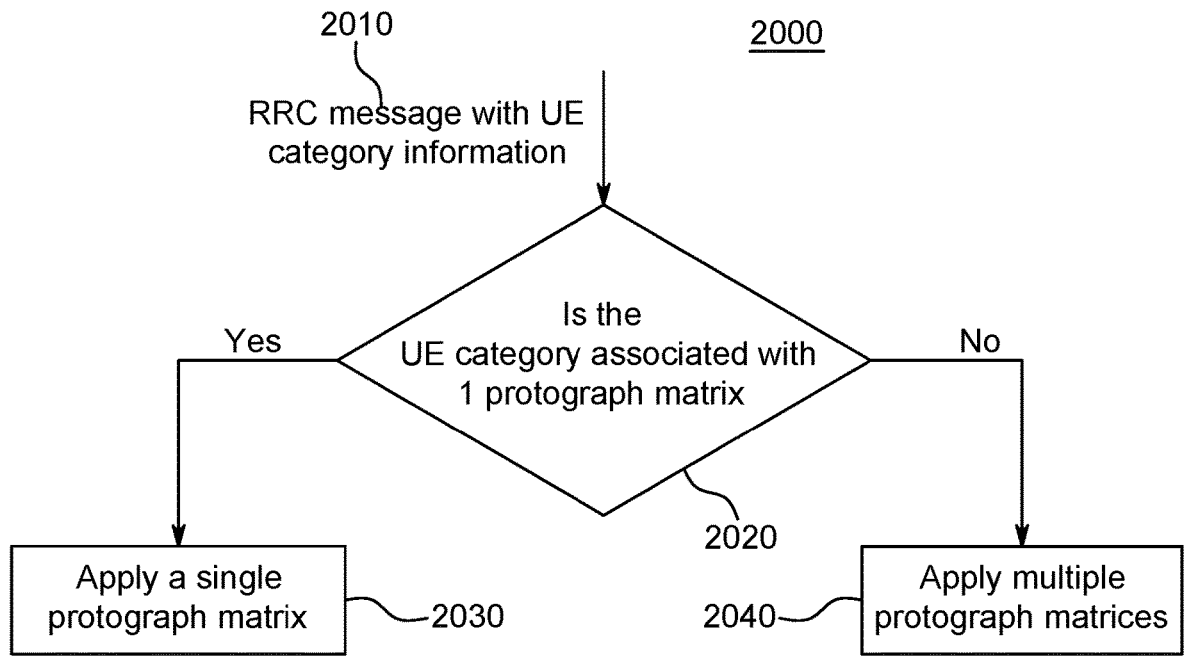
FIG. 20 is a flow diagram of an example method of protograph matrix (protomatrix) selection for a particular WTRU at an eNB where the eNB is provided with WTRU-category information.

FIG. 20 is a flow diagram 2000 of an example method of protograph matrix selection for a particular WTRU at a base station (e.g., eNB) where the base station is provided with WTRU-category information. In the example illustrated in FIG. 20, a base station receives a radio resource control (RRC) message that includes the WTRU category information (2010). The base station may determine whether the WTRU category is associated with a single protograph matrix (2020). On a condition that the WTRU category is associated with a single protograph matrix, a single protograph matrix may be applied (2030). On a condition that the WTRU category is not associated with a single protograph matrix (or is associated with more than one protograph matrix), multiple protograph matrices may be applied (2040).

As mentioned above, the capability of a WTRU to support multiple protograph matrices may be explicitly provided in a WTRU-capability information element (IE). For example, in the UE-EUTRA-Capability IE, an additional item may be added that specifies whether or not the WTRU supports multiple protograph matrices and/or indicating how many protograph matrices the WTRU supports. This may be indicated below by:

ldpc_matrix_number INTEGER{1,2}, if only two LDPC codes are used in the system.

```
UE-EUTRA-Capability ::=   SEQUENCE {
    accessStratumRelease          AccessStratumRelease,
    ue-Categoey                   INTEGER (1..5),
    ldpc_matrix_number INTEGER {1,2,3},
    pdcp-Parameters               PDCP-Parameters,
    phyLayerParameters            PhyLayerParameters,
    rf-Parameters                 RF-Parameters,
    measParameters                MeasParameters,
    featureGroupIndicators        BIT STRING (SIZE (32))       OPTIONAL,
    interRAT-Parameters           SEQUENCE {
        utraFDD                       IRAT-ParametersUTRA-FDD       OPTIONAL,
        utraTDD128                    IRAT-ParametersUTRA-TDD128    OPTIONAL,
        utraTDD384                    IRAT-ParametersUTRA-TDD384    OPTIONAL,
        utraTDD768                    IRAT-ParametersUTRA-TDD768    OPTIONAL,
        geran                         IRAT-ParametersGERAN          OPTIONAL,
        cdma2000-HRPD                 IRAT-ParametersCDMA2000-HRPD  OPTIONAL,
        cdma2000-1xRTT                IRAT-ParametersCDMA2000-1XRTT OPTIONAL,
    },
    nonCriticalExtension          UE-EUTRA-Capability-v920-IEs   OPTIONAL
}
```

Figure 21:
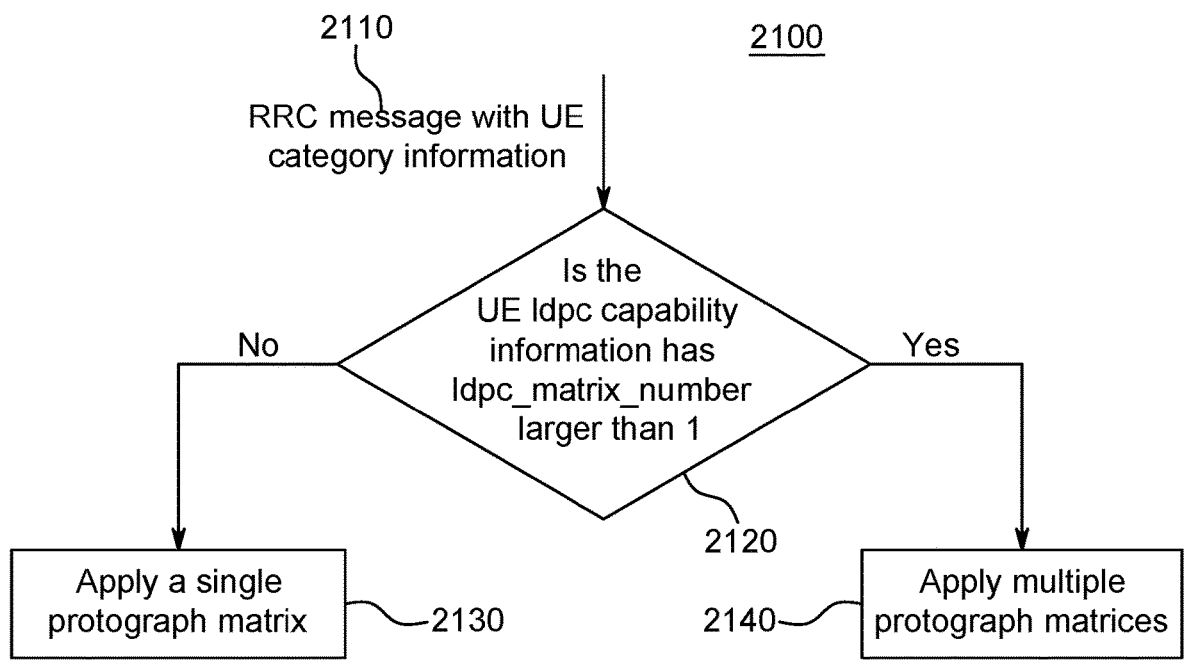
FIG. 21 is a flow diagram of another example method of protograph matrix selection for a particular WTRU at an eNB where the eNB is provided with WTRU capability information.

FIG. 21 is a flow diagram 2100 of another example method of protograph matrix selection for a particular WTRU at a base station (e.g., eNB) where the base station is provided with WTRU capability information. In the example illustrated in FIG. 21, a base station receives an RRC message that includes the WTRU capability information (2110). The base station may determine whether the WTRU capability information, UE ldp capability information, includes ldpc_matrix_number>1. On a condition that the WTRU capability information does not indicate capability to apply more than one protograph matrix (e.g., UE ldpc capability information does not have ldpc_matrix_number>1), a single protograph matrix may be applied (2130). On a condition that the WTRU capability information indicates capability to apply more than one protograph matrix (e.g., UE ldpc capability information has ldpc_matrix_number>1), multiple protograph matrices may be applied (2140).

As described in detail above, CBG generation may include determining the number of CBs in each CBG and the total number of CBGs in each TB. CBG-related parameters may be signaled to a WTRU in a number of different ways.

In an embodiment, the number of CBs in each CBG and the total number of CBGs in each TB may depend on the maximum number of CBs (i.e.)(max) supported in a CBG. In another embodiment, these numbers may depend on the maximum number of bits (i.e., $P_{max}$) supported by a CBG. In these embodiments, either $X_{max}$ or $P_{max}$ may need to be signaled from the transmitter to the receiver. In embodiments, this information may be included in the DCI. Here, the value of $X_{max}$ or $P_{max}$ may be selected from a set of candidates, where only the index of the candidate may need to be included in the DCI for downlink transmissions or UCI for uplink transmissions. For example, the maximum number of CBs in a CBG may be chosen from the set $\mathbb{X}$ ={5, 10, 15, 20}. Bits '00' may indicate 5, bits '01' may indicate 10, bits '10' may indicate 15, and bits '11' may indicate 20. The DCI or UCI may also include 2 more bits regarding CBG generation.

An alternative way to configure the CBG may be to use an offset setting. An offset may be selected from the set {−1,0,1}, where '−1' may imply the new maximum number of CBs is smaller than the previous value, '0' may imply the new maximum number of CBs is equal to the previous value, and '1' may imply the new maximum number of CBs is larger than the previous value. For example, suppose the maximum number of CBs in the past CBG generation for a previous TB is 10 from the set of $\mathbb{X} = \{5, 10, 15, 20\}$. The offset value of '−1' may imply that the new value is 5, the offset value of '0' may imply that the new value is 10, and the offset value of '1' may imply that the new value is 15.

In the embodiments described above, it is assumed that the CBG size is dynamically adjustable via DCI indication. In some embodiments, this configuration may be semi-static. In such embodiments, the signaling may be based on RRC. For example, the CBG enabler and CBG size may be configured in the RRC connection establishment or RRC connection reconfiguration message. For example, the following items may be added to the RRCConnectionReconfiguration message:

```
RRCConnectionReconfiguration ::= SEQUENCE {
    DL CBG Enabler          ENUMERATED {true,false}
    DL CBG Size Index       INTEGER (0,1,2,3)
    UL CBG Enabler          ENUMERATED {true, false}
    UL CBG Size Index       INTEGER {0,1,2,3}
    ......
}
```

The configuration of CBG size may also be based on 2 levels: both semi-static via RRC signaling and dynamic via DCI/UCI signaling. For example, the RRC signaling may provide a default CBG size based on, for example, WTRU capability and channel bandwidth, while the DCI signaling may provide an adjusted CBG size based on, for example, channel condition, total number of CBs in a TB, and data QoS.

In another embodiment, the number of CBs in each CBG and the total number of CBGs in each TB may depend on the maximum number of CBGs (i.e., B') supported in a TB. In embodiments, the value of B' may be configured in a semi-static manner, such as via RRC signaling, for example, where only the index of the candidate may need to be included the RRC message. For example, the maximum number of CBGs in a TB may be chosen from the set $\mathcal{B} = \{10, 20, 30, 40\}$. The index 0 may indicate B'=10, the index 1 may indicate B'=20, the index 2 may indicate B'=30, and the index 3 may indicate B'=40.

The CBG number may be configured in the RRC connection establishment or RRC connection reconfiguration message. For example, the following items may be added to the RRCConectionReconfiguration message.

```
RRCConnectionReconfiguration ::= SEQUENCE {
    DL CBG Enabler          ENUMERATED {true, false}
    DL CBG Number Index     INTEGER {0,1,2,3}
    UL CBG Enabler          ENUMERATED {true, false},
    UL CBG Number Index     INTEGER {0,1,2,3}
    ......
}
```

The DL/UL CBG Enabler in the above message may be combined with the DL/UL CBG number index. If the DL/UL CBG functionality is disabled, then the corresponding DL/UL CBG number may be equal to the number of CBs per TB. In other words, each CBG may be composed of a single CB. This information may be carried on the DL/UL CBG number index if one value is reserved in the DL/UL CBG number index to indicate this.

In embodiments, a list of possible values of B' may be configured via RRC signaling, while the selection among the configured CBG numbers may be via MAC signaling. For example, the set of possible B' values may be {10, 20, 30, 40}. This set of values may be delivered by the RRC connection establishment message or the RRC connection reconfiguration message. Depending on, for example, the data QoS, data size, channel conditions, and channel bandwidth, the actual CBG number may be selected from the configured CBG numbers and signaled via MAC signaling. In the above example, the MAC signaling may use index "00" for CBG number equal to 10, "01" for CBG number equal to 20, "10" for CBG number equal to 30 and "11" for CBG number equal to 30.

In embodiments, a list of possible values of B' may be configured via RRC signaling, while the selection among the configured CBG numbers may be via L1 signaling (e.g., DCI). For example, the set of possible B' values may be {10, 20, 30, 40}. This set of values may be delivered by the RRC connection establishment message or the RRC connection reconfiguration message. Depending on, for example, the data QoS, data size, channel conditions, and channel bandwidth, the actual CBG number may be selected from the configured CBG numbers and signaled via L1 signaling (e.g., DCI). In the above example, the L1 signaling may use index "00" for CBG number equal to 10, "01" for CBG number equal to 20, "10" for CBG number equal to 30 and "11" for CBG number equal to 30.

If a TB contains less CBs (i.e., B CBs where B≤B') than the configured value, dynamic signaling in DCI or UCI may be applied. Here, a one bit indicator may be added to DCI or UCI. A setting of this bit to 1 may imply that B≤B', that subsequently each CBG contains 1 CB, and that the TB contains less than B' CBGs. In the case of re-transmissions, the number of re-transmitted CBGs may be less than the number of CBGs contained in the initial transmission. In this case, the one-bit indicator may be added to DCI or UCI, indicating that the number CBGs in the re-transmission is less than the configured CBG number.

In embodiments, the DCI or UCI may include information of the actual CBGs used in a current transmission. A simple way to handle this may be to include a CBG bitmap in the DCI or UCI with the bitmap size being the configured CBG number. For example, on a condition that the configured CBG number is 5, the DCI may contain 5 bits, each bit corresponding to a CBG. If the bit is set to 0, the corresponding CBG is not included in the current transmission. If the bit is set to 1, the CBG is included in the current transmission.

The number of ACK/NACK feedback bits from the receiver may be either equal to the configured (or indicated) CBG number or equal to the actual (or scheduled) transmitted CBG number. The selection between these two options may also be pre-determined or configured (e.g., via RRC signaling). For example, the following items may be added to the RRCConectionReconfiguration message.

```
RRCConnectionReconfiguration ::= SEQUENCE {
    Configured_CBG ACK_NACK       ENUMERATED {true, false}
    ......
}
```

On a condition that Configured_CBG_ACK_NACK is set to true, the ACK/NACK feedback may be based on the configured CBG number. Otherwise, the ACK/NACK feedback may be based on the actual transmitted CBG number.

Figure 22:
FIG. 22 is a signal diagram of example signaling for a bit-based CBG indication and associated ACK/NACK feedback.

FIG. 22 is a signal diagram 2200 of example signaling for a bit-based CBG indication and associated ACK/NACK feedback. In the example illustrated in FIG. 22, RRC and/or MAC signaling is used to provide a configuration that each TB may contain, at most, 5 CBGs. A transmitter 2210 may send an initial transmission 2230 to a receiver 2200 including all 5 CBGs. Here, the DCI includes a 5 bit CBG bitmap with all bits being set to 1. In the illustrated example, the receiver 2220 decodes the first, second and fourth CBGs and fails to decode the third and fifth CBGs. The receiver may provide ACK/NACK feedback 2340 given by [Ack, Ack, Nack, Ack, Nack]. In the first re-transmission 2250, only the third and fifth CBGs are re-transmitted, and the DCI's CBG bitmap is set as [0, 0, 1, 0, 1].

The receiver 2220 may decode both re-transmitted CBGs this time. The receiver 2220 may have two options for the Ack/Nack feedback 2260. One option may be to have the number of ACK/NACK bits equal to the configured number of CBGs (i.e. 5). Here, the feedback 2260 is [A, A, A, A, A], indicating that all 5 CBGs have been successfully decoded. Another option may be to have the number of ACK/NACK bits in the feedback 2260 equal the number of CBGs included in the re-transmission (i.e., 2 for the first re-transmission). Here, the feedback 2260 is [A, A], indicating that the two CBGs in the first re-transmission were successfully decoded.

In the bitmap based CBG indication, the NDI for the TB may be re-used. Here, the NDI may serve as CBG flushing out information.

As an alternative to the bitmap based CBG indication, the actual CBG number may be indicated in each transmission. This number may be included in the DCI or UCI. For example, suppose the configured CBG number is B'. For each transmission, DCI or UCI may use $\lceil \log_2 B' \rceil$ bits to indicate how many CBGs are included in the transmission. The actual number of CBGs in the initial transmission may be equal to the configured CBG number. If the number of CBs per TB (i.e., B) is less than the configured CBG number, then the actual number of CBGs in the initial transmission may be equal to the number of CBs per TB. The actual number of CBGs in a re-transmission may depend on the ACK/NACK feedback from the previous transmission. Specifically, the actual number of CBGs in a re-transmission may be equal to the number of NACK bits in the feedback.

Figure 23:
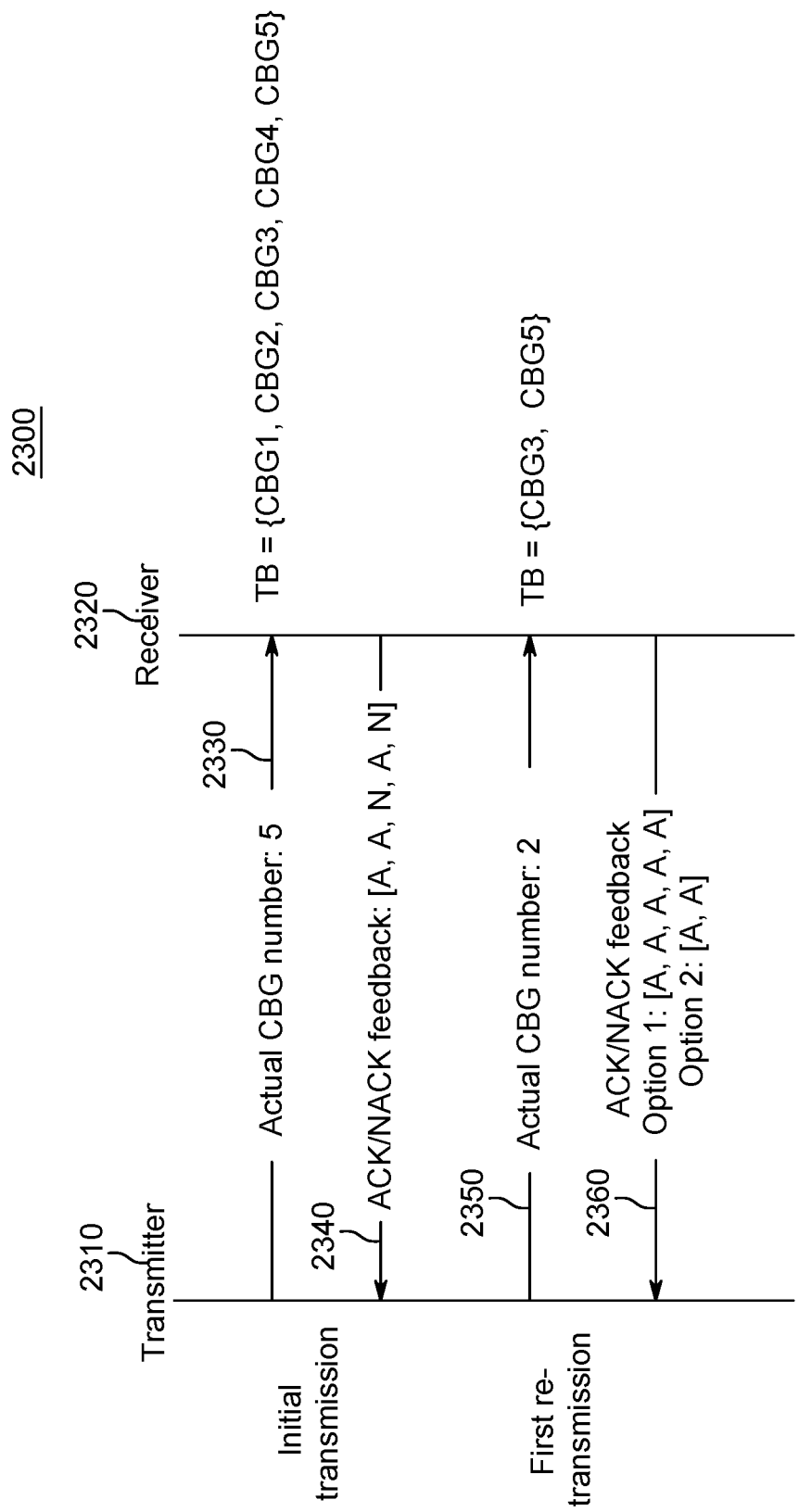
FIG. 23 is a signal diagram of example signaling for an actual CBG number and associated ACK/NACK feedback.

FIG. 23 is a signal diagram 2300 of example signaling for an actual CBG number and associated ACK/NACK feedback. In the example illustrated in FIG. 23, RRC and/or MAC signaling is used to provide a configuration that each TB may contain, at most, 5 CBGs. A transmitter 2310 may send an initial transmission 2330 to a receiver 2320 including all 5 CBGs. Here, the DCI may contain the field of actual CBG numbers (i.e., 5), and only 3 bits are used as $\lceil \log_2 5 \rceil = 3$. If the receiver decodes the first, second and fourth CBGs and fails to decode the third and fifth CBGs, the receiver 2320 may provide feedback 2340 given by [Ack, Ack, Nack, Ack, Nack]. In the first re-transmission 2350, only the third and fifth CBGs may be included, and the DCI's actual CBG number may be set as 2. If the receiver 2320 decodes both CBs this time, the ACK/NACK feedback 2360 from the receiver 2320 may be sent using several options. In one option, the number of ACK/NACK bits in the feedback 2360 may be equal to the configured number of CBGs (i.e., 5). Here, the feedback 2360 will be [A, A, A, A, A], indicating that all 5 CBGs were successfully decoded. A second option may be that the number of ACK/NACK bits in the feedback 2360 is equal to the actual number of CBGs included in the re-transmission 2350 (i.e., 2 for the first re-transmission 2350). Here, the feedback 2360 will be [A, A], indicating that the two CBGs in the first re-transmission 2350 were successfully decoded.

A determination of $X_{max}$ (or $P_{max}$) or B' may depend on various factors, including, for example, channel condition (e.g., received signal strength indicator (RSSI), reference signal received power (RSRP), and/or reference signal received quality (RSRQ)), WTRU capability, channel bandwidth, total number of CBs in a TB, and/or data QoS. A better channel condition may imply that more HARQ-ACK/NACK information bits may be encoded and fed back. This may implicitly relieve the limitation on the total number of CBGs in a TB. Hence, the corresponding $X_{max}$ may be smaller.

For a WTRU with less capabilities, the number of HARQ processes it may support may be limited. Hence, the value of $X_{max}$ may be selected to be larger so that less CBGs (and hence, less HARQ processes) per TB may be maintained.

For a WTRU operating on a larger bandwidth, more HARQ-ACK/NACK information bits may be encoded and fed back. This may relieve the limitation on the total number of CBGs in a TB. Hence, the corresponding $X_{max}$ may be smaller.

Transmitting more data per TB may result in more CBs. Hence, the value of $X_{max}$ may be larger to match the total number of CBs to be sent within a TB.

For some data with high reliability requirements, the value of $X_{max}$ may be smaller so as to improve the FAR performance since the ratio of CRC bits over the total number of bits in a CBG may be larger. For some data with low latency requirements, the value of $X_{max}$ may be smaller so as to increase the successful detection probability.

The number of CRC bits per CBG may also be signaled because the receiver may need this information for error detection. The possible numbers of CRC bits may be selected from a set of candidates where only the index of the candidate may need to be included in the DCI for downlink transmissions or UCI for uplink transmissions.

The number of CRC bits per CBG may also be configured using some high level signaling. In this case, the CBG level CRC length may be semi-statistic.

On a condition that two or more codewords are used for MIMO applications, the signaling related to the CBG may be defined. For example, the maximum number of CBGs for each codeword may be configured by RRC signaling. A simple way to do this may be to assume that all codewords contain the same number of CBGs. Hence, the configuration of a single CBG number may be enough. Another way to do this may be to assume that each codeword includes a different number of CBGs. Here, the configuration of the CBG number for each codeword may be required. Another way to do this may be to configure the maximum number of CBGs shared by all of the codewords.

The DCI information may indicate which CBGs are included in the current transmissions. In the case of multiple codewords, this indication may be per codeword based. Alternatively, the indication may be included in the DCI corresponding to a single codeword.

If the CBG is applied, then the ACK/NACK feedback may be multiple bits. Further, the CBG level ACK/NACK and TB level ACK/NACK may occur simultaneously. Accordingly, two level ACK/NACK feedback may be included in the same UCI or DCI.

The CBG level ACK/NACK may be based on CBG level CRC check or may be based on the logic AND of the ACK/NACK on all the CBs in a CBG. The TB level ACK/NACK may be mainly based on TB level CRC check. It is possible that even all CBG levels may be ACK-ed, and the TB level CRC check may fail. Hence, the TB level ACK/NACK feedback may be necessary aside from the CBG level ACK/NACK feedback.

On the TB level, a single bit ACK/NACK may be multiplexed with a CBG level multi-bit ACK/NACK. For example, the TB level ACK/NACK may be located at the beginning, while the CBG level ACK/NACKs may be located afterwards. The number of CBG level ACK/NACK bits may change with re-transmissions and may change with TBs, depending on the number of CBGs used in the current transmissions.

Figure 24A:
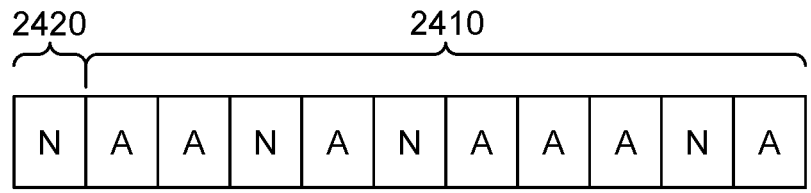
FIGS. 24A, 24B, 24C and 24D are diagrams of an example of TB-level acknowledgement/negative acknowledgement (ACK/NACK) assisted CBG level ACK/NACK feedback and re-transmission.
Figure 24B:
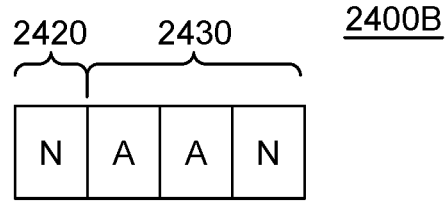
Figure 24C:
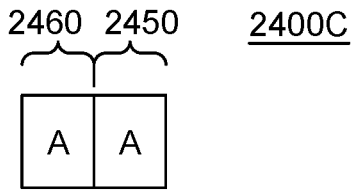

FIGS. 24A, 24B, 24C and 24C are diagrams 2400A, 2400B, 2400C and 2400D of an example of TB-level ACK/NACK assisted CBG level ACK/NACK feedback and re-transmission. In the illustrated example, it may be assumed that the number of ACK/NACK feedback bits is equal to the actual (or scheduled) transmitted CBG number. The same approach of TB level ACK/NACK may be applied to the case where the number of ACK/NACK feedback bits is equal to the configured (or indicated) CBG number.

The illustrated example assumes that a TB has 10 CBGs. After the first transmission, the third, fifth and ninth CBs are not correctly decoded. The mixed TB and CBG ACK/NACK 2400A has 11 bits, including a 10 bit CBG level ACK/NACK 2410 and a one bit TB level ACK/NACK 2420, as illustrated in FIG. 24A.

After the first re-transmission of the failed CBGs, only the ninth CBG is still incorrectly decoded. The mixed TB and CBG ACK/NACK 2400B may have 4 bits, including a 3 bit CBG level ACK/NACK 2430 and a one bit TB level ACK/NACK 2440, as illustrated in FIG. 24B.

Figure 24D:
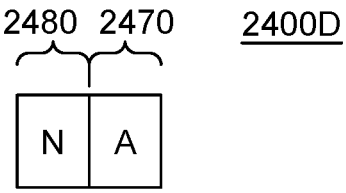

If, after the second re-transmission of the ninth CBG, all of the CBGs are correctly decoded and the overall TB also passes the CRC check, the mixed TB and CBG ACK/NACK 2400C may have two bits, including a one bit CBG level ACK/NACK 2450 and a one bit TB level ACK/NACK 2460, as illustrated in FIG. 24C. If, after the second re-transmission of the ninth CBG, all of the CBGs are decoded correctly but the overall TB does not pass the CRC check, the mixed TB and CBG ACK/NACK 2400D may have 2 bits, including a one bit CBG level ACK/NACK 2470 and a one bit TB level ACK/NACK 2480, as illustrated in FIG. 24D.

The TB level ACK/NACK may also be implicitly indicated by the CBG level ACK/NACK if the number of ACK/NACK feedback bits is equal to the configured (or indicated) CBG number. Specifically, if all the configured CBGs are successfully decoded, and the TB level CRC check is passed, the receiver may send ACK for all the CBGs. If all the configured CBGs are successfully decoded, but the TB level CRC check fails, the receiver may send NACK for all the CBGs.

Consider the same example as above, and suppose there are 10 CBGs in a TB. After the first transmission, the third, the fifth and the ninth CBGs are not correctly decoded. The CBG ACK/NACK has 10 bits.

FIGS. 25A, 25B, 25C and 25C are diagrams 2500A, 2500B, 2500C and 2500D of another example of TB-level ACK/NACK assisted CBG level ACK/NACK feedback and re-transmission based on the above example. FIG. 25A shows the CBG ACK/NACK 2500A having 10 bits, as mentioned in the previous paragraph. After the first re-transmission of the failed CBGs, only the ninth CBG is still incorrectly decoded. The CBG ACK/NACK 2500B has 10 bits, as illustrated in FIG. 25B. If, after the second re-transmission of the ninth CBG, all of the CBGs are correctly decoded and the overall TB also passes the CRC check, the CBG ACK/NACK 2500C has 10 bits, as illustrated in FIG. 25C. If, after the second re-transmission of the ninth CBG, all of the CBGs are correctly decoded, but the overall TB does not pass the CRC check, the CBG ACK/NACK 2500D has 10 bits, as illustrated in FIG. 25D.

In LTE, the maximum number of redundancy versions is 4. Hence, 2-bits are reserved in the DCI/UCI for the RV field. In new radio (NR), the maximum number of redundancy versions may be larger than 4. Hence, more bits may be needed in the DCI/UCI for the RV field. To avoid the increase of the DCI/UCI payload size, the MCS field in DCI/UCI may be used to carry the RV information.

In the initial transmission in LTE, the MCS index may be selected from 0 to 28, and the RV is set as 0. In the re-transmission in LTE, the MCS index may be selected from 29 to 31. Hence, the MCS index in DCI/UCI has 5 bits for the possible 32 values. For re-transmitted PDSCH, the MCS index is determined by modulation order rather than the RV. For re-transmitted PUSCH, the MCS index is determined by RV rather than the modulation order.

Consider for re-transmitted NR-PDSCH that only 2-bits are used for the MCS index in the DCI, which depends on modulation order. This saves 3 bits from the MCS index in the DCI. The saved 3 bits may be used for the increased RVs. This usage is based on the assumption that the RV field for the initial transmission should be restricted to 2 bits. In other words, the possible RVs for the initial transmission may be selected from 0, 1, 2,3. Consider the example that in the first transmission MCS index='10010' and RV='00'. This implies that the MCS index is 18 and the modulation order is 6. In the re-transmission, the MCS index='10" and RV='00001'. This implies that the modulation order is 6 and the redundancy version is 1. Through this dynamic switching of the MCS index field and the RV field in the DCI between initial transmissions and re-transmissions, the DCI payload size may be kept constant while the number of supported RVs may be increased from 4 (i.e., 2 bits) to 32 (i.e., 5 bits). In other words, the dynamic switching of the MCS index field in the DCI between the initial transmission and the re-transmission may enable the support of up to 32 RVs.

If, in NR, the number of supported RV is not as large as 32, the saved bits from the MCS fields in re-transmissions may be used to indicate CBG information (e.g., the indication of actual CBG number is less than the configured CBG number or the actual CBG number indication). A similar scheme may be applied to UCI.

Several bit interleaver embodiments are described above. Several modulation mapping orders are defined (e.g., natural order, reverse order, and circular shifted order). In embodiments, the modulation mapping order may be synchronized between the transmitter and the receiver. There are several ways to handle such synchronization between the transmitter and the receiver: static signaling, semi-static signaling, dynamic signaling with additional DCI/UCI bits, and dynamic signaling with MCS table.

For static signaling, there is no explicit signaling for the modulation mapping order. The modulation mapping order may be tied to RV. In one embodiment, each RV corresponds to either a natural modulation mapping order or a reverse modulation mapping order. For example, RV0 and RV2 may always be in the natural modulation mapping order, and RV1 and RV3 may always be in the reverse modulation mapping order. This may be because RV0 and (RV1, RV3) may have some overlap on coded bits. The reverse modulation mapping order of (RV1, RV3) provides diversity of those overlapped coded bits. Similarly, RV2 and (RV1, RV3) may have some overlap on coded bits. The reverse modulation mapping order of (RV1, RV3) provides diversity of those overlapped coded bits. It may be possible that the reverse modulation mapping order of RV1, RV3 is applicable only to high order modulations, such as 16QAM, 64QAM, and 256 QAM. In another embodiment, each RV corresponds to a circular shifted order with a certain shift value. For example, RV0 may always be in circular shifted order with shift value 0, RV1 may always be in circular shifted order with shift value 2, RV2 may always be in circular shifted order with shift value 4, and RV3 may always be in circular shifted order with shift value 6. In yet another embodiment, each RV may correspond to a certain MMOI value. For example, RV0 may always correspond to MMOI=0, RV1 may always correspond to MMOI=1, RV2 may always correspond to MMOI=2, and RV3 may always correspond to MMOI=3.

For semi-static signaling, some RRC signaling may be used to configure the modulation mapping order, and the modulation mapping order may be tied to RV. Here, the RRC connection establishment or RRC connection reconfiguration message may be used for the configuration. For example, the following items may be added to the RRCConnectionReconfiguration message:

```
RRCConnectionReconfiguration ::= SEQUENCE {
    RV0 modulation mapping order   INTEGER{0,1,2,3}
    RV1 modulation mapping order   INTEGER{0,1,2,3}
    RV2 modulation mapping order   INTEGER{0,1,2,3}
    RV3 modulation mapping order   INTEGER{0,1,2,3}
    ......
}
``` where the value "0" indicates a circular shifted order with shift value 0, the value "1" indicates a circular shifted order with shift value 2, the value "2" indicates a circular shifted order with shift value 4, the value "3" indicates a circular shifted order with shift value 6.

In another embodiment, the value may indicate the MMOI index, and the following items may be added to the RRCConnectionReconfiguration message:

```
RRCConnectionReconfiguration::= SEQUENCE {
    RV0 modulation mapping order   ENUMERATED{0,1,2,3}
    RV1 modulation mapping order   ENUMERATED{0,1,2,3}
    RV2 modulation mapping order   ENUMERATED{0,1,2,3}
    RV3 modulation mapping order   ENUMERATED{0,1,2,3}
    ......
}
``` where the value "true" indicates a natural modulation mapping order and the value "false" indicates a reverse modulation mapping order.

Either static or semi-static signaling of the modulation mapping order may not benefit the chase combining type of HARQ since RV0 is tied with a constant modulation mapping order. To enhance the diversity level, RV0 may switch between a natural modulation mapping order and a reverse modulation mapping order based on the NDI value. If the NDI value is toggled (i.e., new transmission), then RV0 may be used for the natural modulation mapping order. Otherwise, RV0 may be used for the reverse modulation mapping order.

For dynamic signaling with additional DCI/UCI bits, the modulation mapping order may be dynamically signaling in additional DCI/UCI fields. For example, an additional 1 bit in the DCI or UCI may indicate whether a natural modulation mapping order is used or a reverse modulation mapping order is used. In another example, an additional 2 bits in the DCI or UCI may indicate the shift values (i.e., 0, 2, 4, 6) of the circular shifted modulation mapping. In another example, additional bits in the DCI or UCI may indicate the MMOI index.

For dynamic signaling with an MCS table, it may be assumed that for the initial transmission, the natural modulation mapping order is always applied. The modulation mapping re-order may only occur in re-transmissions. Hence, the MCS table may be used to indicate the modulation mapping re-order.

For downlink transmissions, the MCS table for PDSCH may use only 3 or 4 indices (i.e., 29, 30, 31 and/or 28) to indicate the modulation order in the re-transmissions. For uplink transmission, the MCS table for PUSCH may use only 3 or 4 indices (i.e., 29, 30, 31 and/or 28) to indicate the RV version in the re-transmissions. Here, 2 bits may actually be used. Considering that MCS indices have a total of 5 bits, an additional 3 bits may be made available to indicate the modulation mapping order for either downlink re-transmissions or uplink re-transmissions. One, two or three of the additional bits may be used. In the case of 1 bit, it may be used to indicate whether a natural modulation mapping order or a reverse modulation mapping order is used in the current re-transmission. In case of 2 or 3 bits, they may be used to indicate the shift value in the circular shifted modulation mapping or to indicate the MMOI index.

Performance of some LDPC decoding algorithms may depend on an accurate estimation of the SNR. For example, the offset min-sum decoder or the adjusted min-sum decoder may not be sensitive to SNR estimation error, while the normalized min-sum decoder may not be sensitive to SNR estimation error.

The base station (e.g., eNB, gNB, or TPR) may need to know a WTRU's decoding capabilities, including the decoding algorithms the WTRU may support. This may be done in RRC messages at the initial camping stage.

Based on the channel conditions, as well as some SNR alignment testing, the base station may estimate whether the WTRU is able to have the proper SNR estimation. If so, then the more advanced decoding algorithm, which may be sensitive to SNR estimation error, may be used. This decision may be informed from the base station to the WTRU using RRC messaging. This message may be updated according to channel conditions.

Figure 26:
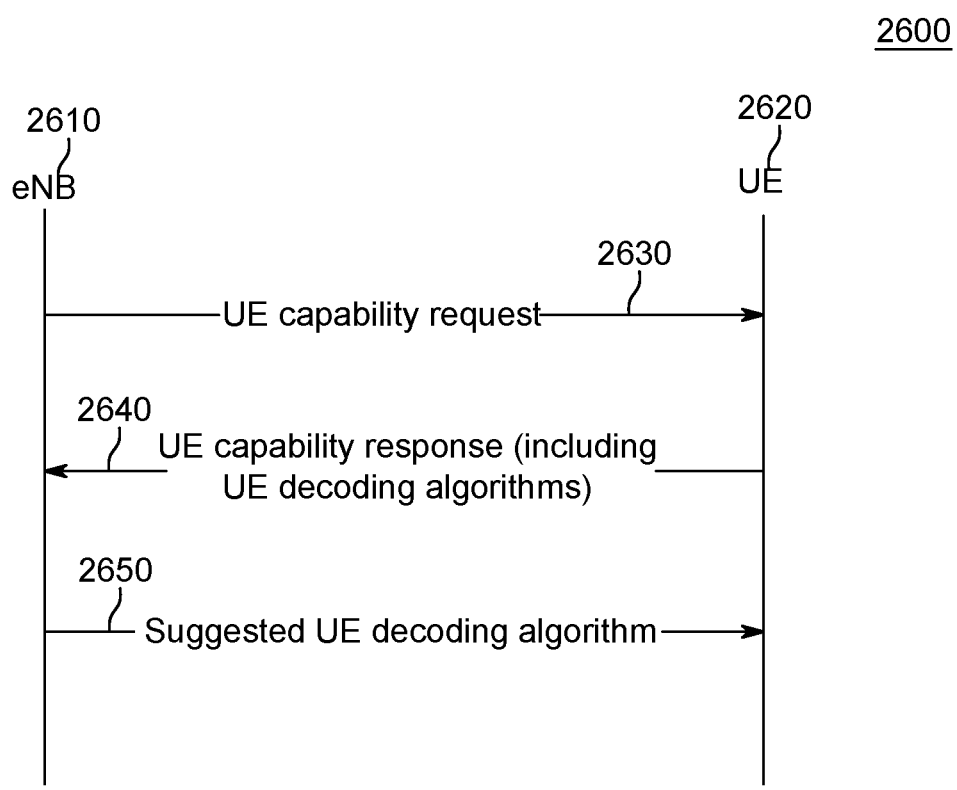
FIG. 26 is a signal diagram of an example message exchange for WTRU capability with supported decoding algorithms.

FIG. 26 is a signal diagram 2600 of an example message exchange for WTRU capability with supported decoding algorithms. In the example illustrated in FIG. 26, an eNB 2610 sends a UE capability request message 2630 to a WTRU 2620. In response to the request 2630, the WTRU 2620 sends a UE capability response 2640, which may including WTRU decoding algorithms. The eNB 2610 receiving the UE capabilities response 2640 may send a suggested decoding algorithm to the WTRU 2620 (2650), which may be determined based at least in part on the WTRU decoding algorithms supported by the WTRU 2620 as indicated in the UE capability response 2640.

Since LDPC may also be used for eMBB UL, similar SNR estimation adaptive decoding algorithms may be used for the UL. Alternatively, a more advanced decoding algorithm may be used that may be sensitive to SNR estimation error. Such algorithm may, for example, be pre-defined or specified to be used at the base station.

Regarding symbol level interleaving for HARQ re-transmissions, a simple symbol interleaver may be used. For example, a row-column interleaver may be used, where the stream of bits of a codeword may first be written across rows then columns. The interleaver may first be read across columns and then rows.

Figure 27:
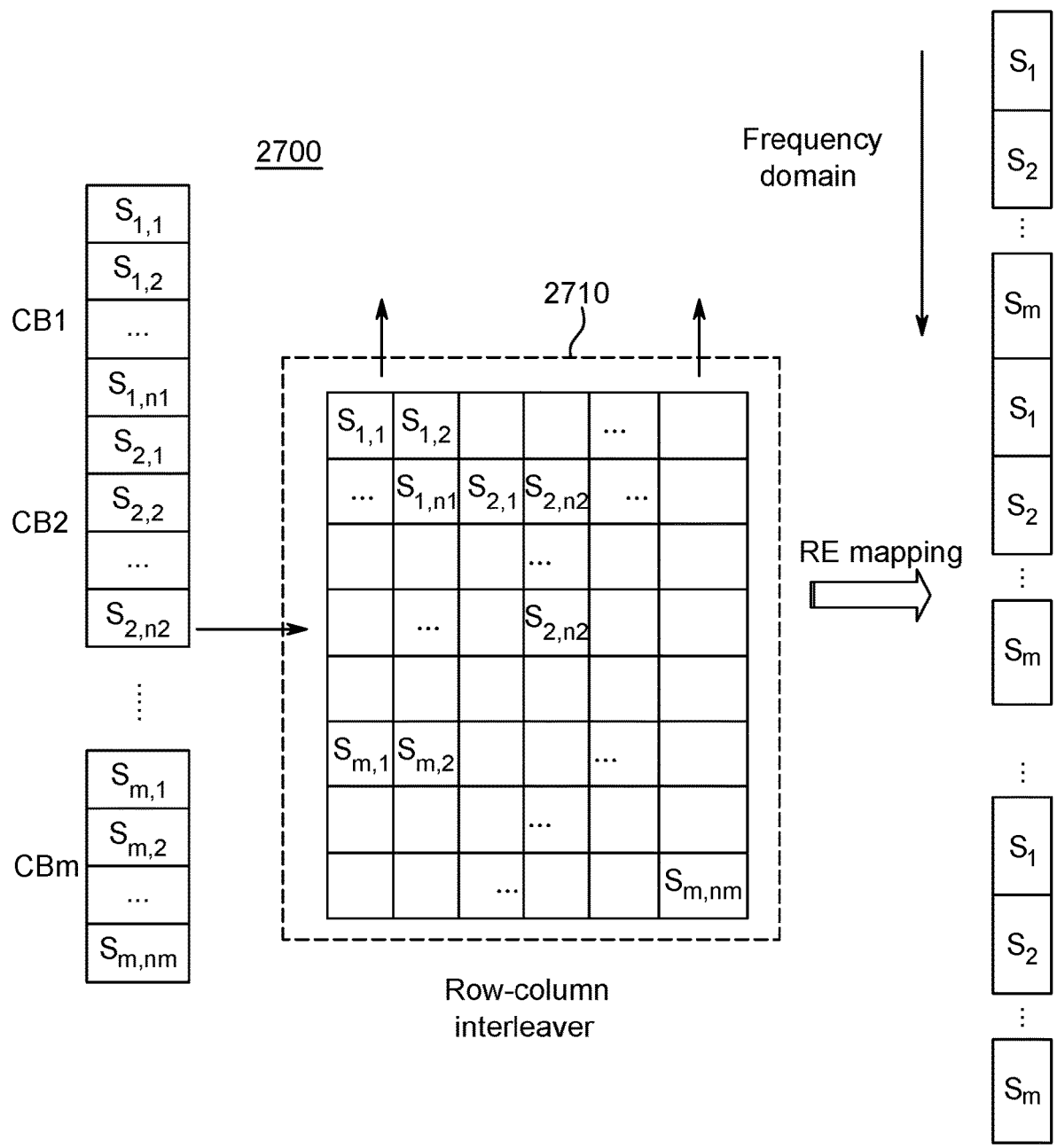
FIG. 27 is a diagram of an example symbol level row-column interleaver.

FIG. 27 is a diagram 2700 of an example symbol level row-column interleaver 2710. In the example illustrated in FIG. 27, the modulation symbols $S_{1,1} \ldots S_{m,nm}$, from each $CB_1 \ldots C_{Bm}$ are distributed over the frequency domain. A row-column interleaver, such as illustrated in FIG. 27, may be used for the first transmission. If re-transmission is needed, a similar interleaver may be used. However, it is likely that the sub-carriers including modulation symbols from a CB in the first transmission also include modulation symbols from the same CB in the re-transmission. This may lead to performance degradation in decoding the CB if the sub-carriers experience deep fading. To avoid this issue, a shuffle operation may be applied to the component CBs in a codeword for the re-transmissions before applying the row-column interleaver.

Figure 28:
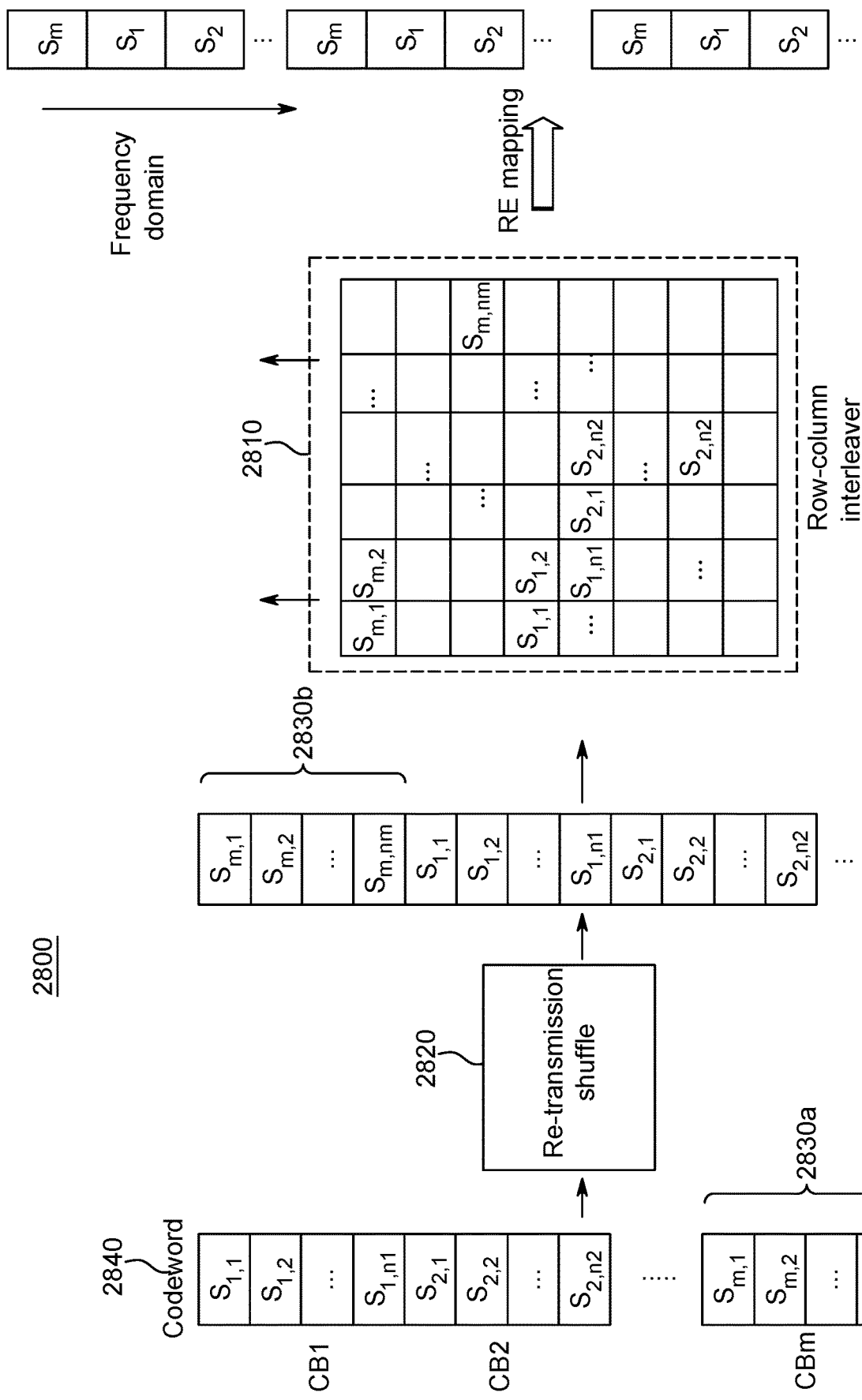
FIG. 28 is a diagram of an example symbol level row-column interleaver with re-transmission shuffle.

FIG. 28 is a diagram 2800 of an example symbol level row-column interleaver 2810 with re-transmission shuffle 2820. In the example illustrated in FIG. 28, the re-transmission shuffle 2820 occurs before interleaving using the row-column interleaver 2810. In the illustrated example, the CBm 2830a is moved to the beginning of the codeword 2840 (designated as 2830b). In embodiments, other shuffle schemes may be applied. For example, if a CB is on the i-th location in a codeword in the initial transmission, it may be set to the (i+offset)-th location in a codeword for re-transmission. In embodiments, the shuffle algorithm may depend on the transmission number. For example, the first re-transmission and the second re-transmission may use different shuffle parameters.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed:
1. A wireless transmit/receive unit (WTRU) comprising:
  a transceiver; and
  a processor,
  the transceiver and the processor configured to:
    attach transport block (TB) level cyclic redundancy check (CRC) bits to a TB,
    select either a first a low-density parity-check (LDPC) base graph (BG) or a second LDPC BG based on a code rate (CR) and a TB payload size,
    on a condition that the first LDPC BG is selected, apply a first code block (CB) segmentation scheme to segment the TB including the TB level CRC bits into a first number of equal sized CBs,
    on a condition that the second LDPC BG is selected, apply a second CB segmentation scheme to segment the TB including the TB level CRC bits into a second number of equal sized CBs,
    determine a number of CB level CRC bits for CB level CRC bit attachment,
    on a condition that the determined number of CB level CRC bits for CB level CRC bit attachment is >0, attach the determined number of CB level CRC bits to each of the CBs of the segmented TB,
    encode each of the CBs in the segmented TB using the selected LDPC BG, and
    transmit the encoded CBs.

2. The WTRU of claim 1, the transceiver and the processor further configured to add filler bits to each of the CBs of the segmented TB, wherein the number of filler bits depends on a set of lifting sizes, the selected LDPC BG, and the determined single CB size.

3. The WTRU of claim 1, the transceiver and the processor further configured to group the CBs into CB groups (CBGs), wherein a number of CBGs in a TB is configured to be ≤min{B,B'}, where B is a total number of segmented CBs in a single TB, and B' is a maximum number of CBGs in a TB, wherein the CBGs comprise a first set of CBGs and a second set of CBGs, wherein each CBG in the first set of CBGs includes one more CB than each CBG in the second set of CBGs.

4. The WTRU of claim 3, wherein a maximum number of CBGs in a TB is configured by radio resource control (RRC) signaling.

5. The WTRU of claim 1, the processor and the transceiver further configured to receive downlink control information (DCI) with at least one of a transmission of encoded CBs and a re-transmission of encoded CBs, the DCI including at least one of an indication that a transmission is for less CBGs than the configured maximum number of CBGs and a CBG bitmap that indicates specific CBGs that are being transmitted or re-transmitted.

6. The WTRU of claim 1, the processor and the transceiver further configured to:
  receive downlink control information (DCI) with a transmission of encoded CBs, the DCI indicating a number of CBGs included in the transmission,
  transmit feedback indicating at least one of particular CBGs that were decoded and particular CBGs that were not decoded and indicating a TB that was decoded,
  on a condition that the feedback indicates that at least one CBG in the transmission was not decoded, re-receive the particular CBGs that were not decoded along with the DCI indicating a number of CBGs included in the re-transmission, wherein particular CBGs are re-transmitted as sub-CBGs, and
  transmit feedback indicating one of particular CBGs from the transmission and re-transmission that were decoded and not decoded.

7. The WTRU of claim 1, wherein the determined number of CB level CRC bits is 0.

8. The WTRU of claim 1, wherein the determined number of CB level CRC bits is 24.

9. The WTRU of claim 1, wherein:
the first CB segmentation scheme is a function of a maximum CB size of the first LDPC BG, and
the second CB segmentation scheme is a function of a maximum CB size of the second LDPC BG.

10. A method, implemented in a wireless transmit/receive unit (WTRU), the method comprising:
attaching transport block (TB) level cyclic redundancy check (CRC) bits to a TB;
selecting either a first a low-density parity-check (LDPC) base graph (BG) or a second LDPC BG based on a code rate (CR) and a TB payload size;
on a condition that the first LDPC BG is selected, applying a first code block (CB) segmentation scheme to segment the TB including the TB level CRC bits into a first number of equal sized CBs;
on a condition that the second LDPC BG is selected, applying a second CB segmentation scheme to segment the TB including the TB level CRC bits into a second number of equal sized CBs;
determining a number of CB level CRC bits for CB level CRC bit attachment;
on a condition that the determined number of CB level CRC bits for CB level CRC bit attachment is >0, attaching the determined number of CB level CRC bits to each of the CBs of the segmented TB;
encoding each of the CBs in the segmented TB using the selected LDPC BG; and
transmitting the encoded CBs.

11. The method of claim 10, further comprising adding filler bits to each of the CBs of the segmented TB, wherein the number of filler bits depends on a set of lifting sizes, the selected LDPC BG, and the determined single CB size.

12. The method of claim 10, wherein the determined number of CB level CRC bits is 0.

13. The method of claim 10, wherein the determined number of CB level CRC bits is 24.

14. The method of claim 10, wherein:
the first CB segmentation scheme is a function of a maximum CB size of the first LDPC BG, and
the second CB segmentation scheme is a function of a maximum CB size of the second LDPC BG.

15. The method of claim 10, further comprising grouping the CBs into CB groups (CBGs), wherein a number of CBGs in a TB is configured to be $\leq \min\{B,B'\}$, where B is a total number of segmented CBs in a single TB, and B' is a maximum number of CBGs in a TB, wherein the CBGs comprise a first set of CBGs and a second set of CBGs, wherein each CBG in the first set of CBGs includes one more CB than each CBG in the second set of CBGs.

16. The method of claim 15, wherein a maximum number of CBGs in a TB is configured by radio resource control (RRC) signaling.

17. The method of claim 10, further comprising receiving downlink control information (DCI) with at least one of a transmission of encoded CBs and a re-transmission of encoded CBs, the DCI including at least one of an indication that a transmission is for less CBGs than the configured maximum number of CBGs and a CBG bitmap that indicates specific CBGs that are being transmitted or re-transmitted.

18. The method of claim 10, further comprising:
receiving downlink control information (DCI) with a transmission of encoded CBs, the DCI indicating a number of CBGs included in the transmission;
transmitting feedback indicating at least one of particular CBGs that were decoded and particular CBGs that were not decoded and indicating a TB that was decoded;
on a condition that the feedback indicates that at least one CBG in the transmission was not decoded, re-receiving the particular CBGs that were not decoded along with the DCI indicating a number of CBGs included in the re-transmission, wherein particular CBGs are re-transmitted as sub-CBGs; and
transmitting feedback indicating one of particular CBGs from the transmission and re-transmission that were decoded and not decoded.

* * * * *